United States Patent
Das et al.

(10) Patent No.: US 12,367,783 B2
(45) Date of Patent: Jul. 22, 2025

(54) COLLISION DETECTOR, COLLISION DETECTION SYSTEM, AND METHOD OF USING SAME

(71) Applicant: The Penn State Research Foundation, University Park, PA (US)

(72) Inventors: Saptarshi Das, State College, PA (US); Darsith Jayachandran, State College, PA (US)

(73) Assignee: The Penn State Research Foundation, University Park, PA (US)

(*) Notice: Subject to any disclaimer, the term of this patent is extended or adjusted under 35 U.S.C. 154(b) by 284 days.

(21) Appl. No.: 18/002,691

(22) PCT Filed: Jul. 1, 2021

(86) PCT No.: PCT/US2021/040101
§ 371 (c)(1),
(2) Date: Dec. 22, 2022

(87) PCT Pub. No.: WO2022/010734
PCT Pub. Date: Jan. 13, 2022

(65) Prior Publication Data
US 2023/0245577 A1 Aug. 3, 2023

Related U.S. Application Data

(60) Provisional application No. 63/049,378, filed on Jul. 8, 2020.

(51) Int. Cl.
*G08G 9/02* (2006.01)
*G08G 1/16* (2006.01)
(Continued)

(52) U.S. Cl.
CPC ............... *G08G 9/02* (2013.01); *G08G 1/16* (2013.01); *G08G 5/80* (2025.01); *H10F 30/2863* (2025.01)

(58) Field of Classification Search
CPC . G08G 9/02; G08G 1/16; G08G 5/045; H01L 31/1126; H01L 31/112
See application file for complete search history.

(56) References Cited

U.S. PATENT DOCUMENTS

| | | | | |
|---|---|---|---|---|
| 2014/0319452 A1* | 10/2014 | Seabaugh | ............. | H10K 85/20 257/9 |
| 2015/0132006 A1* | 5/2015 | Inoue | ................. | G03B 21/2033 398/118 |

(Continued)

FOREIGN PATENT DOCUMENTS

| | | |
|---|---|---|
| EP | 0908954 A2 | 4/1999 |
| RU | 2724044 C1 | 6/2020 |
| WO | 2018019921 A1 | 2/2018 |

OTHER PUBLICATIONS

International Preliminary Report on Patentability for PCT/US2021/040101 dated Jan. 10, 2023.
(Continued)

*Primary Examiner* — Bitew A Dinke
(74) *Attorney, Agent, or Firm* — Buchanan Ingersoll & Rooney PC

(57) ABSTRACT

A compact collision detector can be configured for low power operation to facilitate collision avoidance. In one embodiment, a nanoscale collision detector can be based on a photodetector, stacked on top of a non-volatile and programmable memory architecture that imitates the escape response of LGMD neuron at a frugal energy expenditure of few nanojoules (nJ) and at the same time can offer orders of magnitude benefit in device footprint (e.g. by having a relatively small size). Embodiments of the collision detector can be utilized in smart, low-cost, task-specific, energy efficient and miniaturized collision detection systems configured for collision avoidance.

16 Claims, 60 Drawing Sheets

(51) Int. Cl.
  *G08G 5/80*    (2025.01)
  *H10F 30/28*   (2025.01)

(56) References Cited

U.S. PATENT DOCUMENTS

| | | | | |
|---|---|---|---|---|
| 2016/0047888 | A1* | 2/2016 | Roberts | G01S 17/931 |
| | | | | 701/300 |
| 2016/0223404 | A1* | 8/2016 | Samarao | G01J 5/024 |
| 2018/0017679 | A1* | 1/2018 | Valouch | A63F 13/655 |
| 2018/0053827 | A1* | 2/2018 | Sumant | H01L 29/267 |
| 2018/0067495 | A1* | 3/2018 | Oder | G06V 20/56 |
| 2019/0129036 | A1* | 5/2019 | Valouch | H10K 30/35 |
| 2019/0257690 | A1* | 8/2019 | Tong | H01L 31/1126 |
| 2020/0278431 | A1* | 9/2020 | Zhu | G01S 17/10 |
| 2020/0303417 | A1* | 9/2020 | Teo | H10D 30/675 |
| 2020/0355915 | A1* | 11/2020 | Tsukuda | B60K 35/00 |
| 2021/0064037 | A1* | 3/2021 | Boutaud | G01S 17/42 |
| 2021/0349196 | A1* | 11/2021 | Wang | G01S 7/484 |
| 2021/0359099 | A1* | 11/2021 | Shen | B82Y 10/00 |
| 2021/0391471 | A1* | 12/2021 | Vellianitis | H10D 30/751 |
| 2021/0399138 | A1* | 12/2021 | Jariwala | H10D 64/033 |
| 2023/0040758 | A1* | 2/2023 | Hersam | G06N 3/065 |
| 2023/0111422 | A1* | 4/2023 | Lang | B60R 21/0132 |
| | | | | 701/45 |

OTHER PUBLICATIONS

International Search Report for PCT/US2021/040101 dated Oct. 7, 2021.

* cited by examiner

Read
$V_{BG} = -0.50$ V
$V_{DS} = 1.0$ V
$I_{DS}$ - pA/μm

Read
$V_{BG} = -0.75\ V$
$V_{DS} = 1.0\ V$
$I_{DS} \sim pA/\mu m$

| $t_P$ (ms) | $\Delta V_{HW}$ (V) - Dark | $\Delta V_{HW}$ (V) - Light |
|---|---|---|
| 10 | 0.02 | 0.39 |
| 100 | 0.02 | 0.40 |
| 1000 | 0.04 | 0.55 |

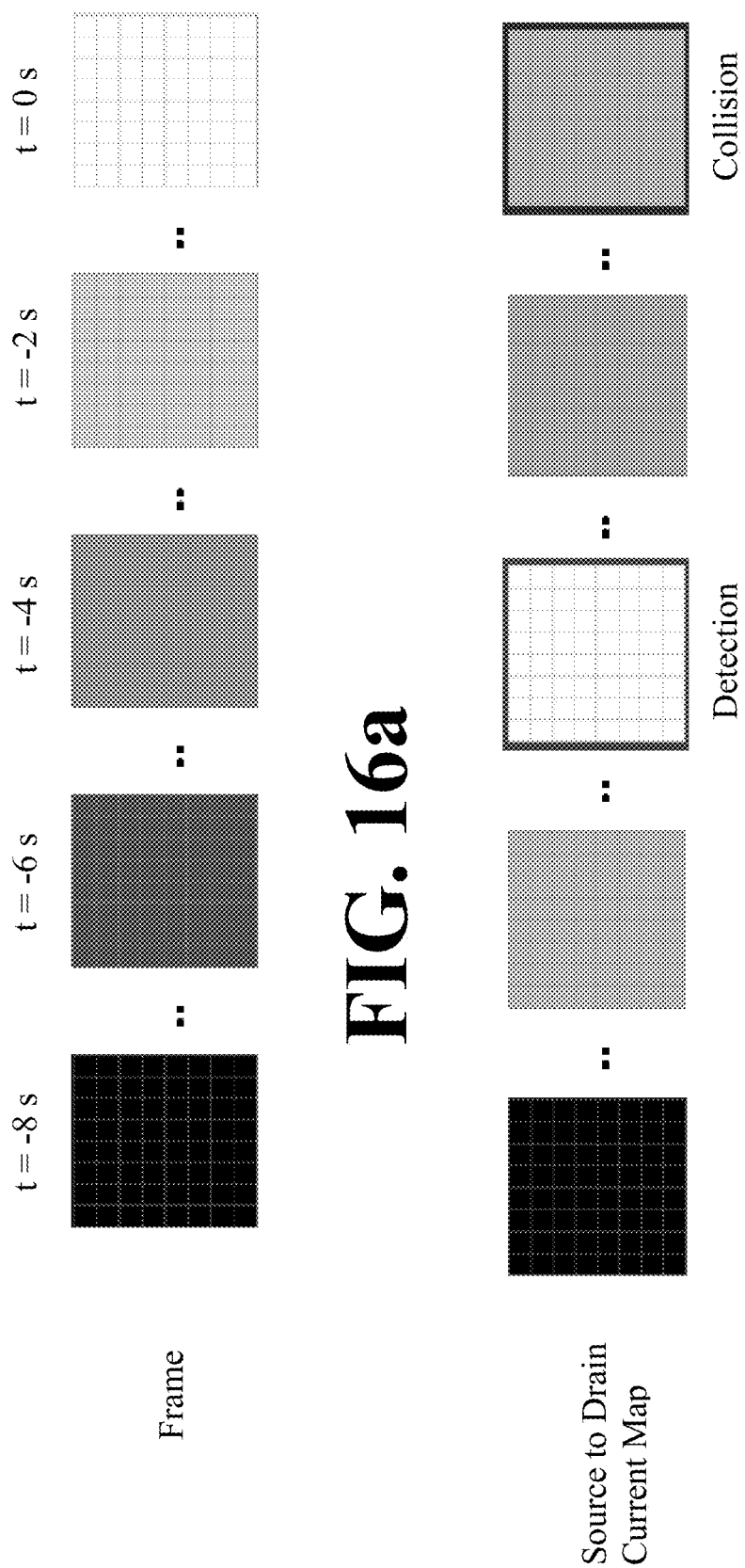
FIG. 16a     FIG. 16b

COLLISION DETECTOR, COLLISION DETECTION SYSTEM, AND METHOD OF USING SAME

CROSS-REFERENCE TO RELATED APPLICATIONS

This application is the U.S. national stage application of International Patent Application No. PCT/US2021/040101 filed on Jul. 1, 2021, which claims priority to U.S. Provisional Patent Application No. 63/049,378, filed Jul. 8, 2020. The entirety of this provisional patent application is incorporated by reference herein.

FIELD

The present innovation relates to collision detectors, collision detection systems configured for collision avoidance, and methods of making and using the same.

BACKGROUND

Autonomous and semi-autonomous robots are under development and have been employed in a number of fields including defense, transportation, manufacturing, agriculture, households and even medical surgeries. Most robotic tasks involve locomotion over complex terrains and/or compliance with sophisticated rules (e.g. autonomous driving of vehicles). Often general-purpose vision systems are used to help a robot avoid running into an object as it moves.

SUMMARY

We have determined that general-purpose vision systems which are based on sophisticated mathematical algorithms, that can be utilized in robot systems to try and facilitate collision avoidance can require significant hardware implementation challenges since these algorithms often require iterative solution, making them computationally extensive and hence energy and area inefficient. We have determined that one way to bypass such computational bottleneck is to construct compact and task specific vision hardware, where visual signal processing is incorporated into a sensor and its associated circuitry to reduce transmission bandwidth and avoid subsequent stages of computation. These so-called "smart sensors" can be configured to replace power hungry general-purpose digital machines.

We have determined that energy and area efficient solutions for timely collision detection can be found in sensory neurobiology allowing animals to escape from predators or to capture preys. For instance, we have determined that some animals have evolved specialized movement-sensitive neurons which fire in response to objects approaching on a direct collision course in such a manner that the firing frequency peaks sufficiently prior to the potential collision. This allows the animal enough time to compute the speed and direction of successful escape/attack through necessary motor actions. Examples of these types of collision monitoring neurons have been discovered in pigeon, fish, monkeys and different arthropod species such as locusts, flies, crayfish and crabs.

We discovered that early very large scale integration ("VLSI") implementations of insect inspired vision hardware have often relied on the Hassenstein-Reichardt model where correlation between delayed response from neighboring cells in a photoreceptor array is used for motion and collision detection. But such implementations often had a relatively large footprint and high-power budgets, both continue to pose challenges for the deployment of these state-of-the-art collision detectors that can be used in robots and autonomous vehicles to help these devices avoid collisions while autonomously moving.

Some embodiments of our collision detector, array of collision detectors and system for collision detection can utilize at least one compact and ultra-low power solid-state collision detector by integrating a semiconductor based photodetector with a memory stack that allows dynamic, non-volatile and reconfigurable threshold voltage engineering. For example, some embodiments can utilize at least one compact and ultra-low power solid-state collision detector by integrating a monolayer $MoS_2$ based photodetector with a back-gate memory stack that allows dynamic, non-volatile and reconfigurable threshold voltage engineering.

Some embodiments of our detector can mimic the response of a lobula giant movement detector (LGMD) neuron in a locust. This single neuronal cell can perform intriguing nonlinear mathematical operation on high level features of the visual stimuli to generate avoidance warning for the motor neuron system at a frugal energy expenditure. We demonstrate that embodiments of our biomimetic collision detector also consume a relatively miniscule amount of energy, (e.g. in the range of nano Joules), for timely identification of an impending collision. Embodiments of our collision detector can be utilized in a low-cost, energy efficient and miniaturized collision detection systems configured for collision avoidance that can be employed in a number of applications in robots and autonomous vehicles.

A collision detector can include a first layer that can be configured as an excitatory layer and a second layer configured as an inhibitory layer. The first layer can be a photodetector and the second layer can be a non-volatile and programmable memory stack.

In some embodiments, the programmable memory stack can be a programmable floating-gate non-volatile memory stack.

The photodetector can include or be a semiconductor. In some embodiments, the first layer can be a monolayer of $MoS_2$.

The inhibitory layer can consist of a p++Si/TiN/Pt/$Al_2O_3$ non-volatile and programmable memory stack. In other embodiments, the inhibitory layer can include a p++Si/TiN/Pt/$Al_2O_3$ non-volatile and programmable memory stack. In yet other embodiments, the inhibitory layer can have other configurations.

The first layer can include a source connected to a $MoS_2$ layer and a drain connected to the $MoS_2$ layer. The second layer can include an $Al_2O_3$ layer, a Pt. layer between the $Al_2O_3$ layer and a TiN layer, the TiN layer being between the Pt and a p++Si layer. The p++Si layer can be connected to a back gate and/or positioned as a back gate.

A method of forming a collision detector can include forming a collision detector to have a first layer and a second layer. The first layer can include a source and a drain connected to a semiconductor layer. The second layer can be structured as a non-volatile and programmable memory unit.

For example, the first layer can include a source and a drain connected to a $MoS_2$ layer. The second layer can be structured as a non-volatile and programmable stack including an $Al_2O_3$ layer, a Pt. layer between the $Al_2O_3$ layer and a TiN layer, the TiN layer being between the Pt and a p++Si layer. The p++Si layer can be connected to a back gate and/or positioned as a back gate. In some embodiments, the $MoS_2$ layer is positioned on the $Al_2O_3$ layer.

A method for detecting an object to avoid a collision with the object can include receiving a visual stimulus from the object, applying voltage pulses to a non-volatile and programmable memory stack of a collision detector, and supplying the voltage to a photodetector of the collision detector connected to the non-volatile and programmable memory stack.

Embodiments of the method for detecting the object to avoid a collision with the object can also include one or more of: (i) detecting a non-monotonic trend in output characteristics of the collision detector with time to the visual stimulus, (ii) identifying and/or determining an occurrence of an inflection point based on the detecting prior to collision with the object, and (iii) adjusting motion to avoid collision with the object based on the identifying and/or determining of the occurrence of the inflection point. The inflection point can be a local minima or a local maxima.

The method for detecting an object to avoid a collision with the object can include utilization of an embodiment of a collision detector. Any embodiment of a collision detector as discussed herein can be utilized in an embodiment of the method, for example.

A collision detection system is also provided. The system can include a single collision detector as a standalone collision detector. Any embodiment of a collision detector as discussed herein can be utilized in an embodiment of the system, for example.

Other embodiments of a collision detection system can include an array of collision detectors. Each of the collision detectors can be configured as any embodiment of a collision detector as discussed herein, for example. The array can include a combination of such collision detectors or a plurality of the same type of collision detector or a combination of different groups of collision detectors or types of collision detectors.

Embodiments of the collision detection system can also include a computer device communicatively connected to the array of collision detectors or single standalone collision detector. The computer device can include a processor (Proc.) connected to a non-transitory computer readable medium (Mem.). The collision detection system can be included in a vehicle or robot. For example, the collision detection system can be included in any kind of robot, a drone, a car, a truck, an automobile, an airplane, a helicopter, a train, a boat, a motorcycle, a bicycle, or another type of vehicle to provide a collision avoidance function.

Other details, objects, and advantages of the invention will become apparent as the following description of certain exemplary embodiments thereof and certain exemplary methods of practicing the same proceeds.

BRIEF DESCRIPTION OF THE DRAWINGS

Exemplary embodiments of a collision detector, an array of collision detectors, and a system for collision detection are shown in the accompanying drawings and certain exemplary methods of making and practicing the same are also illustrated therein. It should be appreciated that like reference numbers used in the drawings may identify like components.

In FIG. 3(d) an embodiment of the collision detector can exploit the light coming directly from the object on collision course and does not necessitate any other light source.

FIG. 3f shows a monotonic increase in the light intensity with impending collision. In biophysical experiments this is referred to as the looming stimulus.

FIG. 5e is a bar plot for time to collision detection (LD) by the exemplary embodiment of our $MoS_2$ based collision detector of FIG. 1f and FIG. 2b that was extracted using FIG. 5a.

FIG. 16a illustrates a simulated escape response from a multipixel collision detector comprising of 128×128 2D array of collision detectors where the looming stimuli is presented as a sequence of gray scale images with 128×128 pixels such that each pixel excites the corresponding collision detector. The pixel intensities range from black (0), when the object is far away from collision to white (255), at collision. The intensities of pixels are mapped to the LED voltages ($V_{LED}$) with the highest pixel intensity representing $V_{LED}$=5 V. The speed of the approaching object is captured by the number of frames per second.

FIG. 16b illustrates source to drain current maps of an embodiment of the 2D collision detector array (normalized to gray scale). Clearly, the current map becomes the brightest before the looming stimulus reaches the peak intensity allowing collision avoidance.

DETAILED DESCRIPTION

Figure 1A:
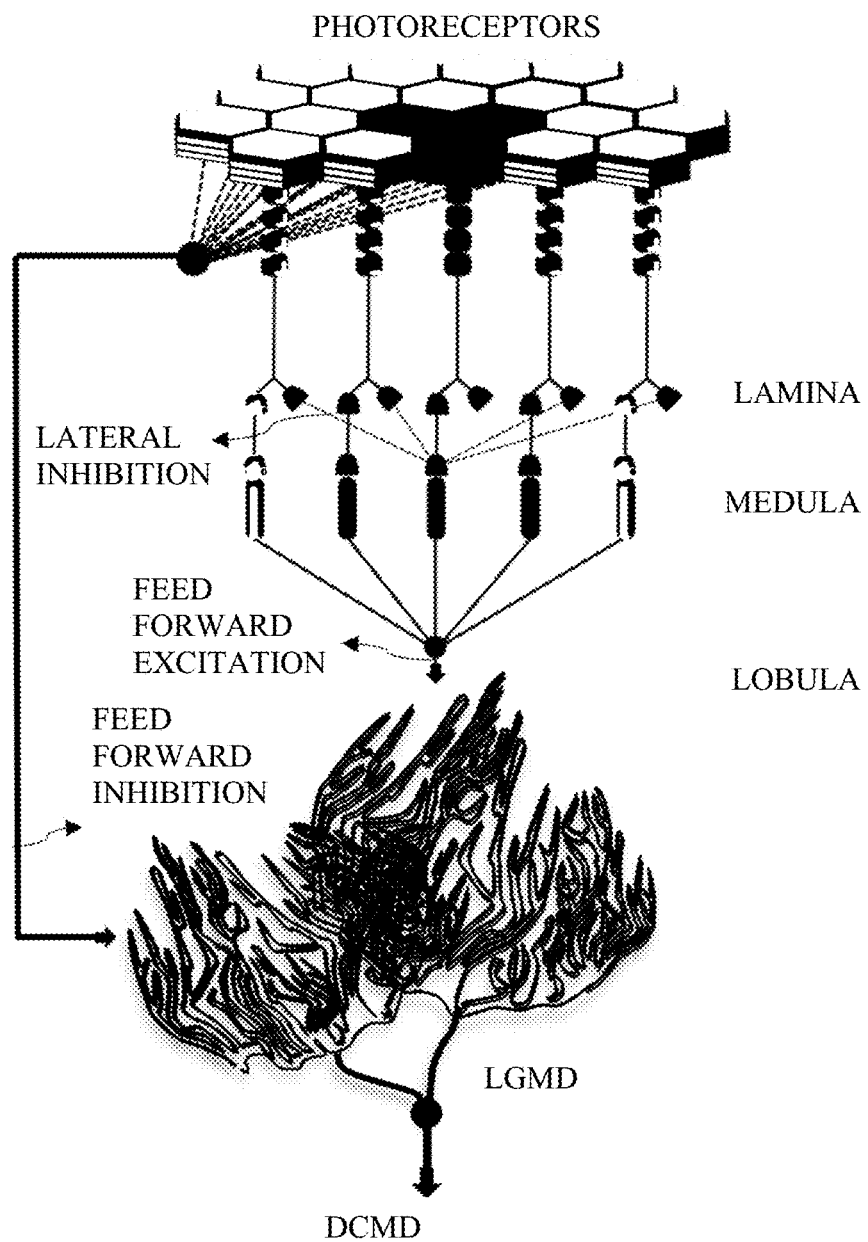
FIG. 1a shows the schematic of the anatomical organization of the LGMD neuron.
Figure 1B:
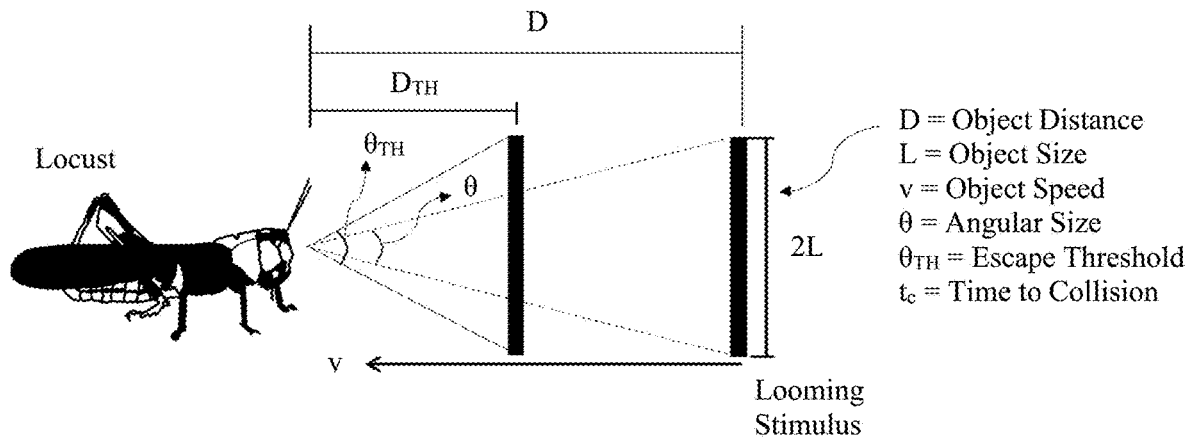
FIG. 1b shows a geometrical drawing for an exemplary looming stimulus and the associated critical parameters such as the object distance, size and speed.
Figure 1C:
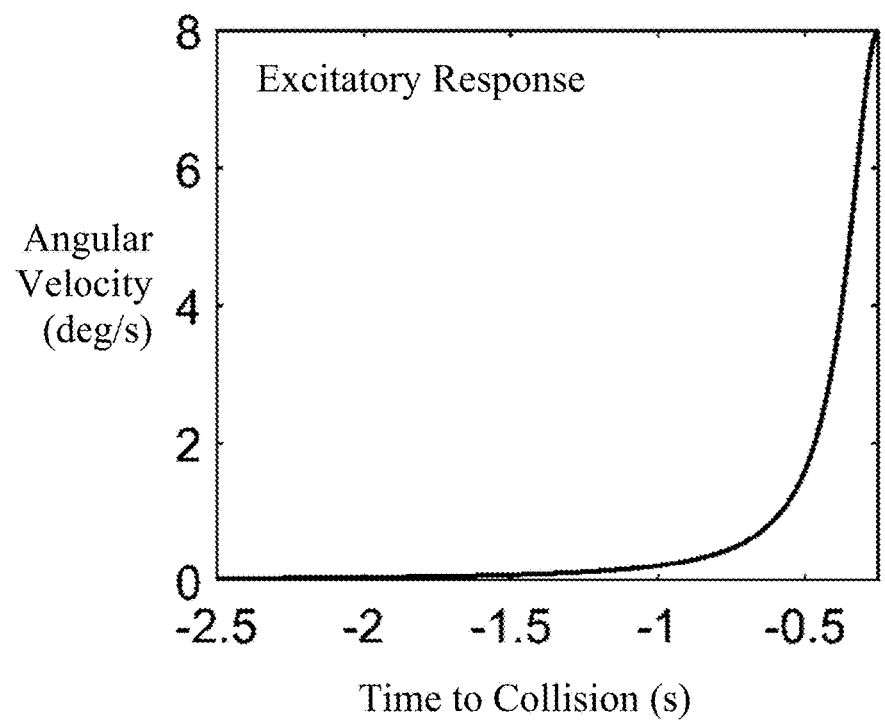
FIG. 1c is a graph showing the time evolution of excitatory ($\theta'$) response to a looming stimulus, in the LGMD neuron following equation 1.
Figure 1D:
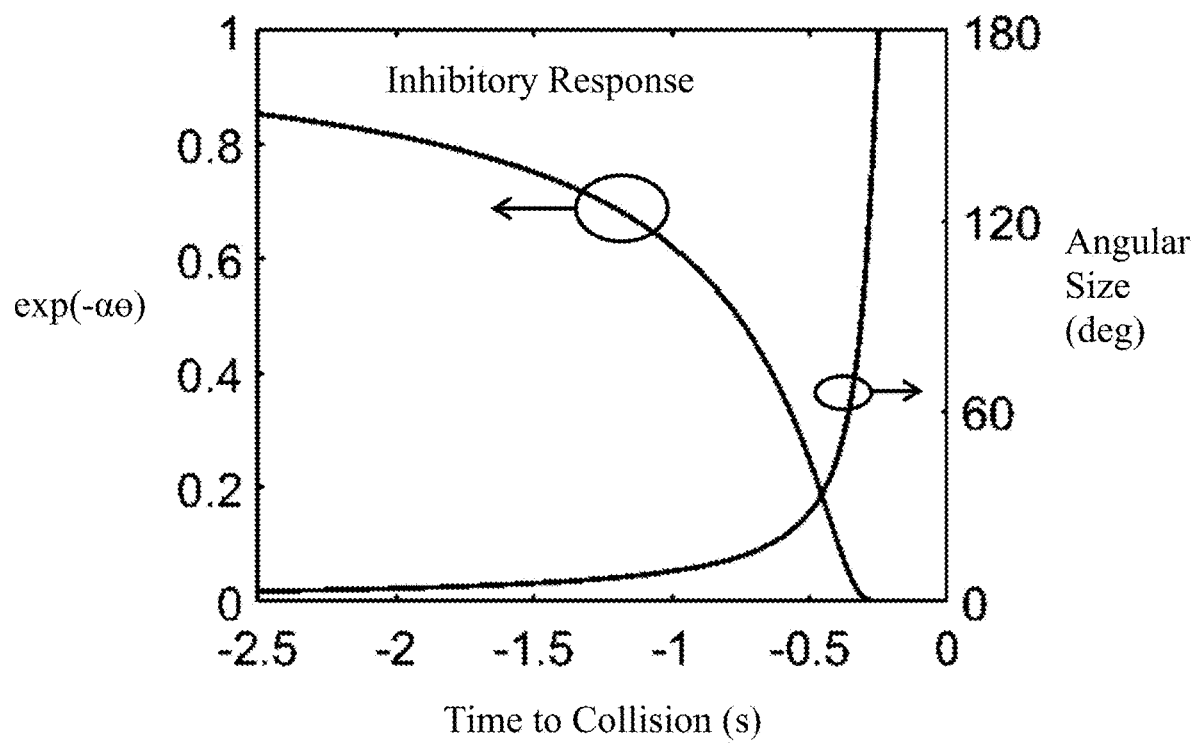
FIG. 1d is a graph showing the time evolution of inhibitory ($\exp[-\alpha\theta]$) response to a looming stimulus, in the LGMD neuron following equation 1.
Figure 1E:
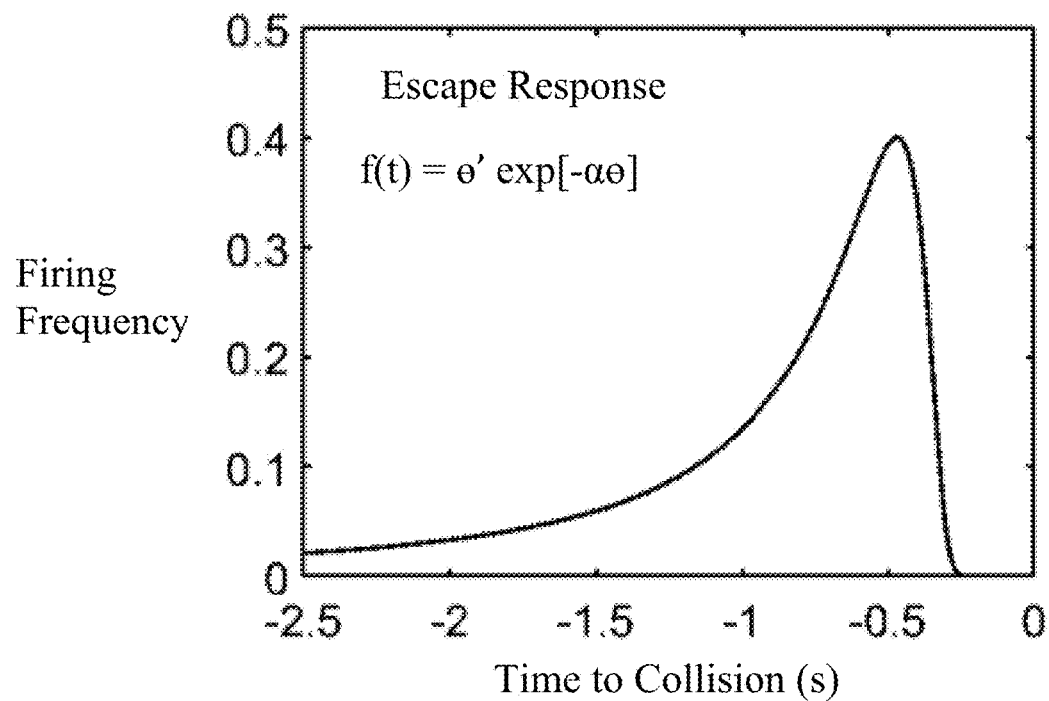
FIG. 1e is a graph showing the time evolution of spiking (f) response of the LGMD neuron to a looming stimulus following equation 1.
Figure 1F:
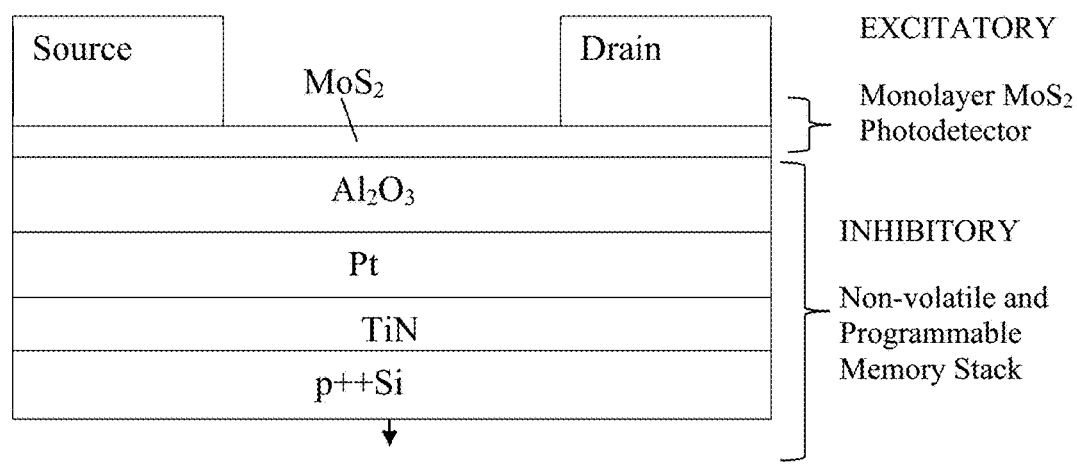
FIG. 1f is a schematic view of an exemplary embodiment of a collision detector that includes a monolayer $MoS_2$ based photodetector and a programmable non-volatile memory unit that can facilitate dynamic threshold voltage engineering.
Figure 2A:
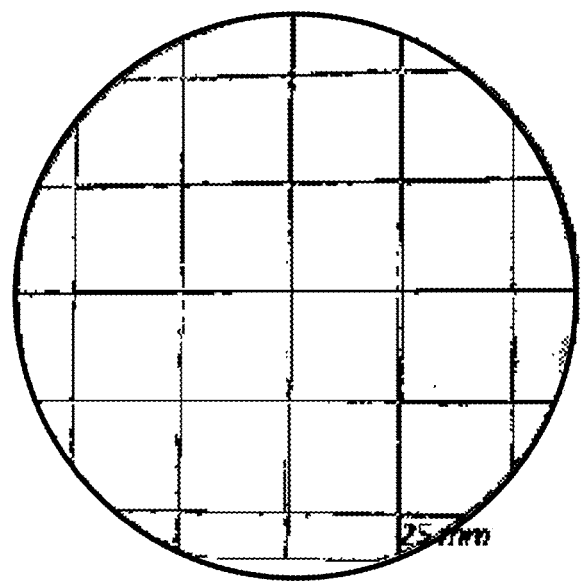
FIG. 2a illustrates an exemplary fully coalesced monolayer $MoS_2$ film on a 2-inch sapphire substrate grown using metal organic chemical vapor deposition (MOCVD) technique inside a cold-wall horizontal reactor setup using molybdenum hexacarbonyl, $Mo(CO)_6$, and $H_2S$ as the precursor and $H_2$ as the carrier gas at 1000° C.
Figure 2B:
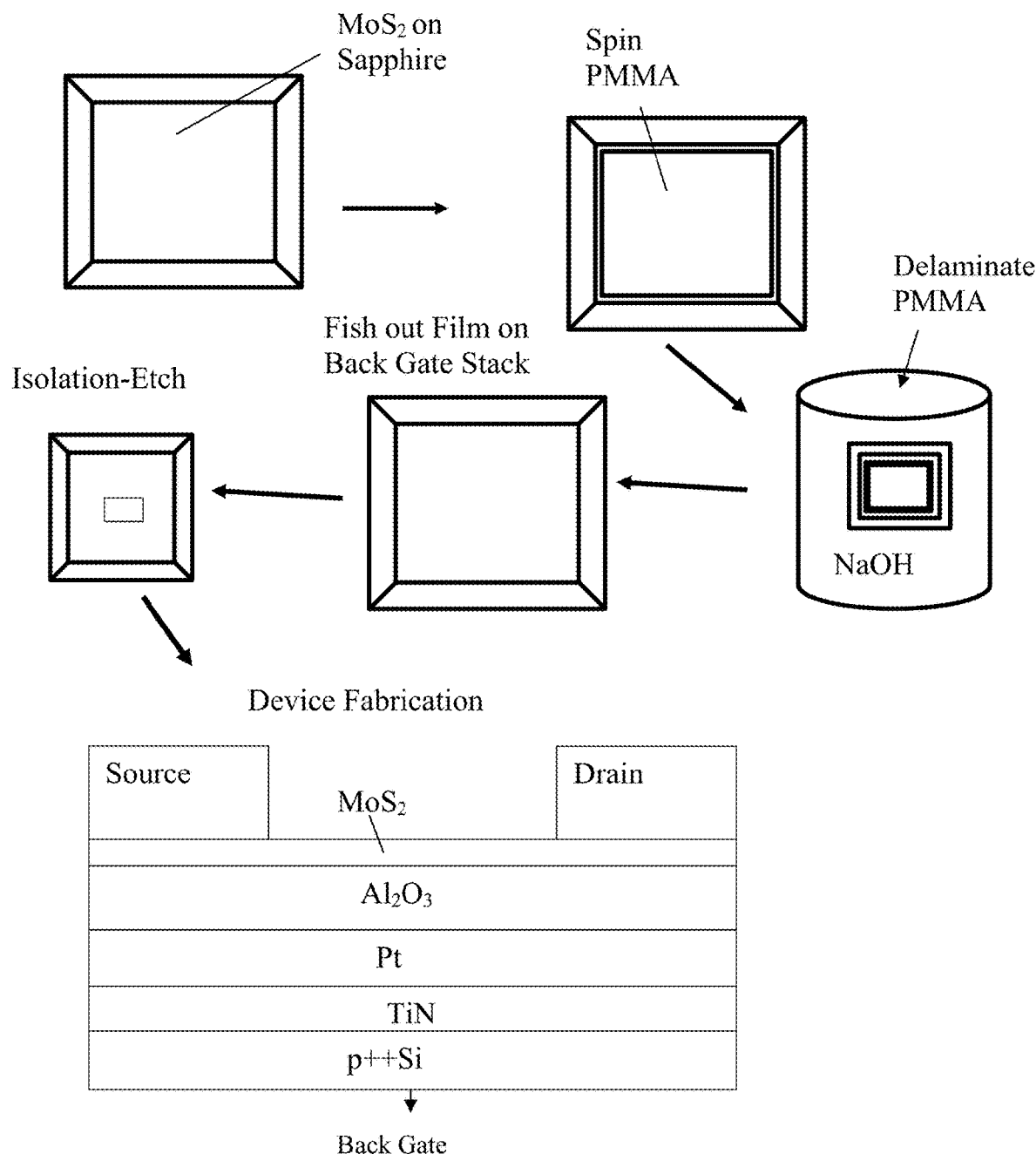
FIG. 2b is a schematic flow chart illustrating a PMMA-assisted wet transfer process used for transferring the embodiment of the monolayer $MoS_2$ film of FIG. 2a from the sapphire substrate to the device fabrication substrate followed by back gated field effect transistors (FET) fabrication. The back-gate stack for the embodiment of FIG. 2b included an atomic layer deposition (ALD) grown 50 nm $Al_2O_3$ used as the gate dielectric and $Pt/TiN/p^{++}Si$ as the gate electrode.

Referring to FIGS. 1f, 2a, and 2b, an embodiment of our collision detector can include a photodetection layer. The photodetection layer can include a semiconductor layer connected to a source and a drain. An example of such a semiconductor layer can include an $MoS_2$ layer connected to a source and a drain. The semiconductor layer can be positioned on and/or operatively connected to an inhibitory layer. The inhibitory layer can include a non-volatile programmable memory unit.

For example, in some embodiments, an $MoS_2$ layer can be positioned on and/or operatively connected to an inhibitory layer. The inhibitory layer can include a layer of $Al_2O_3$, Pt, TiN, and p++-Si layers positioned on a back gate. The inhibitory layer can be configured as a non-volatile programmable memory unit.

As may be appreciated from FIG. 2a and FIG. 2b, an exemplary fabrication process for an embodiment of this collision detector can include: $MoS_2$ layer synthesis, characterization of the $MoS_2$ layer, transfer of the characterized $MoS_2$ layer to a substrate, gate dielectric fabrication, and back gated field effect transistors fabrication. The formed collision detector can then be evaluated via measurements to help confirm its operability. An exemplary process as shown in FIG. 2a and FIG. 2b is further discussed below for forming an exemplary embodiment of the collision detector. It should be appreciated that the geometry and particular sizing of dimensions and layer thicknesses etc. are exemplary and provide a non-limiting example for implementation of this particular fabrication method for an embodiment of our collision detector: The exemplary process can include:

(A) Synthesis of monolayer $MoS_2$: Monolayer $MoS_2$ was deposited on epi-ready 2" c-sapphire substrate by metalorganic chemical vapor deposition (MOCVD). An inductively heated graphite susceptor equipped with wafer rotation in a cold-wall horizontal reactor was used to achieve uniform monolayer deposition as previously described. Molybdenum hexacarbonyl (Mo$(CO)_6$) and hydrogen sulfide ($H_2S$) were used as precursors. Mo$(CO)_6$ maintained at 10° C. and 950 Torr in a stainless steel bubbler was used to deliver 0.036 sccm of the metal precursor for the growth, while 400 sccm of $H_2S$ was used for the process. $MoS_2$ deposition was carried out at 1000° C. and 50 Torr in $H_2$ ambient, where monolayer growth was achieved in 18 min. The substrate was first heated to 1000° C. in $H_2$ and maintained for 10 min before the growth was initiated. After growth, the substrate was cooled in $H_2S$ to 300° C. to inhibit decomposition of the $MoS_2$ films.

(B) Characterization of monolayer $MoS_2$: Raman and photoluminescence (PL) measurements were performed using a HORIBA LabRAM HR Evolution Raman microscope with laser wavelengths of 532 nm. Raman spectra were collected with 1800 grooves per mm grating, while PL measurements were conducted with 300 grooves per mm grating. The Raman and PL maps were acquired over 5×5 μm² area.

(C) Transfer of monolayer $MoS_2$: To fabricate the $MoS_2$ FETs, $MoS_2$ film grown on sapphire is transferred onto alumina substrate using PMMA (polymethyl-methacrylate) assisted wet transfer process. $MoS_2$ on sapphire substrate is spin coated with PMMA and then baked at 180° C. for 90 s. The corners of the spin coated film are scratched using razor blade and immersed inside 1M NaOH solution kept at the 90° C. Capillary action draws NaOH into the substrate/film interface, separating PMMA/$MoS_2$ film from the sapphire substrate. The separated film is rinsed multiple times inside a water bath and finally transferred onto the 50 nm alumina substrate and then baked at 50° C. and 70° C. for 10 minutes each to remove moisture and residual PMMA ensuring pristine interface.

(D) Gate Dielectric Fabrication: Direct replacement of thermally oxidized $SiO_2$ with a high-κ dielectric such as $Al_2O_3$ grown via atomic layer deposition (ALD) is a logical choice to scale the effective oxide thickness (EOT). However, we found that $Al_2O_3$/p++-Si interface is not ideal for back gated FET fabrication owing to higher gate leakage current, more interface trap states and large hysteresis which negatively impact the performance of the device. Replacing Si with Pt, a large work function metal (5.6 eV) allows minimal hysteresis and trap state effects. Since Pt readily forms a Pt silicide at temperatures as low as 300° C., a 20 nm TiN diffusion barrier deposited by reactive sputtering was placed between the p++Si and the Pt permitting subsequent high temperature processing. This conductive TiN diffusion barrier allows the back-gate voltage to be applied to the substrate, thus simplifying the fabrication and measurement procedures. The polycrystalline Pt introduces very little surface roughness to the final Al$_2$O$_3$ surface with a rms roughness of 0.7 nm.

(E) Device Fabrication: Back gated field effect transistors (FET) are fabricated using e-beam lithography. To define the channel region the substrate is spin coated with PMMA and baked at 180° C. for 90 s. The photoresist is then exposed to e-beam and developed using 1:1 mixture of 4-methyl-2-pentanone (MIBK) and 2 propanol (IPA). The monolayer MoS$_2$ film is subsequently etched using sulfur hexafluoride (SF$_6$) at 5° C. for 30 s. Next the sample is rinsed in acetone and IPA to remove the photoresist. In order to fabricate the source/drain contacts the substrate is again spin coated with MMA and PMMA followed by the e-beam lithography, developing using MIBK and IPA, and e-beam evaporation of 40 nm Ni/30 nm Au stack. Finally, the photoresist is rinsed away by a lift off process using acetone and IPA.

The embodiment of our fabrication method for this particular embodiment also included an evaluation and analysis step. In particular, it also included:

(F) Electrical Measurements: Electrical measurements were performed in air inside a Lakeshore probe station using a B1500A Keysight semiconductor parameter analyzer.

(E) Fast Fourier transform (FFT): FFT is computed to convert the signal from its original domain in time to a representation in the frequency domain. It is also an inbuilt function in MATLAB that computes the discrete Fourier transform of the input signal. We performed the fast Fourier transform on the source to drain current, sampled in time domain, to study the frequency components of the output current at different regimes of operation. The code snippet is given below. Variables I_DS and ydft store the output current measured at a particular back gate voltage and the computed FFT of the current, respectively. Variables psdy and freq store the corresponding power spectral density (PSD) and the frequency.

$N$=length($I\_DS$);

$ydft$=$fft$($I\_DS$);

$ydft$=$ydft$(1:$N$/2+1);

$psdy$=(1/$N$)*abs($ydft$)$^\wedge$2;

$psdy$(2:end−1)=2*$psdy$(2:end−1);

freq=0:$Fs$/length(ID):$Fs$/2; and plot(freq,10*log 10($psdy$)).

An embodiment of a collision detector can be appreciated from FIG. 1$f$ and FIG. 2$b$. A system for collision detection can utilize an array of collision detectors. But, in some embodiments the system may only need to utilize one collision detector.

The collision detector can include a first layer and a second layer. The first layer can be configured as an excitatory layer and the second layer can be configured as an inhibitory layer. The first layer can include a source and a drain connected to a semiconductor layer. The second layer can be structured as a non-volatile and programmable memory stack.

For example, the first layer can include a source and a drain connected to a MoS$_2$ layer. The second layer can be structured as a non-volatile and programmable stack that includes an Al$_2$O$_3$ layer on which the MoS$_2$ layer is positioned. The second layer can also include Pt, TiN, and p++Si layers. The Pt layer can be between the Al$_2$O$_3$ layer and the TiN layer. The TiN layer can be between the Pt and p++Si layers. The p++Si layer can be connected to and/or positioned on a back gate. In some embodiments, the back gate can be a metal member (e.g. metal layer, a metal sheet, etc.).

For instance, a first side of the Pt layer can be directly connected to the Al$_2$O$_3$ layer on a side of the Al$_2$O$_3$ layer that is opposite a side of the Al$_2$O$_3$ layer on which the MoS$_2$ layer is positioned. A second side of the Pt layer opposite its first side can be directly connected to the TiN layer. A side of the TiN layer can be directly connected to the p++Si layer opposite a side of the TiN layer directly connected to the Pt layer. A side of the p++Si layer can be directly connected to the gate opposite the side of the p++Si layer that is connected to the TiN layer.

Other layers can utilize other photodetection layers and non-volatile memory stack configurations. For instance, the first layer can include a different photodetector layer than the MoS$_2$ layer of the exemplary embodiment. As another example, the inhibitory layer can include a different non-volatile and programmable stack configuration.

In some embodiments, the collision detector can be configured as a transistor that is structured as a metal-oxide-semiconductor field-effect transistor (MOSFET, MOS-FET, or MOS FET).

Signals generated by the one or more collision detectors of a collision detection system included in a vehicle or robot can be fed to a processor (Proc.) of a computer device to detect an object that may be near a body of a moving object (e.g. robot, autonomous vehicle, drone, vehicle, car, plane, boat, etc.). The computer device can utilize this information to trigger a response so that the detected object is avoided (e.g. slowing of speed, change of direction, a combination of changes in speed and direction of motion, etc.) when running code stored on the non-transitory memory of the computer device to control motion of the robot or vehicle (e.g. flying via one or more rotors, motion over land via wheels, legs, or tracks, motion in water via one or more rudders and/or propulsion system such as a propeller or sail, etc.).

Exemplary Embodiment of Neural Algorithm for Collision Avoidance:

We determined that the locust can provide a useful model for understanding the biophysical implementation of collision avoidance. Locusts migrate in dense swarms comprising of millions of individuals with insignificantly low collision rates. We believe that locusts detect collision, primarily using their wide-field, motion-sensitive LGMD neuron, which is a unique and highly sophisticated neuron capable of performing non-linear computations contrary to simple threshold-based firing. It uses a distributed neural computation architecture that aids in visual information processing.

FIG. 1$a$ shows the schematic of the anatomical organization of the LGMD neuron with massive dendritic fan outs, that receive feed forward excitation, feed forward inhibition and lateral inhibition from the hexagonally packed photoreceptors in locust's compound eye through a series of retinotopically arranged layers, i.e. lamina, medulla and lobula. We believe that the LGMD neuron as a whole may perform multiplicative operation on two high-level features of visual stimuli, i.e. angular size ($\theta$) and angular velocity ($\theta'$) of the looming object and generates a non-monotonic firing frequency (f) given by Eq. 1.

$$f(t)=\exp[\log\theta'-\alpha\theta]=\theta'\exp[-\alpha\theta]; \alpha=\tan^{-1}(2/\theta_{TH});  \quad [\text{Eq. 1}]$$

Here, $\theta_{TH}$ is an animal and species dependent parameter that determines the angular size of the approaching object at which the LGMD firing frequency reaches its peak value. In most animals, we believe $15°<\theta_{TH}<40°$.

FIG. 1b shows the geometrical drawing for a looming stimulus and the associated critical parameters such as the object distance, size and speed. It has been found that log θ' and θ are, respectively, conveyed through the excitatory and inhibitory dendritic pathways to the LGMD neuron which subsequently performs the summation and exponential mapping operations to obtain the multiplicative transfer function for the spike generation.

FIGS. 1c, 1d and 1e, respectively, show the time evolution of excitatory (θ') inhibitory ($\exp[-\alpha\theta]$), and spiking (f) response to a looming stimulus following equation 1. The spiking frequency in FIG. 1e shows a non-monotonic trend and peaks before the impending collision. While the LGMD neuron responds to a wide variety of visual stimuli, greatest excitation occurs only for objects in direct flight path i.e. looming objects, resulting in maximum spike frequency. Moreover, the network structure can also filter out photo-excitation caused by non-colliding stimuli, such as moving backgrounds, rotational movements and approaching objects that are not on a direct collision course. Finally, LGMD neurons from both eyes synapse onto one descending contralateral motion detector (DCMD) neuron (as shown in FIG. 1a) which synapses with the motor interneurons involved in the generation of flight maneuvers. The chemical synapse between LGMD and DCMD is strong and reliable such that each action potential in LGMD invokes a corresponding action potential in DCMD. Overall, the LGMD-DCMD pair serves as a timely warning system for collision avoidance. Note that the behavioral execution of the escape is determined by other areas of the locust's brain.

Figure 1G:
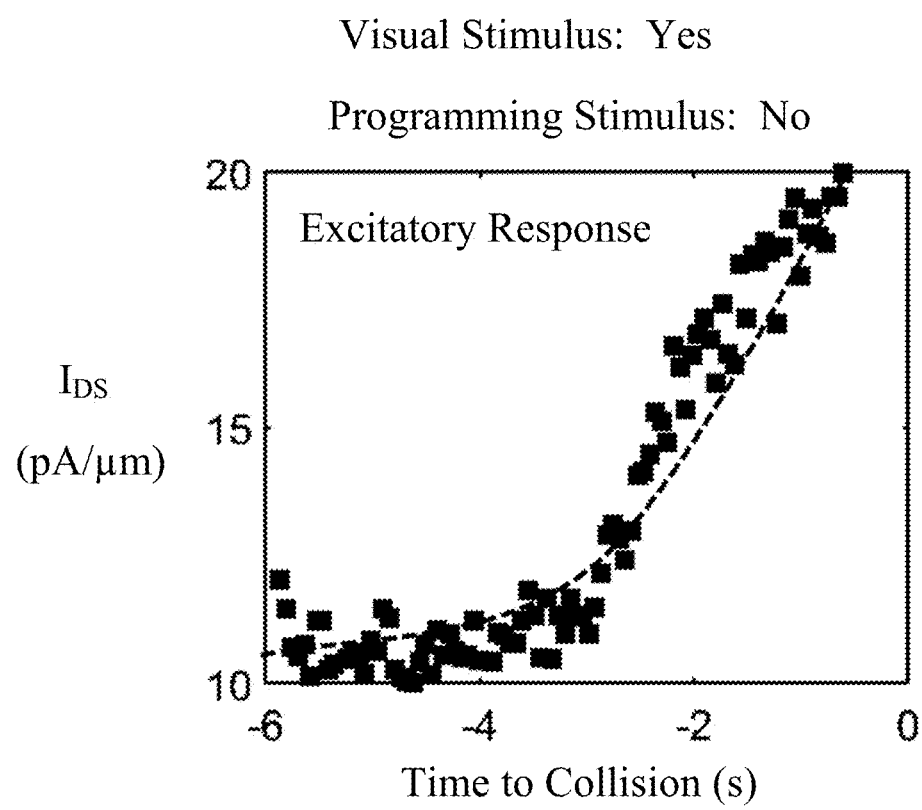
FIG. 1g is a graph illustrating the excitatory response to looming stimulus in the absence of any back-gate programming stimulus for the embodiment of our collision detector shown in FIG. 1f.
Figure 1H:
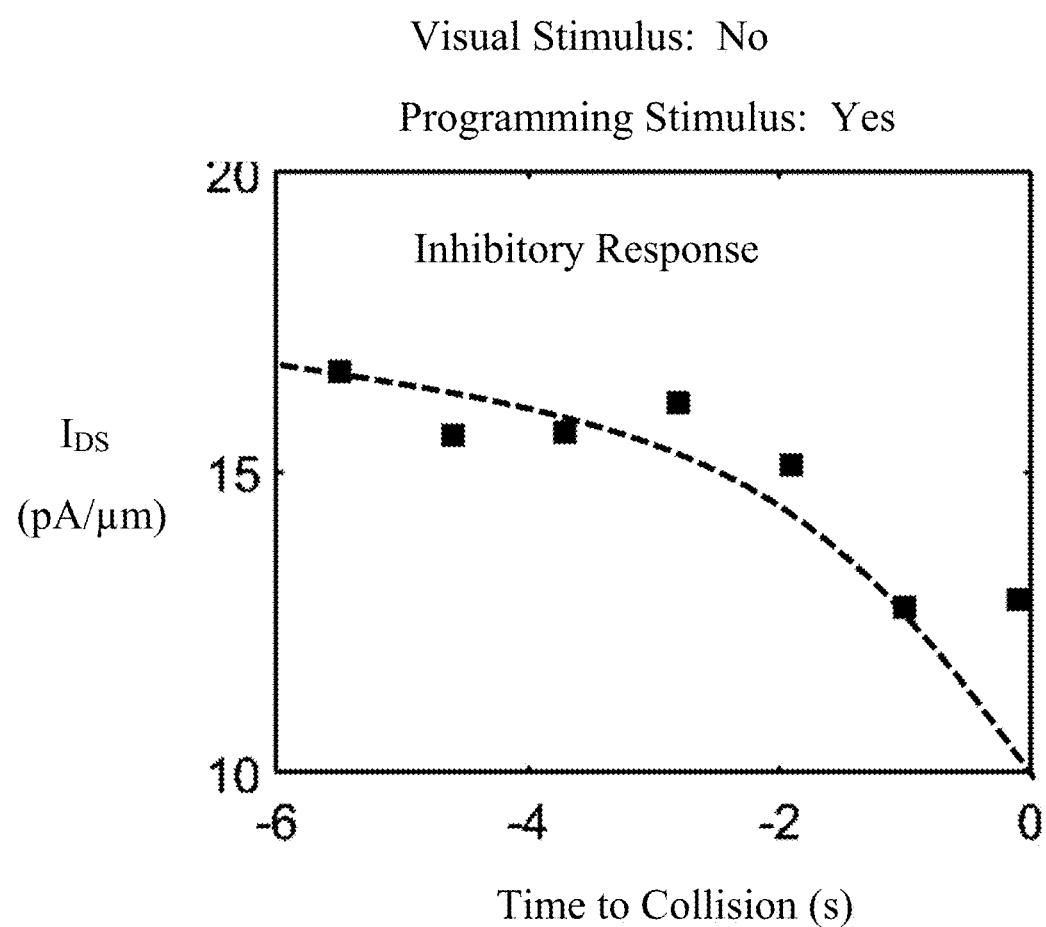
FIG. 1h is a graph illustrating the inhibitory response to back-gate voltage stimulus in the absence of visual stimulus for the embodiment of our collision detector shown in FIG. 1f.
Figure 1I:
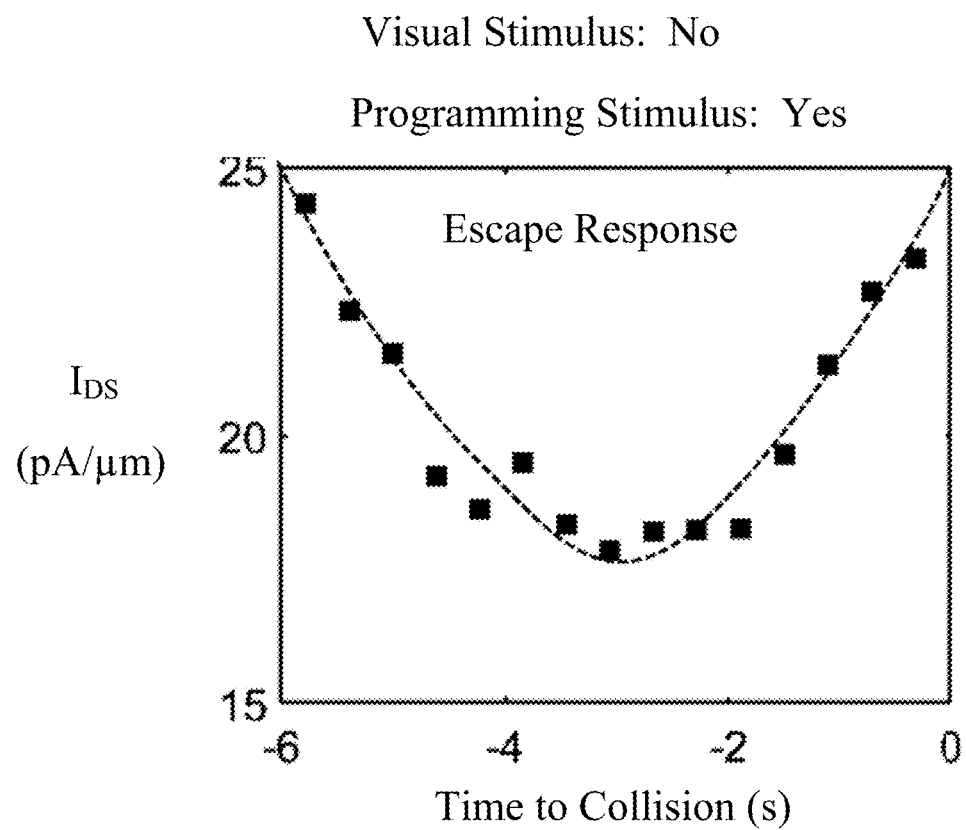
FIG. 1i is a graph illustrating the LGMD-like non-monotonic escape response when both external visual stimulus and internal programming stimulus are present simultaneously for the embodiment of our collision detector shown in FIG. 1f.

FIG. 1f shows implementation of an embodiment of an LGMD-inspired solid-state collision detector using a single nanoscale optoelectronic device consisting of a monolayer $MoS_2$ based photodetector placed on top of a programmable and non-volatile memory stack that allows dynamic threshold voltage engineering through the application of back-gate voltage pulses. Under no programming stimulus (back-gate pulse), the $MoS_2$ photodetector identifies a looming object through a monotonic increase in the device current (photo-excitation) as shown in FIG. 1g. On the contrary, under a programming voltage pulse train of appropriate magnitude applied to the back-gate stack the $MoS_2$ photodetector shows a monotonic decrease in the device current (programming inhibition) in the absence of any visual stimuli as shown in FIG. 1h. When both stimuli are present simultaneously, the visual excitation and programming inhibition compete against each other and invoke a non-monotonic trend in the output current that mimics the LGMD escape response as shown in FIG. 1i.

$MoS_2$ a type of van der Waals (vdW) material known as the transition metal dichalcogenide (TMDC). The layered structure of the collision detector shown in FIG. 1f allows micromechanical separation of atomically thin standalone layers of $MoS_2$ where unique and exquisite electronic, optoelectronic, spintronic, piezotronics, valleytronics and excitonic properties can exist are otherwise absent in the bulk form of the material. $MoS_2$ can have a semiconducting nature that allows orders of magnitude modulation in the $MoS_2$ sheet conductance using electrostatic gate control owing to the existence of a finite bandgap which can also aid in achieving low power operation. Furthermore, a monolayer $MoS_2$ can provide a direct bandgap semiconductor.

A metal organic chemical vapor deposition (MOCVD) technique can be utilized to form the $MoS_2$ layer of the detector shown in FIG. 1f and FIG. 2a. For instance, the synthesis of a relatively large area monolayer $MoS_2$ film inside a cold-wall horizontal reactor can be set up using molybdenum hexacarbonyl, $Mo(CO)_6$, and $H_2S$ as the precursor and $H_2$ as the carrier gas at 1000° C. on an epitaxial sapphire substrate. Epitaxial growth at elevated temperature using hydride chalcogen precursor can help ensure better crystallinity and low carbon contamination in the $MoS_2$ film which can ultimately result in better electrical performance.

FIG. 2a shows a fully coalesced monolayer $MoS_2$ film on a 2-inch sapphire substrate. Following the synthesis, monolayer $MoS_2$ film was transferred from the sapphire substrate to the device fabrication substrate using a PMMA-assisted wet transfer process as shown in FIG. 2b. Back gated field effect transistors (FET) can subsequently be fabricated. The channel region can be patterned using e-beam lithography and etched using sulfur hexafluoride ($SF_6$) at 5° C. for 30 s. Source/drain contacts can be defined using e-beam lithography followed by e-beam evaporation of 40 nm Ni/30 nm Au stack.

Figure 2C:
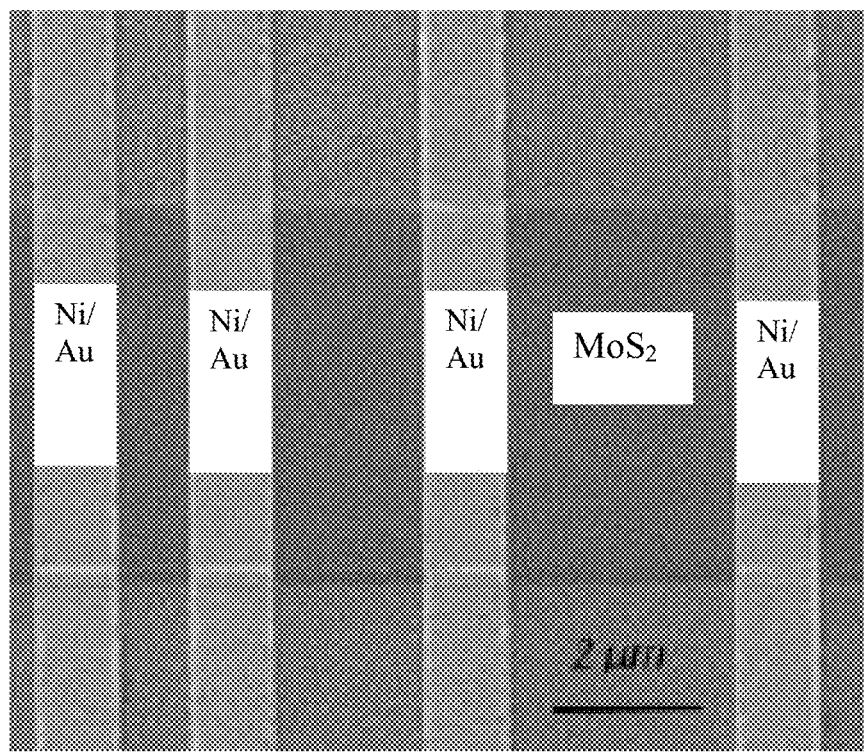
FIG. 2c is a false colored scanning electron microscope (SEM) image of the monolayer $MoS_2$ FET of the collision detector of FIG. 1f and FIG. 2b. The embodiment of the collision detector for this graph had 1 μm channel length and 5 μm channel width. The transferred monolayer $MoS_2$ film quality was accessed using Raman spectroscopy and photoluminescence (PL) measurements.

FIG. 2c shows the false colored scanning electron microscope (SEM) image of the monolayer $MoS_2$ FET for the embodiment of the collision detector shown in FIG. 1f that can be formed via the exemplary method illustrated in FIG. 2b and exemplary method discussed above. The collision detector in this particular embodiment had 1 μm channel length and 5 μm channel width. The back-gate stack included an atomic layer deposition (ALD) grown 50 nm $Al_2O_3$ used as the gate dielectric and $Pt/TiN/p^{++}$-Si as the gate electrode.

Figure 2D:
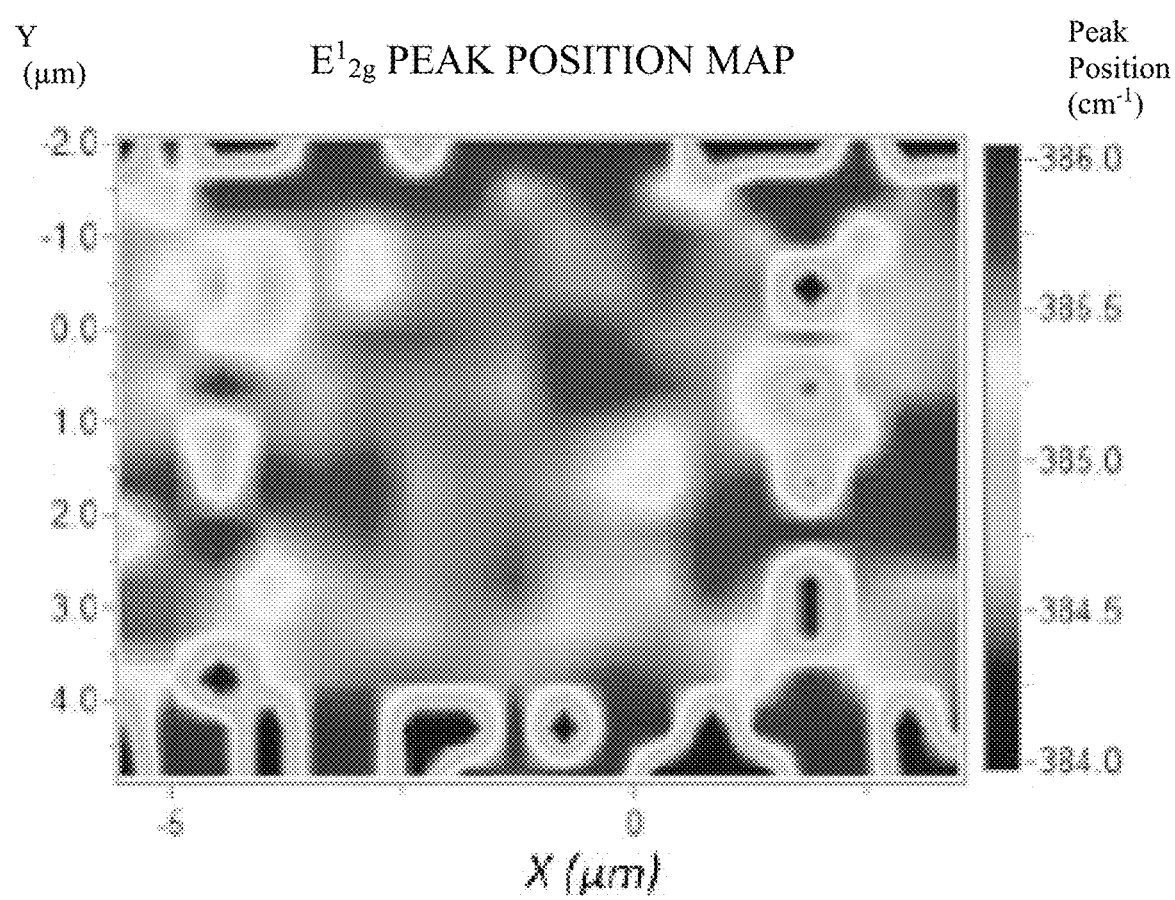
FIG. 2d is a spatial map of the peak position of a first Raman active mode, $E_{2g}^1$ of the collision detector of FIG. 1f and FIG. 2b over a 5 μm×5 μm active device area.
Figure 2E:
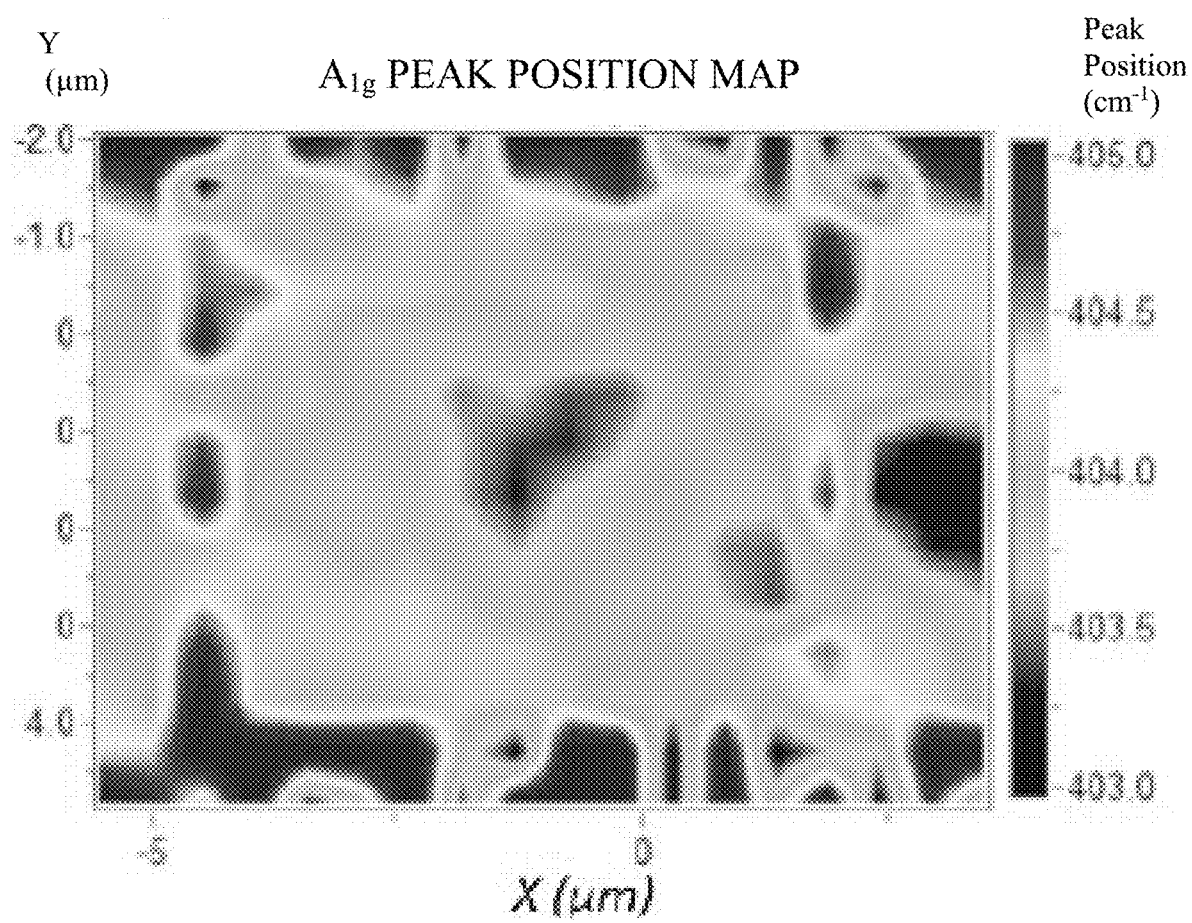
FIG. 2e is a spatial map of the peak position of a second Raman active mode, $A_{1g}$ of the collision detector of FIG. 1f and FIG. 2b over a 5 μm×5 μm active device area.
Figure 2F:
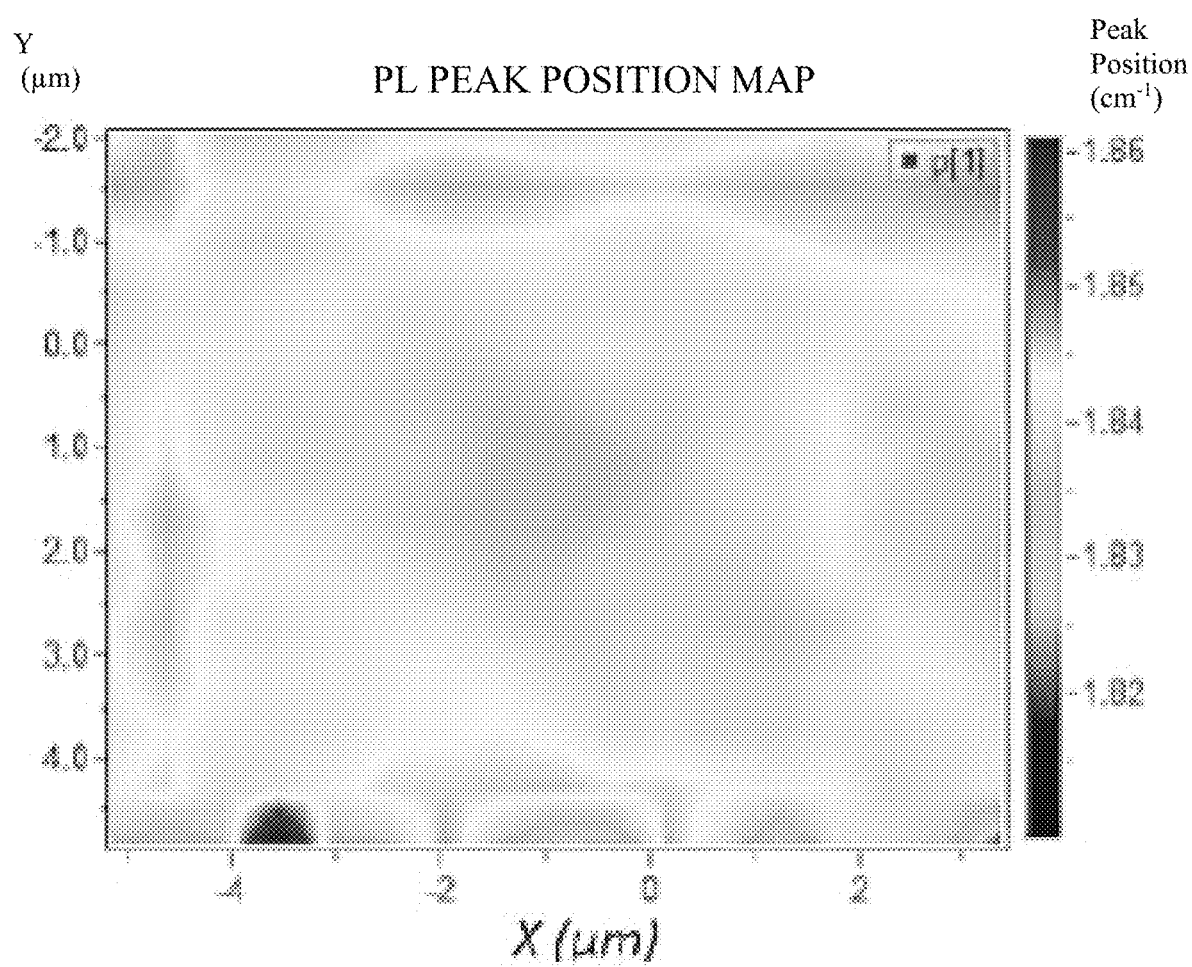
FIG. 2f is a map of PL peak position for an embodiment of the collision detector of FIG. 1f and FIG. 2b.
Figure 2G:
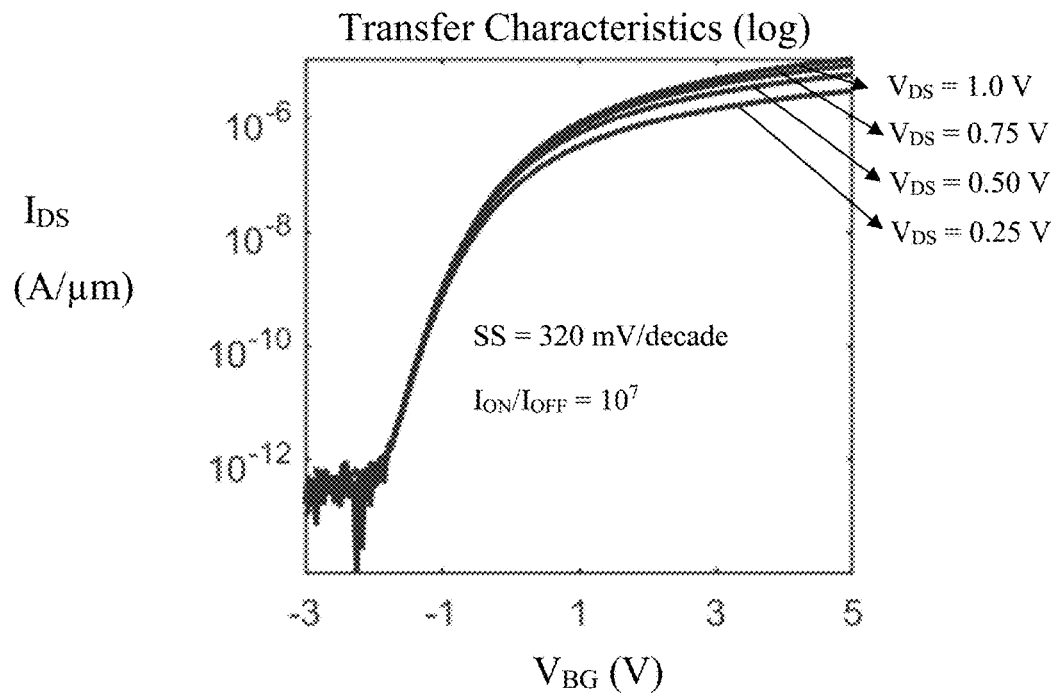
FIG. 2g is a graph illustrating source to drain current ($I_{DS}$) transfer characteristic as a function of the back gate voltage ($V_{BG}$) for the monolayer $MoS_2$ FET of the embodiment of the collision detector shown in FIG. 1f and FIG. 2b measured at different source to drain biases ($V_{DS}$) in the logarithmic scale.
Figure 2H:
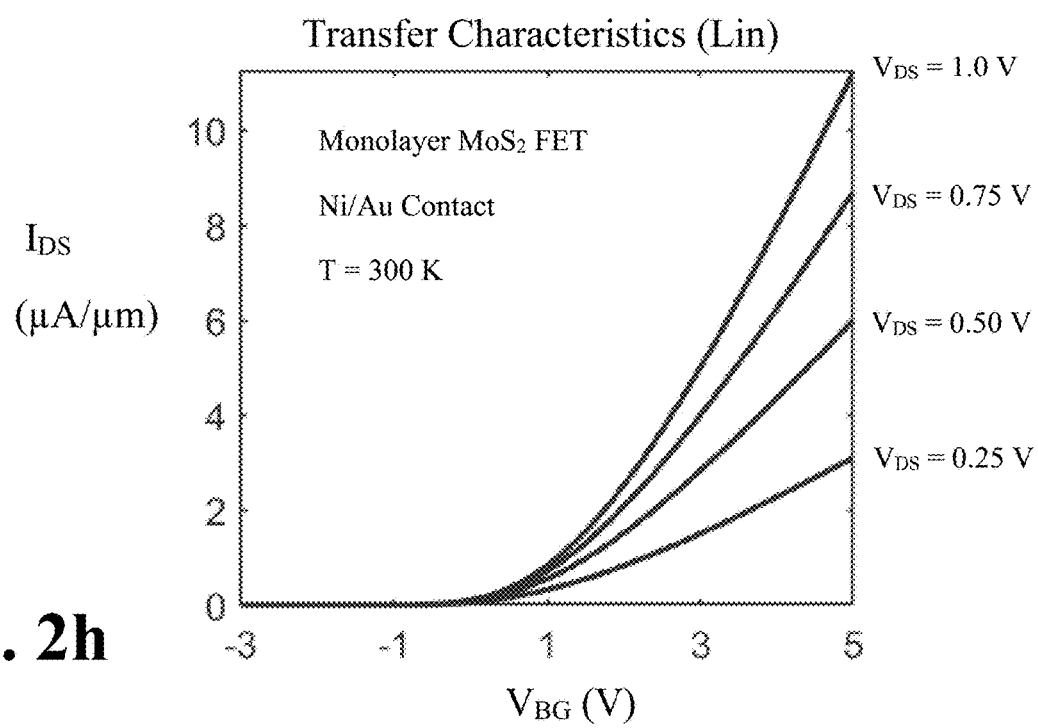
FIG. 2h is a graph illustrating source to drain current ($I_{DS}$) transfer characteristic as a function of the back gate voltage ($V_{BG}$) for the monolayer $MoS_2$ FET of the embodiment of the collision detector shown in FIG. 1f and FIG. 2b measured at different source to drain biases ($V_{DS}$) in linear scale.

Before measuring the electrical response for this exemplary embodiment, we investigated the quality of the transferred monolayer $MoS_2$ using Raman spectroscopy and photoluminescence (PL) measurements. FIG. 2d and FIG. 2e, respectively show the spatial map of the peak position of two Raman active modes $E_{2g}^1$ and $A_{1g}$ over 5 μm×5 μm active device area. Raman peak positions vary less than 0.5% over the entire map confirming high quality and uniformity of the monolayer film. The peak separation of 18 $cm^{-1}$ is also consistent with monolayer $MoS_2$. Furthermore, FIG. 2f shows uniform and intense PL peak at 1.84 eV which is attributed to the indirect to direct bandgap transition at the K-point in the Brillouin zone in monolayers $MoS_2$ and is severely suppressed in bulk $MoS_2$. FIG. 2g and FIG. 2h show the transfer characteristics, i.e. source to drain current ($I_{DS}$) as a function of the back gate voltage ($V_{BG}$) for the monolayer $MoS_2$ FET measured at different source to drain biases ($V_{DS}$) in the logarithmic and linear scales, respectively. Clearly, n-type transport dominates in monolayer $MoS_2$ FET which can be attributed to the pinning of metal Fermi level close to the conduction band facilitating electron injection.

Figure 6A:
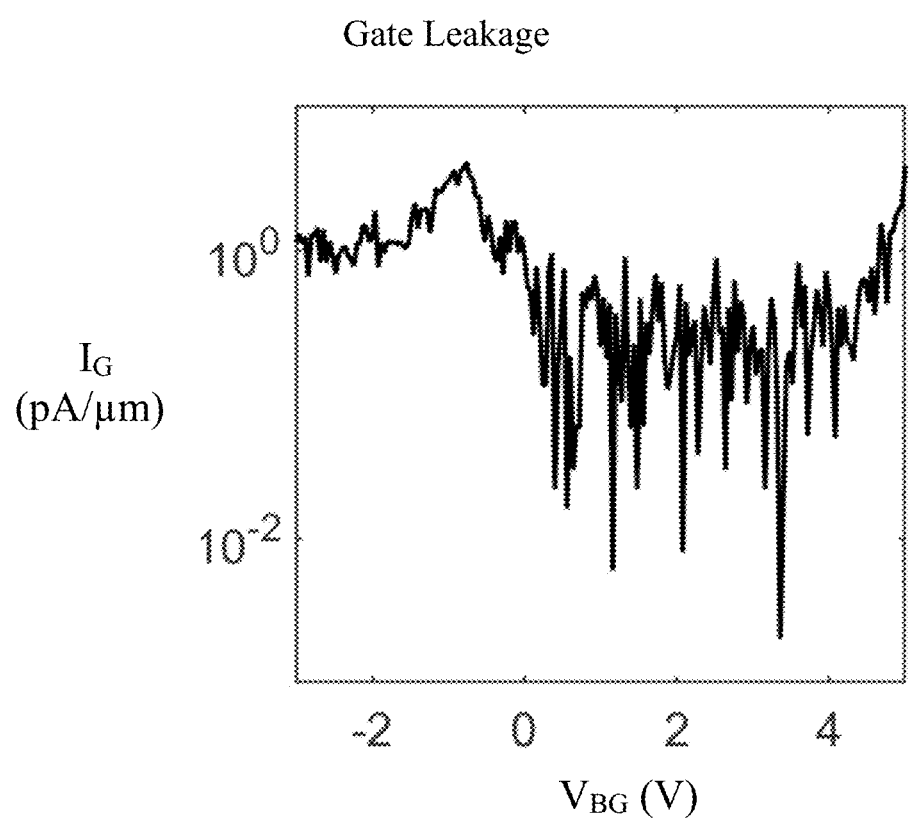
FIG. 6a is a graph illustrating gate leakage characteristics of the monolayer $MoS_2$ FET of the exemplary embodiment of our collision detector.

This exemplary embodiment of our collision detector showed excellent ON/OFF current ratio in excess of $10^7$, subthreshold slope (SS) of less than 320 mV/decade, none to minimal drain induced barrier lowering (DIBL), and low gate leakage indicating high quality of the gate dielectric, semiconducting $MoS_2$ channel, and dielectric and contact interfaces (See FIG. 6a).

Figure 2I:
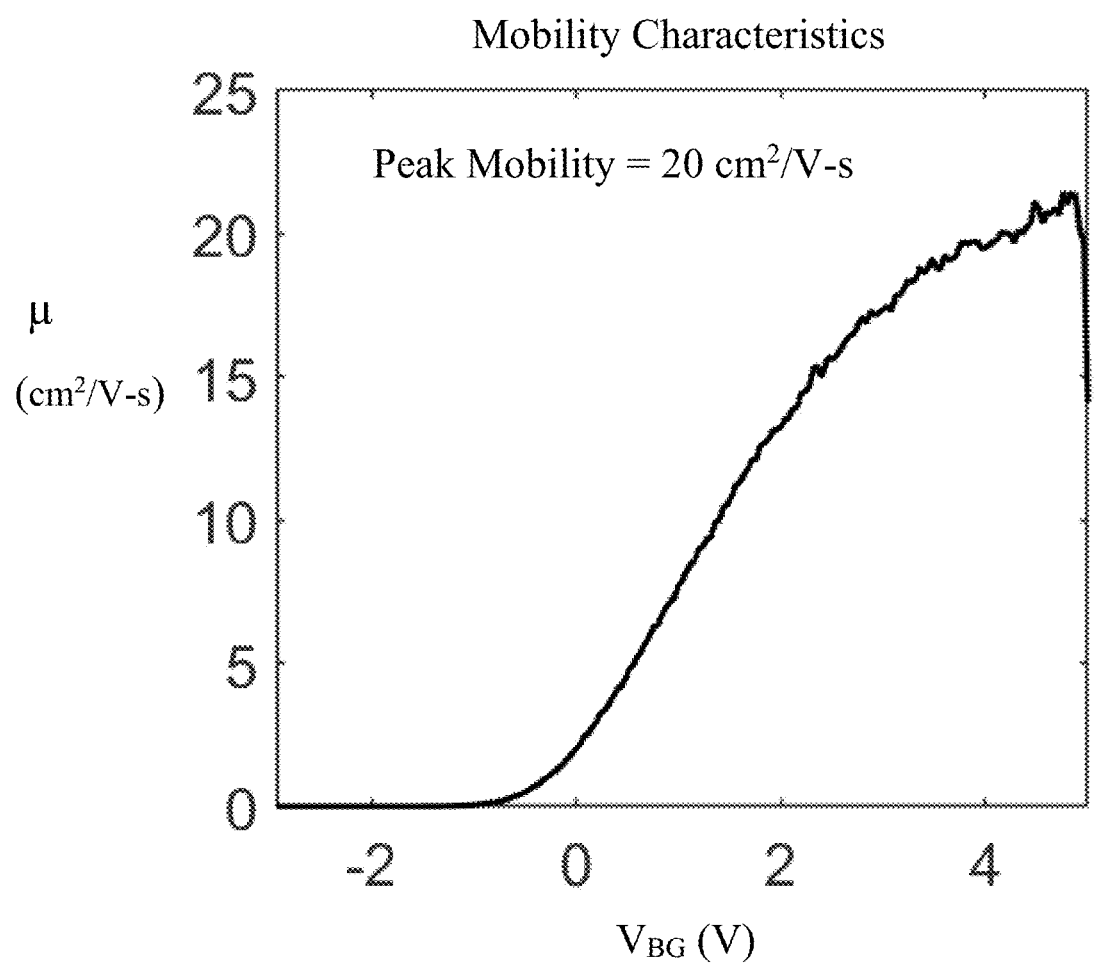
FIG. 2i is a graph illustrating the field effect mobility ($\mu_{FE}$) extracted from the trans-conductance as a function of the back gate voltage ($V_{BG}$) for the embodiment of the collision detector shown in FIG. 1f and FIG. 2b. The peak $\mu_{FE}$ was found to be ~20 cm$^2$/V-s, which is comparable to exfoliated single crystal monolayer MoS$_2$.
Figure 2J:
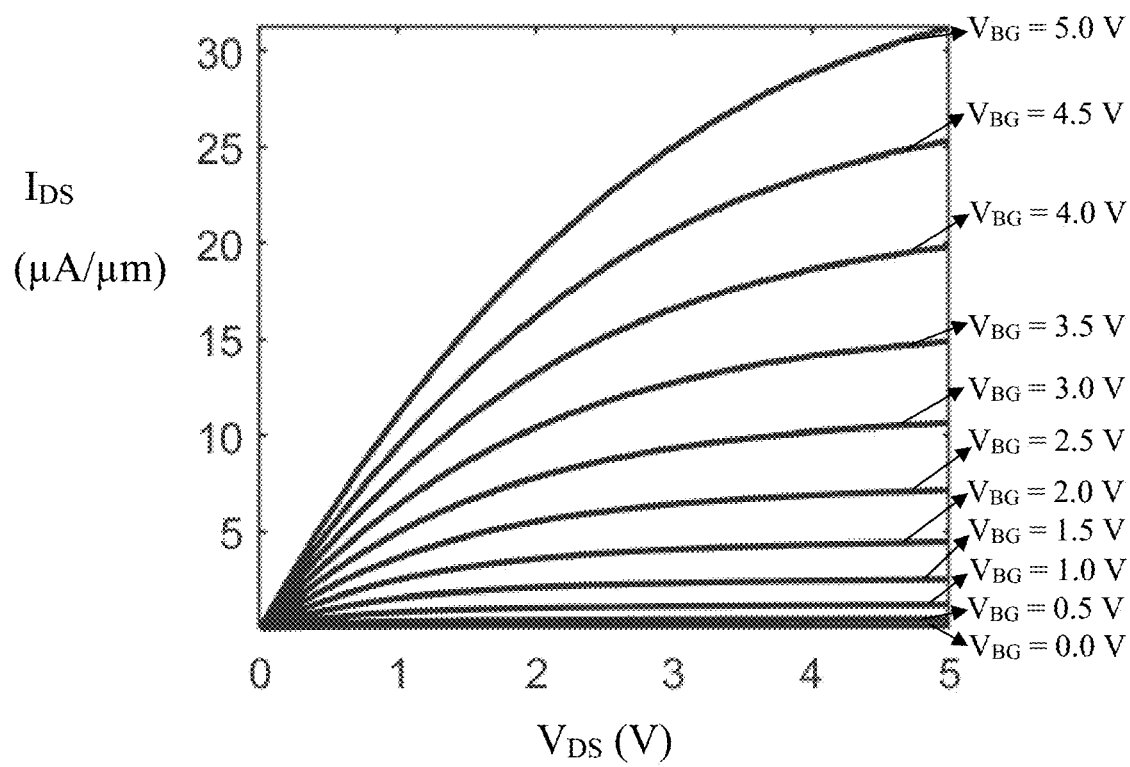
FIG. 2j is a graph illustrating measured output characteristics (i.e. $I_{DS}$ versus $V_{DS}$ for different $V_{BG}$) of the MoS$_2$ FET for the embodiment of the collision detector shown in FIG. 1f and FIG. 2b with the ON current reaching as high as ~30 $\mu$A/$\mu$m at $V_{DS}$=5 V for an inversion charge carrier density of ~5*10$^{12}$/cm$^2$.

The exemplary embodiment of the collision detector was found to exhibit low voltage operation under 5 V for both the back-gate bias and drain bias. The threshold voltage ($V_{TH}$) was found to be ~0.45 V and the field effect mobility ($\mu_{FE}$)

value was found to be ~20 cm$^2$/V-s extracted from the peak trans-conductance as shown in FIG. 2i. The $\mu_{FE}$ value is comparable to that of exfoliated single crystal monolayer MoS$_2$. FIG. 2j shows the output characteristics (i.e. I$_{DS}$ versus V$_{DS}$ for different V$_{BG}$) of the MoS$_2$ FET with the ON current reaching as high as ~30 μA/μm at V$_{DS}$=5 V for an inversion charge carrier density of ~5*10$^{12}$/cm$^2$. Further details on the synthesis, film transfer, characterization, device fabrication and electrical measurements are provided herein as well.

Monolayer MoS$_2$ Photodetector and its Response to Looming Stimuli:

The MoS$_2$ layer of an exemplary embodiment of our collision detector can have a direct bandgap (E$_G$=1.84 eV) semiconductor with excellent photoresponsivity. We used a blue light emitting diode (LED) as an optical source to mimic realistic situations for collision avoidance to evaluate the embodiment of our collision detector. FIG. 3a-3j illustrate results from this evaluation. Faster ramp rates were found to evoke early rise in the photocurrent and vice versa. Higher magnitude of photocurrent for slower moving object is consistent with the fact that the source is active for longer period of time and hence the detector receives more incident photons. This demonstration confirms that the monolayer MoS$_2$ photodetector of the exemplary embodiment of the collision detector can be capable of responding to looming stimuli and the response can be excitatory in nature.

Figure 3A:
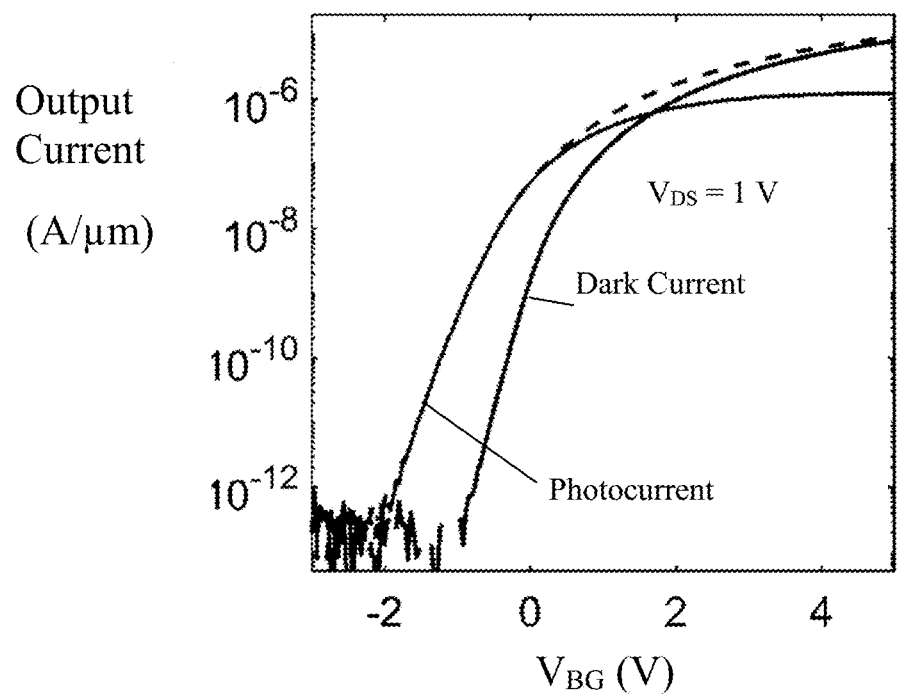
FIG. 3a is a graph illustrating the photoresponse of the monolayer MoS$_2$ FET for the embodiment of the collision detector shown in FIG. 1f and FIG. 2b under the illumination of the blue LED when it is glowing at its maximum intensity ($V_{LED}$=5 V) at approximately 1 cm away from the device.
Figure 7A:
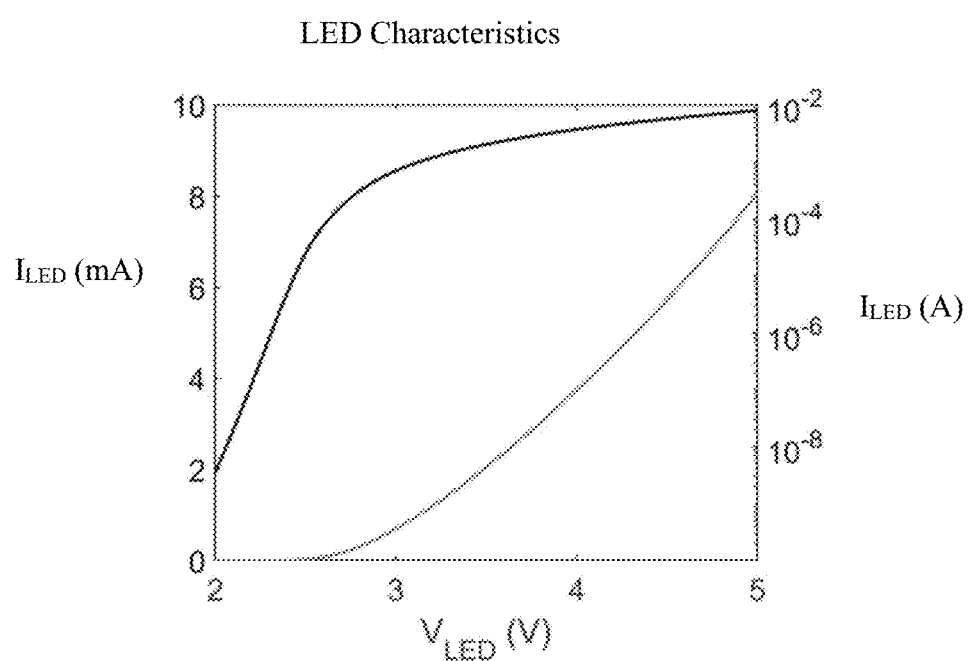
FIG. 7a is a graph illustrating current ($I_{LED}$) versus voltage ($V_{LED}$) characteristics of the blue LED used in our experiments as the visual stimuli, shown in the logarithmic and linear scale.
Figure 8A:
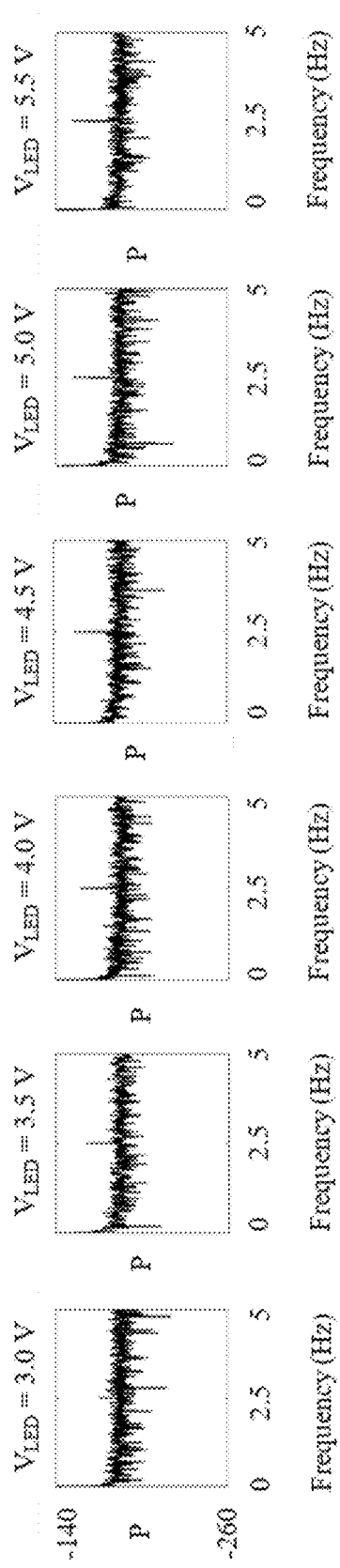
FIG. 8a is a series of graphs illustrating power spectral density (PSD) obtained using the fast Fourier transform (FFT) of the output current of the embodiment of the collision detector corresponding to 2.5 Hz periodic LED signals of different amplitudes ($V_{LED}$) at a back-gate voltage ($V_{BG}$) of 0 V. The peaks at 2.5 Hz confirms successful detection of the visual stimuli.
Figure 8B:
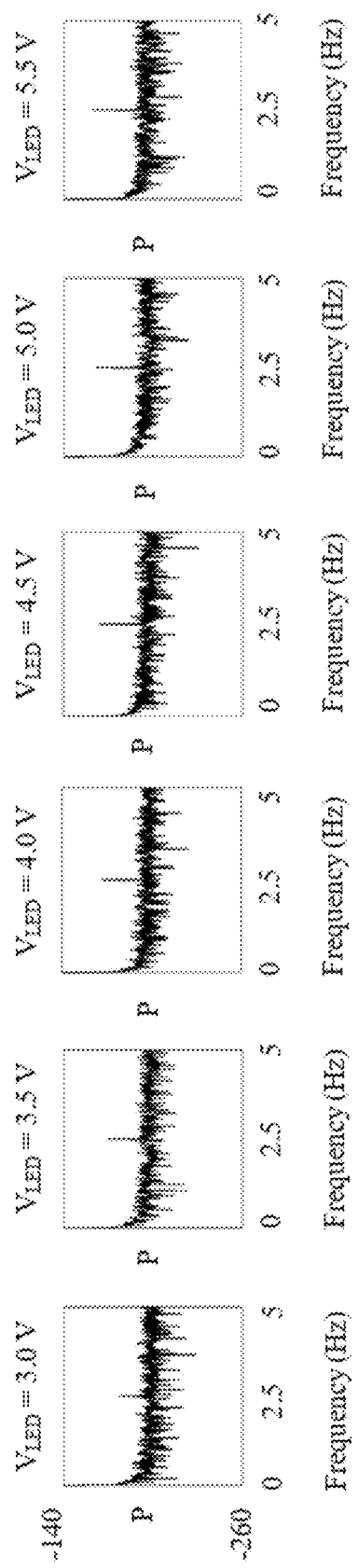
FIG. 8b is a series of graphs illustrating power spectral density (PSD) obtained using the fast Fourier transform (FFT) of the output current of the embodiment of the collision detector corresponding to 2.5 Hz periodic LED signals of different amplitudes ($V_{LED}$) at a back-gate voltage ($V_{BG}$) of −0.25 V. The peaks at 2.5 Hz confirms successful detection of the visual stimuli.
Figure 8C:
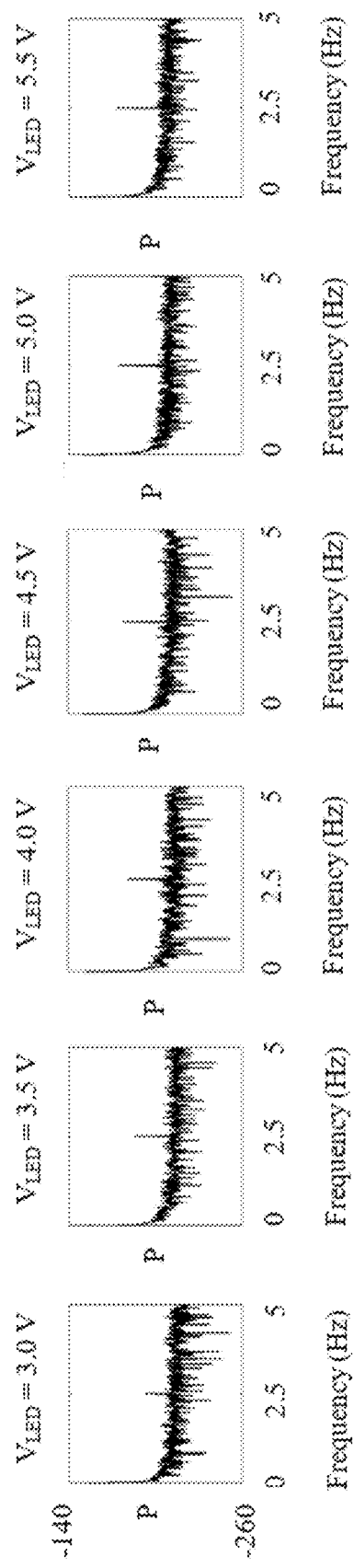
FIG. 8c is a series of graphs illustrating power spectral density (PSD) obtained using the fast Fourier transform (FFT) of the output current of the embodiment of the collision detector corresponding to 2.5 Hz periodic LED signals of different amplitudes ($V_{LED}$) at a back-gate voltage ($V_{BG}$) of −0.5 V. The peaks at 2.5 Hz confirms successful detection of the visual stimuli.
Figure 8D:
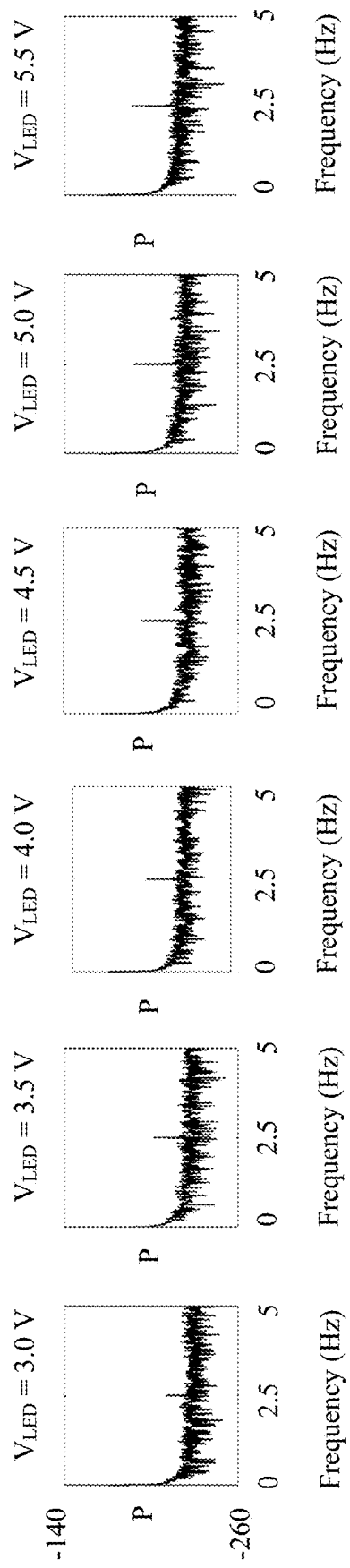
FIG. 8d is a series of graphs illustrating power spectral density (PSD) obtained using the fast Fourier transform (FFT) of the output current of the embodiment of the collision detector corresponding to 2.5 Hz periodic LED signals of different amplitudes ($V_{LED}$) at a back-gate voltage ($V_{BG}$) of −0.75 V. The peaks at 2.5 Hz confirms successful detection of the visual stimuli.
Figure 8E:
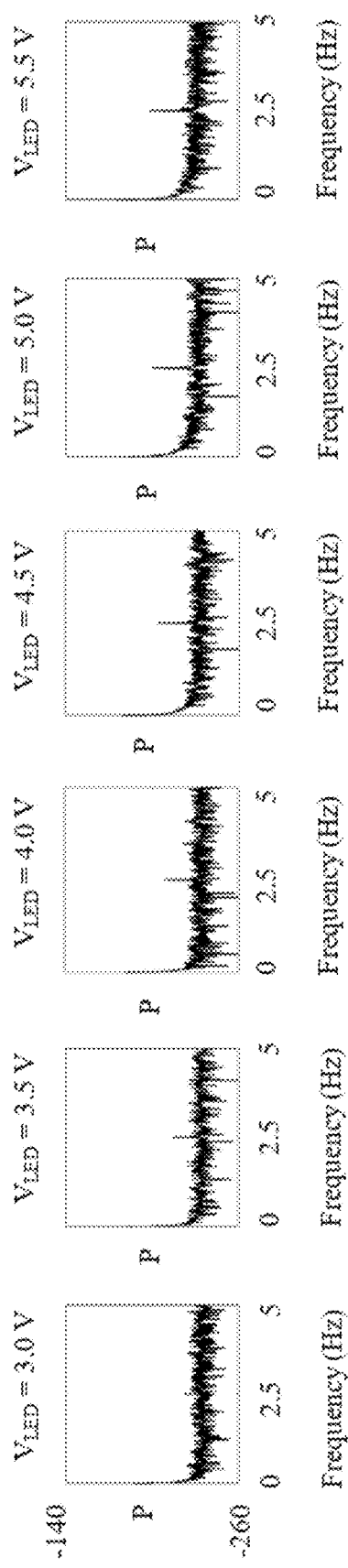
FIG. 8e is a series of graphs illustrating power spectral density (PSD) obtained using the fast Fourier transform (FFT) of the output current of the embodiment of the collision detector corresponding to 2.5 Hz periodic LED signals of different amplitudes ($V_{LED}$) at a back-gate voltage ($V_{BG}$) of −1 V. The peaks at 2.5 Hz confirms successful detection of the visual stimuli.

FIG. 3a shows the photoresponse of the monolayer MoS$_2$ FET under the illumination of the blue LED when it is glowing at its maximum intensity (V$_{LED}$=5 V) at 1 cm away from the device (see FIG. 7a for the current (I$_{LED}$) versus voltage (V$_{LED}$) characteristics of the blue LED used in the experimentation). In order to access the sensitivity of the collision detector to low intensity of light we measure the output current in response to 2.5 Hz periodic LED signals of different amplitudes.

Figure 3B:
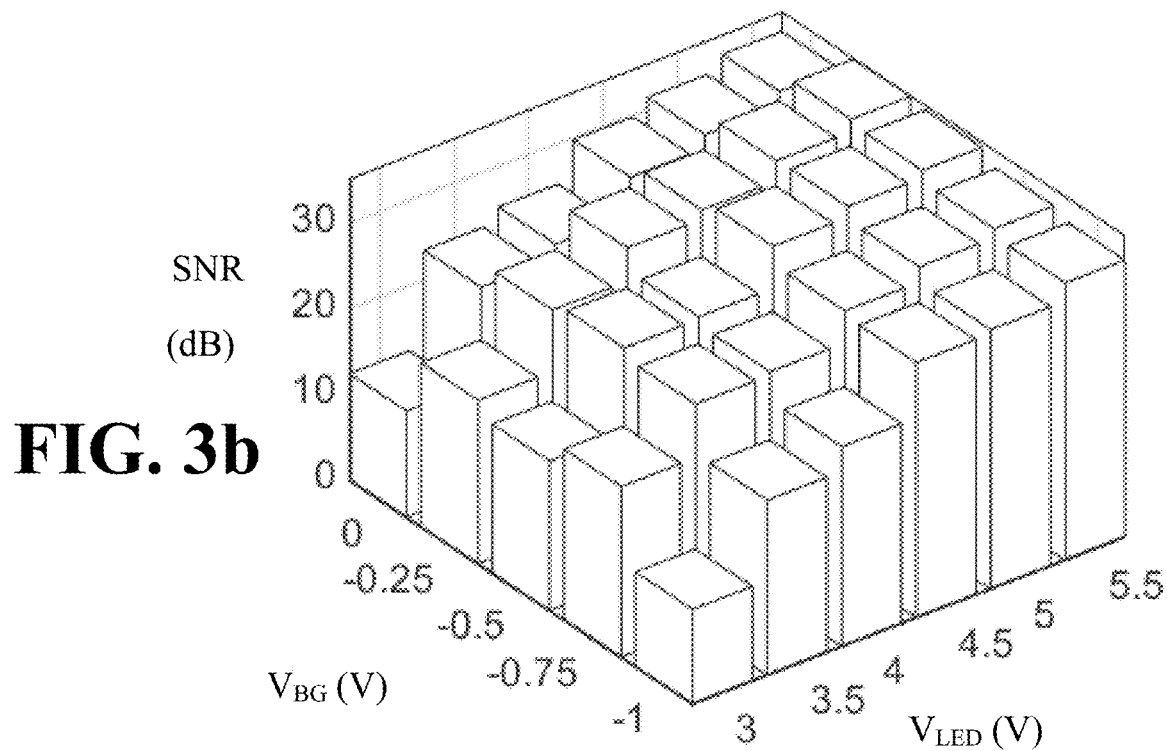
FIG. 3b is a graph illustrating results from when the MoS$_2$ photodetector of the embodiment of the collision detector of FIG. 3a was subjected to 2.5 Hz periodic LED signals of different amplitudes in order to investigate its sensitivity to low intensity light and the signal to noise ratio (SNR), which was extracted from the power spectral density (PSD) obtained using the fast Fourier transform (FFT) of the output current ($I_{DS}$) at different FET operating regimes. Current sampling was done at 10 Hz for ~51.2 s. SNR decreased monotonically with the decreasing LED signal intensity, whereas a non-monotonic trend is observed as a function of $V_{BG}$.

FIG. 3b shows the signal to noise ratio (SNR) extracted from the power spectral density (PSD) obtained using the fast Fourier transform (FFT) of the output current (I$_{DS}$) at different FET operating regimes (see FIGS. 8a-8e for the PSD of obtained using the fast Fourier transform (FFT) of the output current of the monolayer MoS$_2$ photodetector corresponding to 2.5 Hz periodic LED signals of different amplitudes (V$_{LED}$) at different back-gate voltages (V$_{BG}$). The peak at 2.5 Hz confirmed successful detection of the visual stimuli).

Current sampling was done at 10 Hz for ~51.2 s. The SNR was found to decrease monotonically with the decreasing LED signal intensity irrespective of the biasing regime. However, the SNR shows non-monotonic trend as a function of for any given LED intensity, which points towards secondary effects in the photoresponse and can be explained using the photogating effect.

Figure 9A:
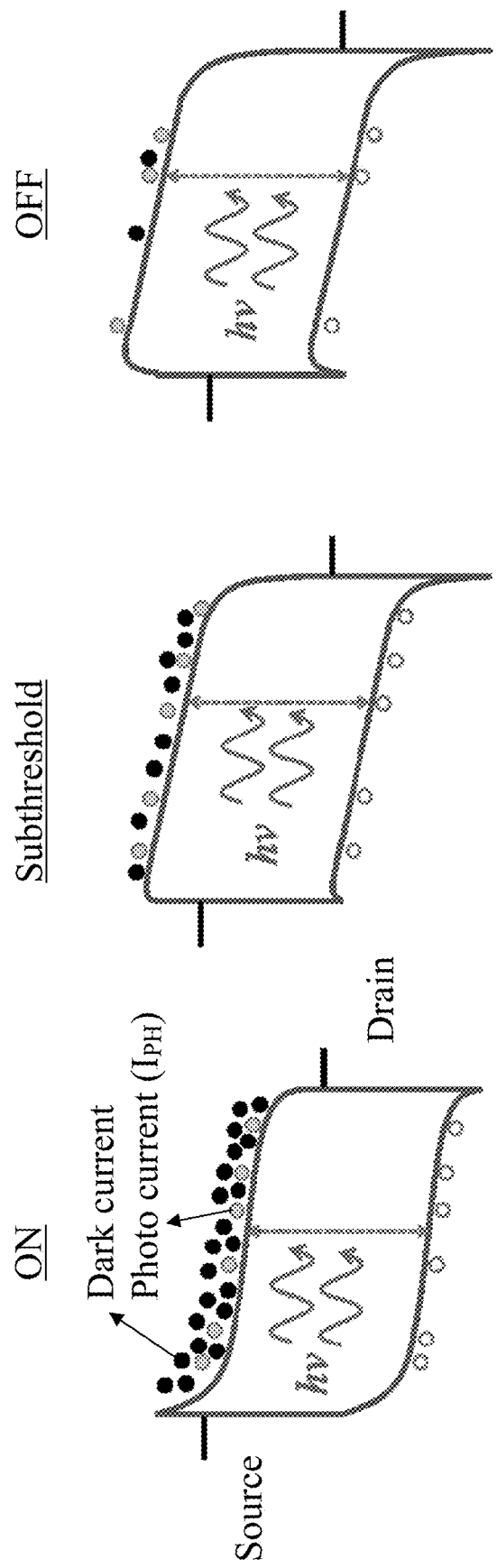
FIG. 9a is a series of energy band diagrams along the current transport direction showing the electron-hole pair generation in the ON-state, Subthreshold and the OFF-state operating regimes of the embodiment of the collision detector under the illumination of blue LED, along with the depiction of dark current(black) and photocurrent(blue).
Figure 9B:
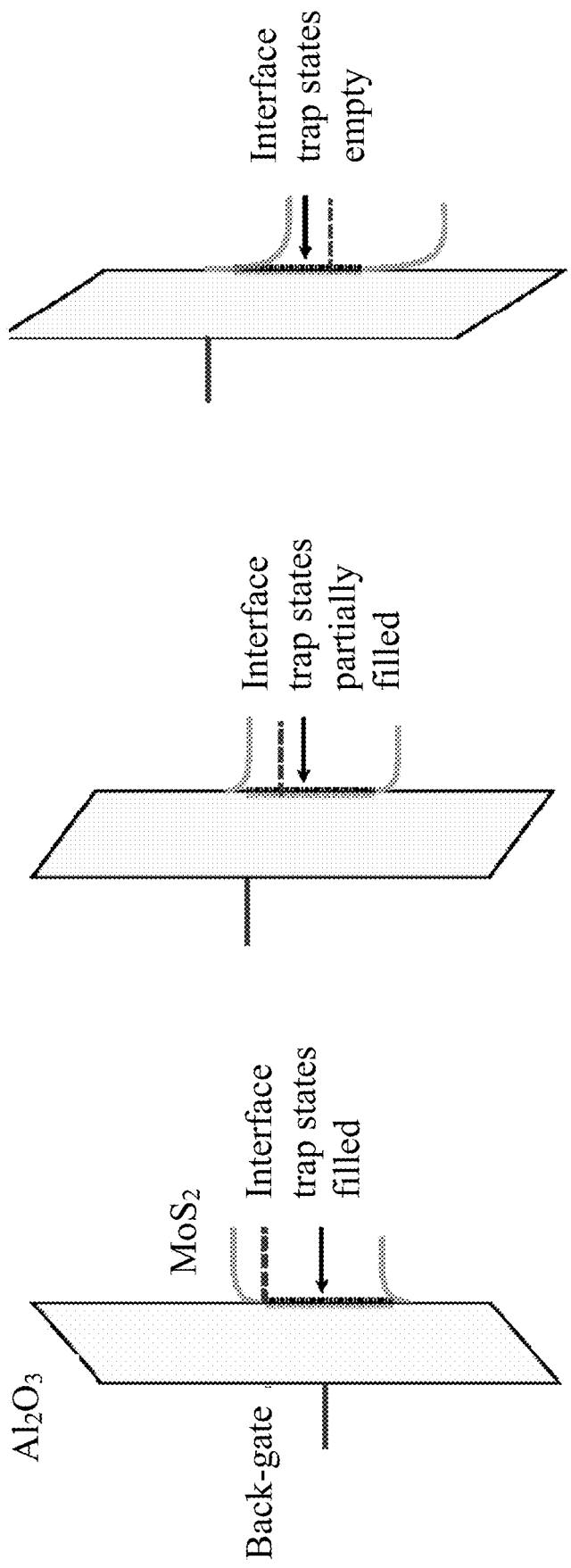
FIG. 9b is a series of energy band diagrams along the gate electrostatic direction showing filled interface trap states in the ON-state, partially filled interface trap states in the subthreshold and empty interface trap states in the OFF-state of the embodiment of the collision detector.
Figure 10A:
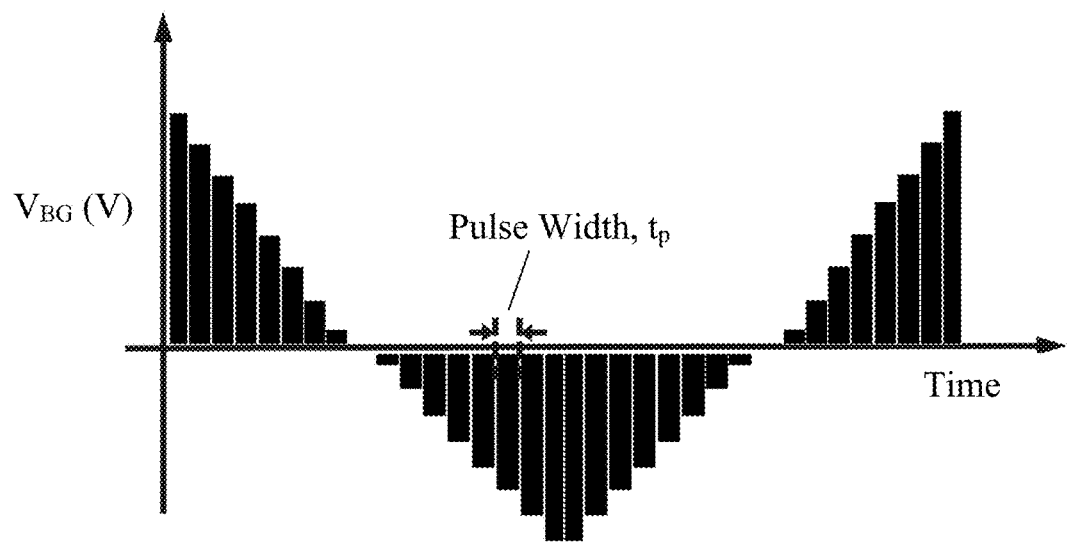
FIG. 10a is a graph illustrating change in the the back-gate voltage ($V_{BG}$) with time, during sweep rate dependent hysteresis measurements. $V_{BG}$ changes from positive to negative during the forward sweep and negative to positive during the reverse sweep.
Figure 10B:
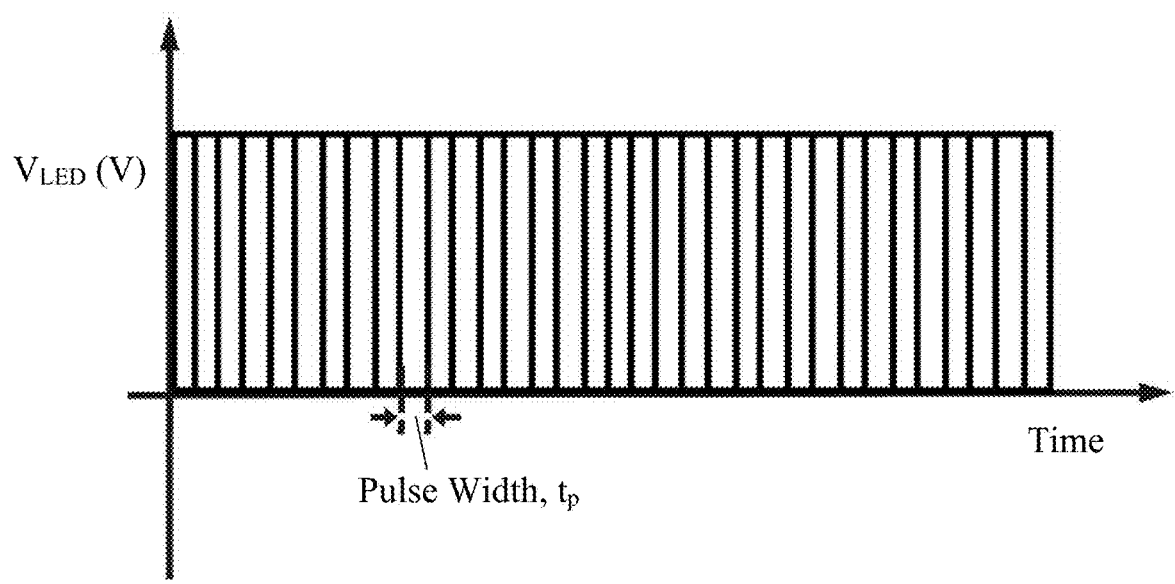
FIG. 10b is a graph illustrating the LED voltage ($V_{LED}$) with time, during the sweep rate dependent hysteresis measurements. The voltage supplied to the LED ($V_{LED}$) is constant with time. $V_{LED}$=5 V for hysteresis measurement under illumination.
Figure 10C:
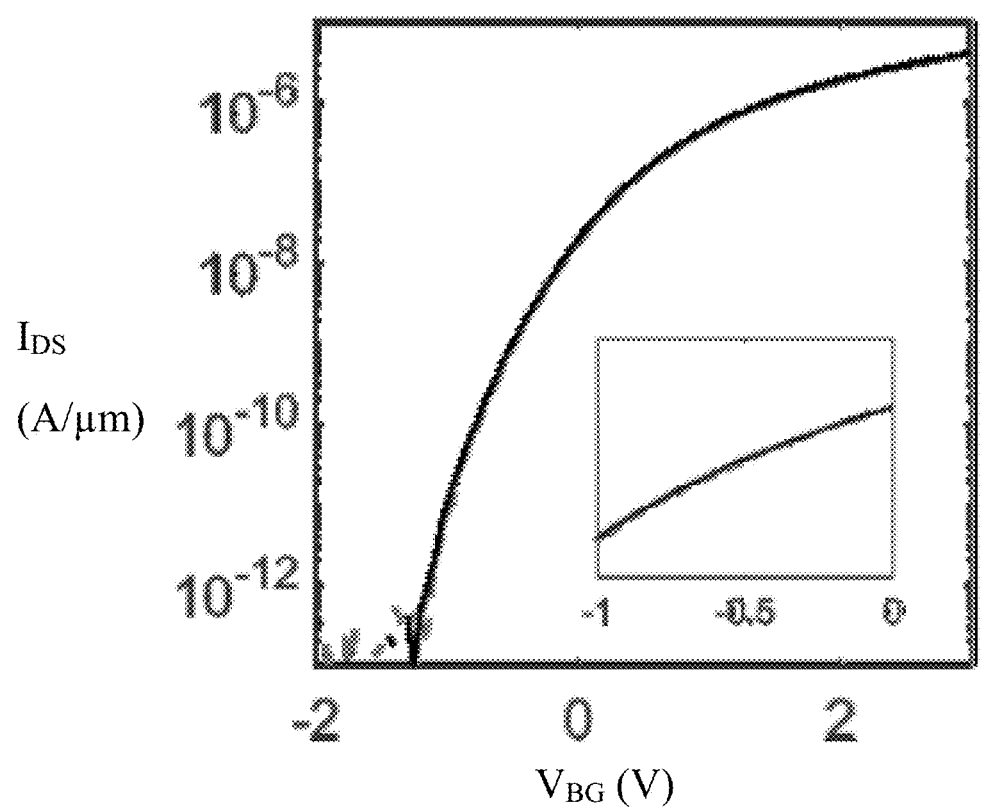
FIG. 10c is a graph illustrating the sweep rate dependent hysteresis measurements of $MoS_2$ FET in dark with a pulse width, $t_P$=10 ms.
Figure 10D:
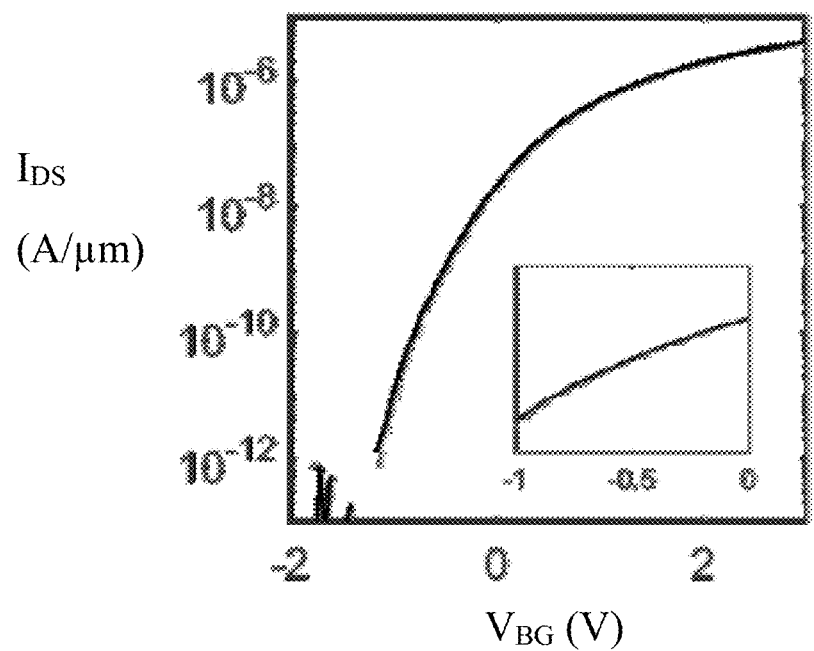
FIG. 10d is a graph illustrating the sweep rate dependent hysteresis measurements of $MoS_2$ FET in dark with pulse width, $t_P$=100 ms.
Figure 10E:
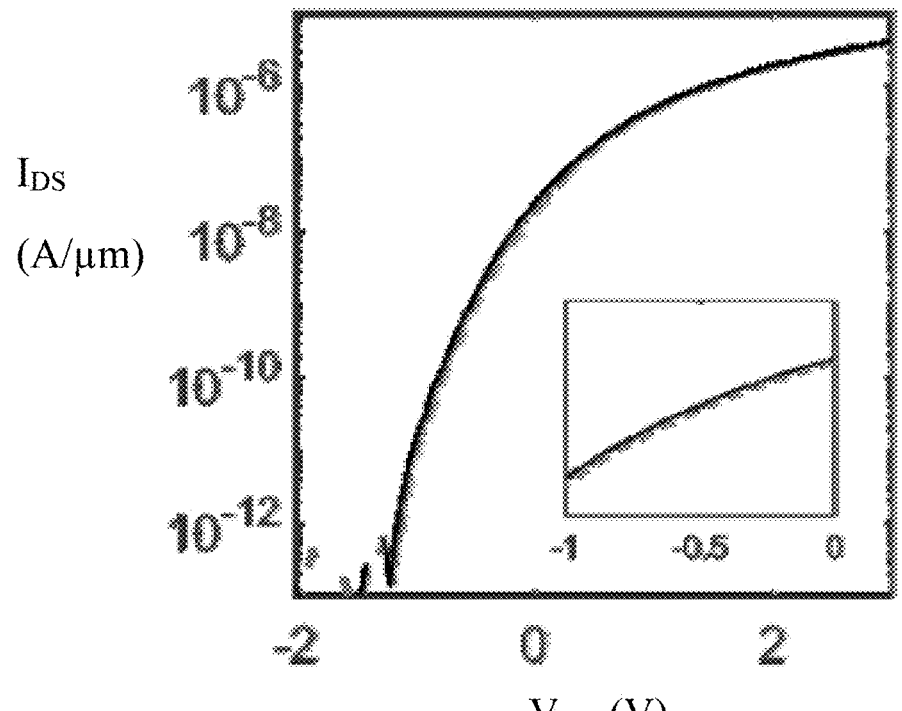
FIG. 10e is a graph illustrating the sweep rate dependent hysteresis measurements of $MoS_2$ FET in dark with and $t_P$=1000 ms.
Figure 10F:
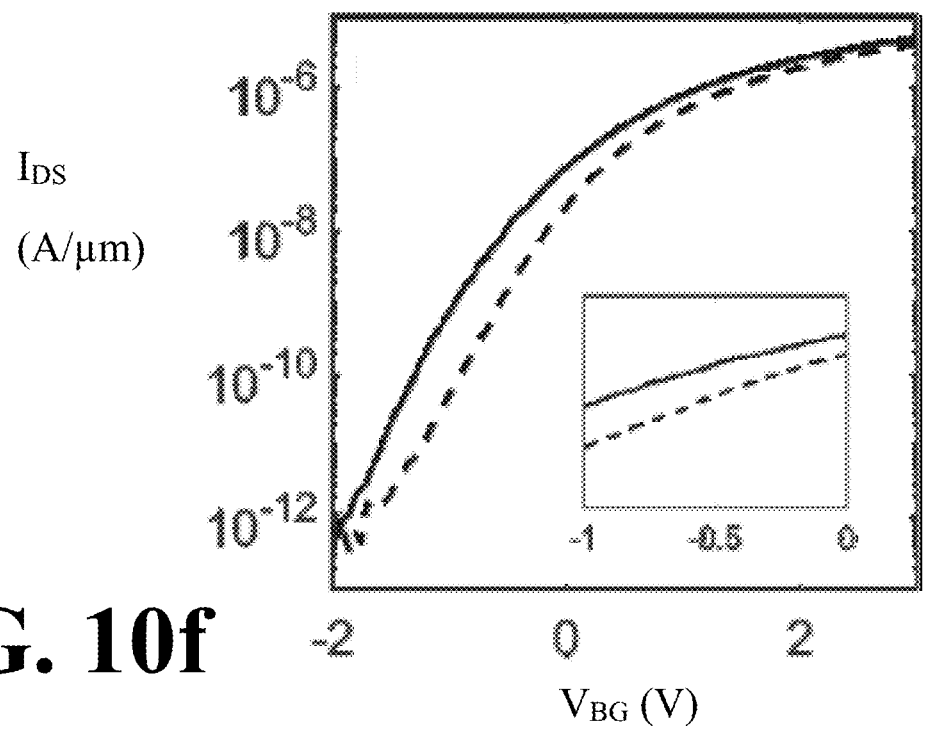
FIG. 10f is a graph illustrating the sweep rate dependent hysteresis measurements of $MoS_2$ FET under a constant illumination of $V_{LED}$=5V for a pulse width, $t_P$=10 ms.
Figure 10G:
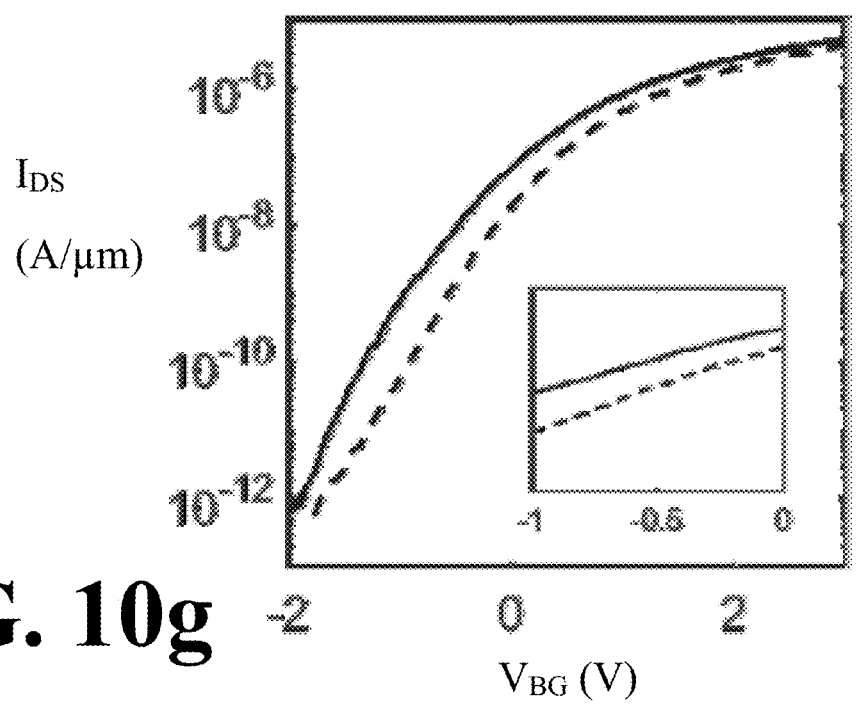
FIG. 10g is a graph illustrating the sweep rate dependent hysteresis measurements of $MoS_2$ FET under a constant illumination of $V_{LED}$=5V for a pulse width, $t_P$=100 ms.
Figures 10H, 10I:
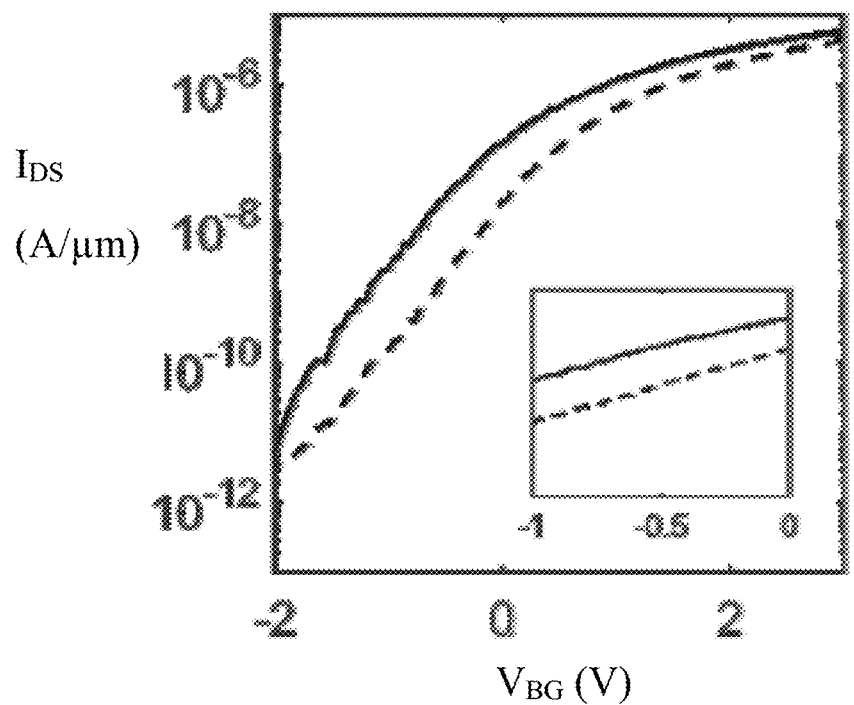
FIG. 10h is a graph illustrating the sweep rate dependent hysteresis measurements of $MoS_2$ FET under a constant illumination of $V_{LED}$=5V for a pulse width, $t_P$=1000 ms.
FIG. 10i is a table illustrating the hysteresis window ($\Delta V_{HW}$) for sweep rate dependent hysteresis measurements in dark and under illumination extracted using iso current method at $I_{DS}$=1 nA.

To elucidate the photogating effect for this embodiment of our collision detector, we made use of the energy band diagrams along the current transport and gate electrostatic directions in the MoS$_2$ FET in the ON-state, subthreshold and OFF state as shown in FIG. 9a and FIG. 9b. As may be appreciated from FIG. 9a and FIG. 9b, the photogating effect may be explained using the energy band diagrams along the current transport (FIG. 9a) and gate electrostatic (FIG. 9b) directions in the MoS$_2$ FET in the ON-state, subthreshold and OFF state.

Under the illumination of the blue LED (450-500 nm), electron-hole pairs are generated in the MoS$_2$ channel since the incident photon energy exceeds~1.84 eV, the bandgap of monolayer MoS$_2$. These photoexcited carriers drift towards the respective metal electrodes under the applied source to drain bias (V$_{DS}$=1 V) constituting the photocurrent that adds to the FET dark current (FIG. 9a—left diagram). In the ON state, the photocurrent is mostly independent of V$_{BG}$ (FIG. 3a) and is also obscured by the device dark current even for the brightest LED signal. As such the SNR is significantly low and the LED signals are undetectable in the ON-state. By operating the device in the subthreshold, the dark current can be reduced exponentially by increasing the barrier for electron injection from the source contact (upper panel—middle diagram). This improves the SNR. However, in deep-subthreshold or OFF-state carrier trapping at the interface between Al$_2$O$_3$ and MoS$_2$ reduces the photocurrent significantly which makes the SNR low again (FIG. 9a—right diagram).

The origin of interface trap states can be attributed to the dangling Al—O bonds at the surface. Since the photocarriers trapped in these interface states follow Fermi-Dirac distribution with the Fermi level being determined by the equilibrium Fermi level of the MoS$_2$ channel, less carrier trapping can occur in the ON-state (FIG. 9b—left diagram) and more carrier trapping can occur in the subthreshold (FIG. 9b—middle diagram) and OFF-state (FIG. 9b—right diagram). This can explain why the photocurrent keeps decreasing for negative back-gate voltages in FIG. 3a.

Furthermore, FIG. 10a-i shows the sweep rate dependent hysteresis measurements of this embodiment of the MoS$_2$ FET of our collision detector in dark and under illumination. The increase in hysteresis window under illumination and with increasing sweep rate provide further evidence that photogating effect plays a dominant role in the photoresponse of MoS$_2$ FET. Nonetheless, FIG. 3b suggests that by optimizing the device biasing condition it is possible to make the MoS$_2$ FET most sensitive to the optical stimuli.

Figure 3C:
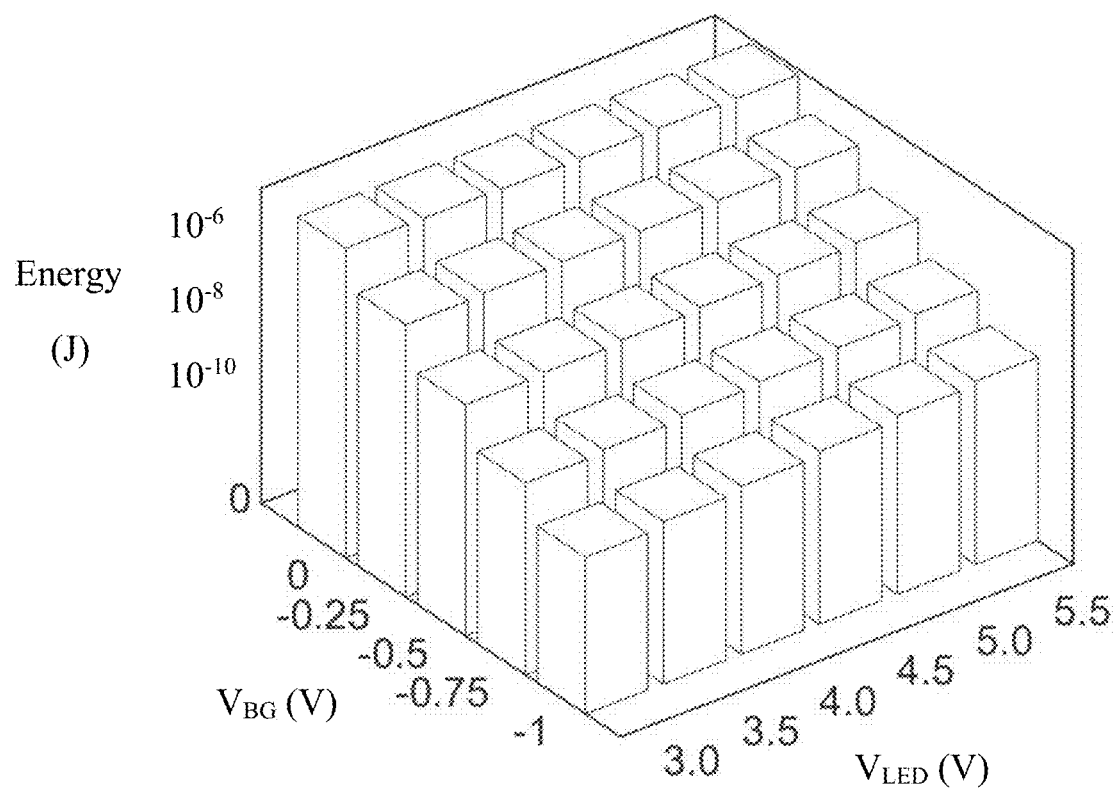
FIG. 3c is a graph similar to FIG. 3b illustrating the corresponding energy consumption by the MoS$_2$ photodetector of the embodiment of our collision detector. As shown in this graph, the energy consumption by the collision detector can be made exponentially smaller in the subthreshold regime, where signal detection is also optimum. This can offer an immense design benefit for collision avoidance hardware based on the monolayer MoS$_2$ photodetector of this embodiment of our collision detector.

FIG. 3c shows the energy consumption by the embodiment of our collision detector corresponding to the SNR in FIG. 3b. The fact that the energy consumption by the device can be made exponentially smaller in the subthreshold regime, where signal detection is also optimum, can offer immense design benefits for collision avoidance hardware based on monolayer MoS$_2$ photodetector.

Since embodiments of our collision detector can exploit the photoresponse of MoS$_2$, the device can be configured to only operate in the presence of a light source. This light source could either be the light directly coming from the object on collision course, or the detector could have an integrated light source of its own and makes use of the light reflected by the object on collision course. We show that in either case the visual stimuli perceived by an embodiment of our collision detector can be identical.

Figure 3D:
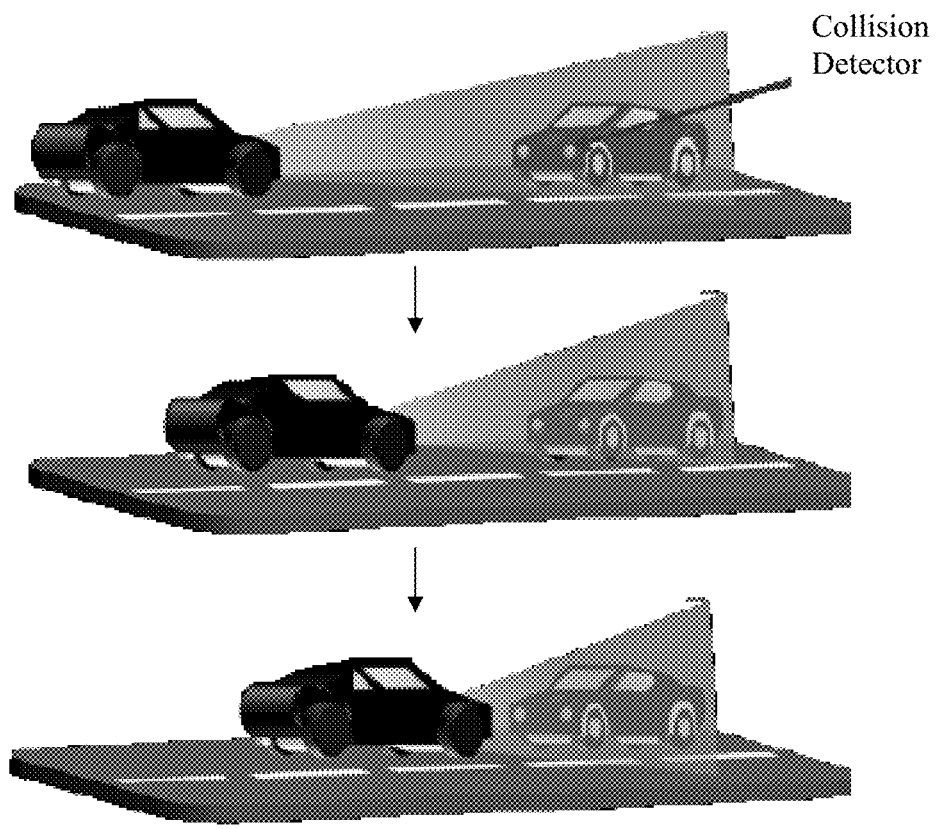
FIG. 3d is a schematic view of two cars on direct collision course.

FIG. 3d shows one scenario, where two cars are on direct collision course. The light intensity shows a monotonic increase as the car approaches the detector. In biophysical experiments this is referred to as the looming stimulus.

Figure 3E:
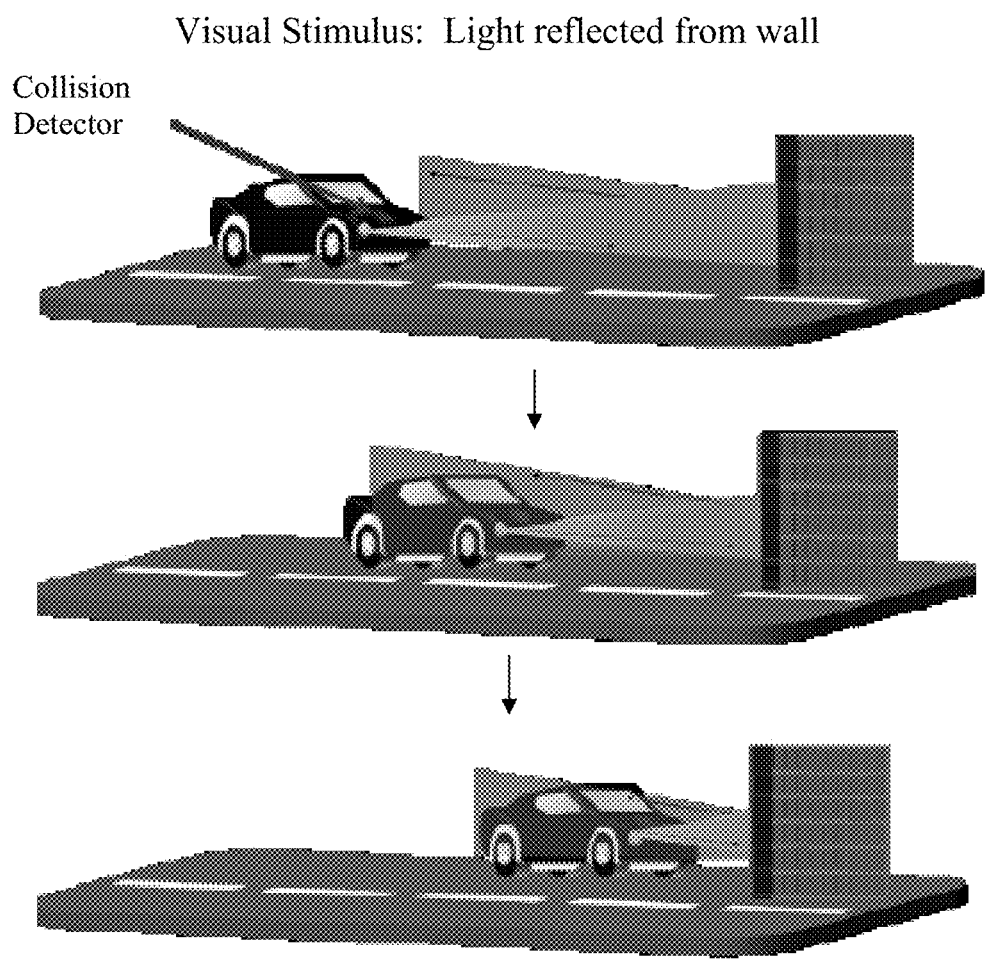
FIG. 3e is a schematic view of one car on a collision course with a wall. In this environment, a passive light source can be used so that an embodiment of a collision detector can exploit the light reflected from the object on collision course.

FIG. 3e shows another scenario, where a car is on collision course with a wall. In this case, the collision detector can rely on a passive light source. In this case, a passive source of light can be placed beside the collision detector and the light reflected back to the detector by the approaching wall can be utilized by the detector. Note that both the stimuli of FIG. 3d and FIG. 3e can be perceived in an identical manner by the collision detector.

Figure 3F:
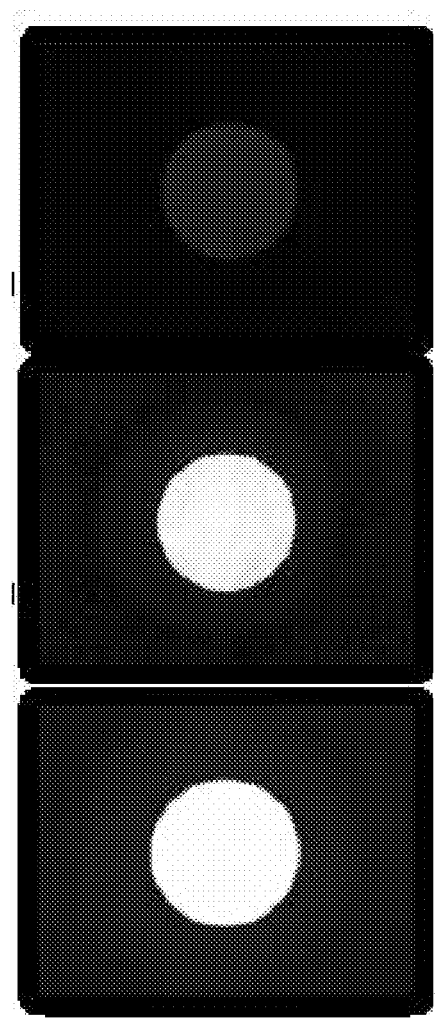
FIG. 3f illustrates snapshots of visual experience perceived by the embodiment of the collision detector in the situations of FIG. 3d and FIG. 3e.
Figure 3G:
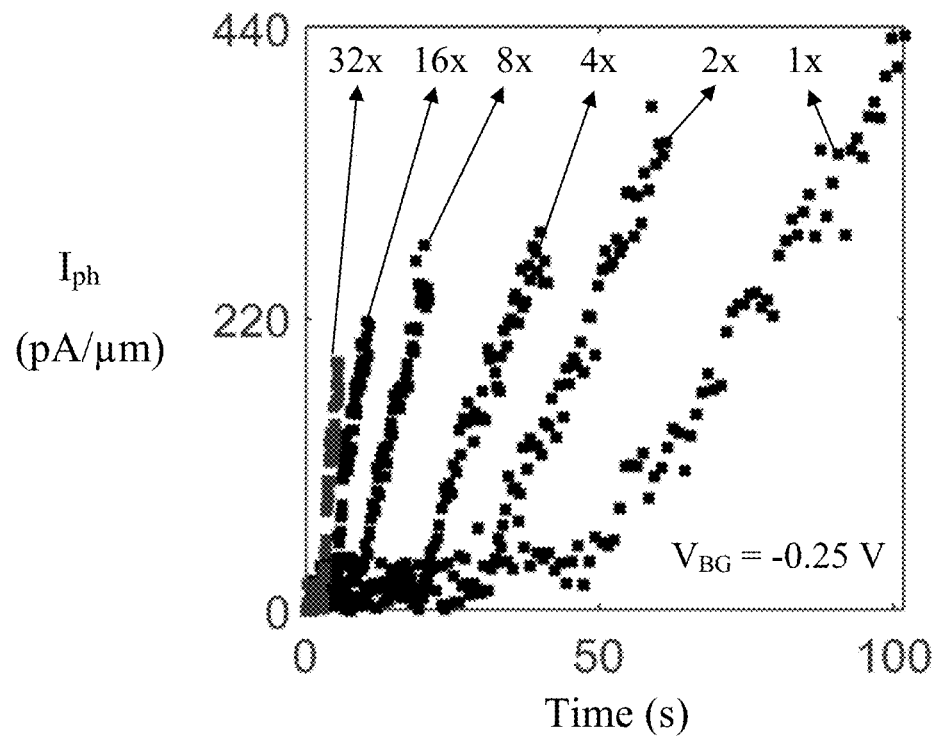
FIG. 3g is a graph illustrating the photocurrent response in the MoS$_2$ FET of the embodiment of the collision detector of FIG. 1f and FIG. 2b at a constant back-gate biasing of −0.25 V for different LED ramp rates that mimic looming stimulus of different speed.
Figure 3H:
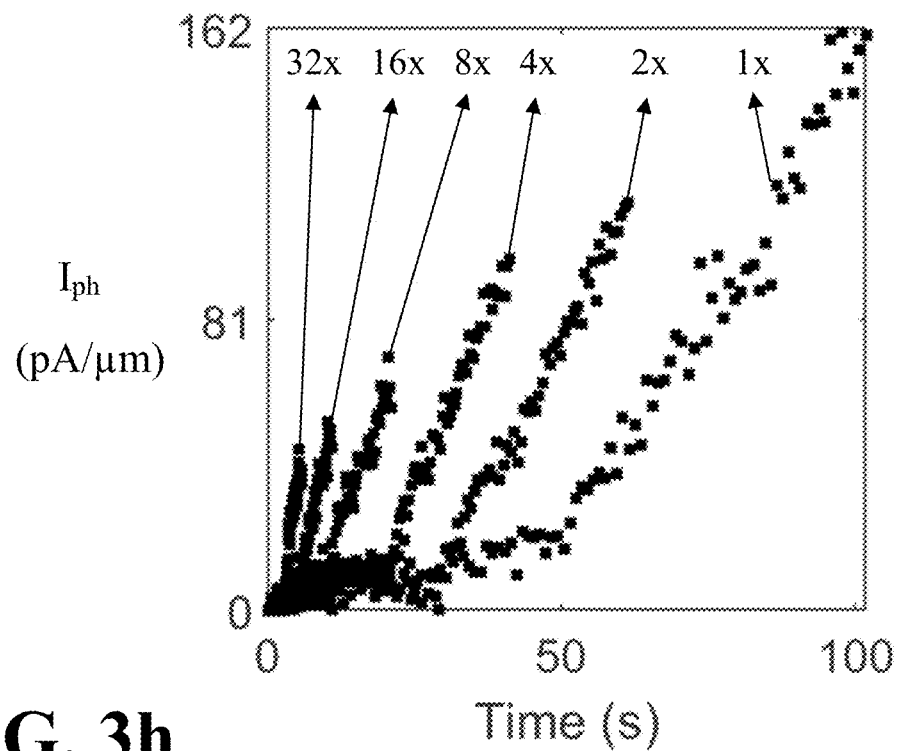
FIG. 3h is a graph illustrating the photocurrent response in the MoS$_2$ FET of the embodiment of the collision detector of FIG. 1f and FIG. 2b at a constant back-gate biasing of −0.50 V for different LED ramp rates that mimic looming stimulus of different speed.
Figure 3I:
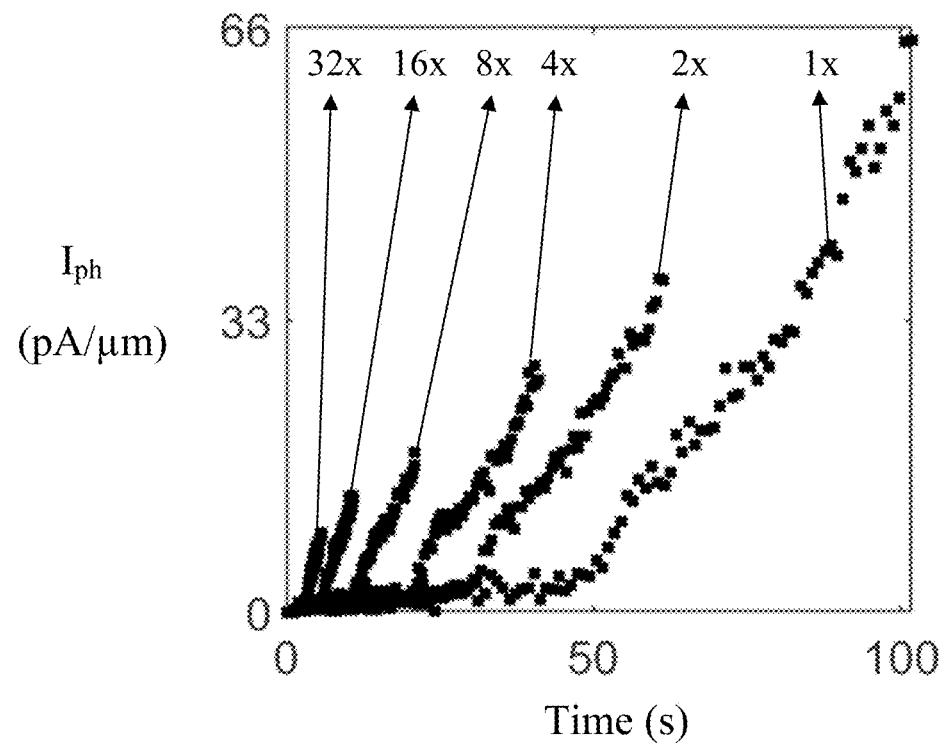
FIG. 3i is a graph illustrating the photocurrent response in the MoS$_2$ FET of the embodiment of the collision detector of FIG. 1f and FIG. 2b at a constant back-gate biasing of −0.75 V for different LED ramp rates that mimic looming stimulus of different speed.
Figure 3J:
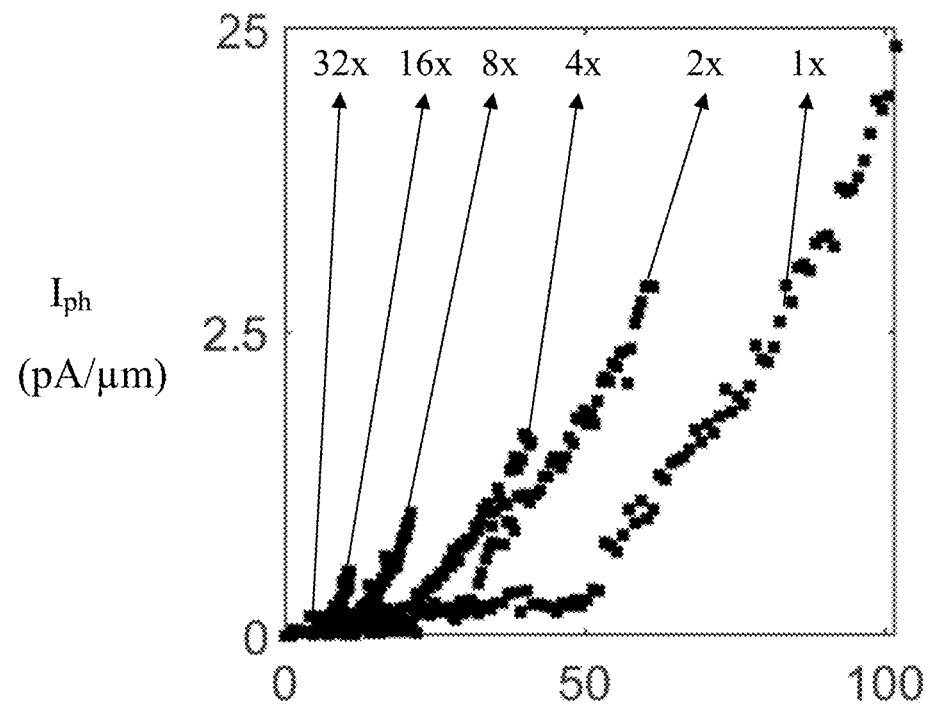
FIG. 3j is a graph illustrating the photocurrent response in the MoS$_2$ FET of the embodiment of the collision detector of FIG. 1f and FIG. 2b at a constant back-gate biasing of −1 V for different LED ramp rates that mimic looming stimulus of different speed.
Figure 11A:
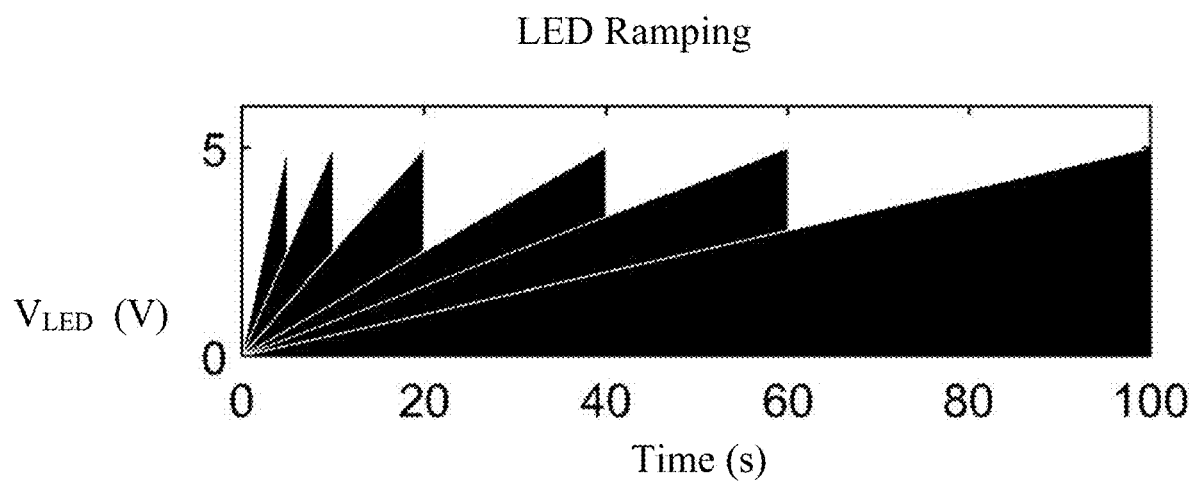
FIG. 11a is a graph illustrating LED voltage that is ramped from 0 V to 5 V for different time intervals determining the rate of intensity increase in each case. This can stimulate different speeds at which the object is approaching.

FIG. 3f shows snapshots of the looming visual stimulus at different instances. We also found that the visual excitation due to a static light source of changing intensity can mimic these two previous cases. These results suggest that a looming object can be stimulated by ramping the intensity of a light source and the ramp rate can be used to capture different approaching speeds (see also FIG. 11a for a graph of LED voltage that was ramped from 0 V to 5 V for different time intervals for determining the rate of intensity increase in each case. This can stimulate different speeds at which the object is approaching). Note that the impending collision is detected as happening when the LED reaches its peak intensity i.e. when $V_{LED}$=5 V.

Figure 12A:
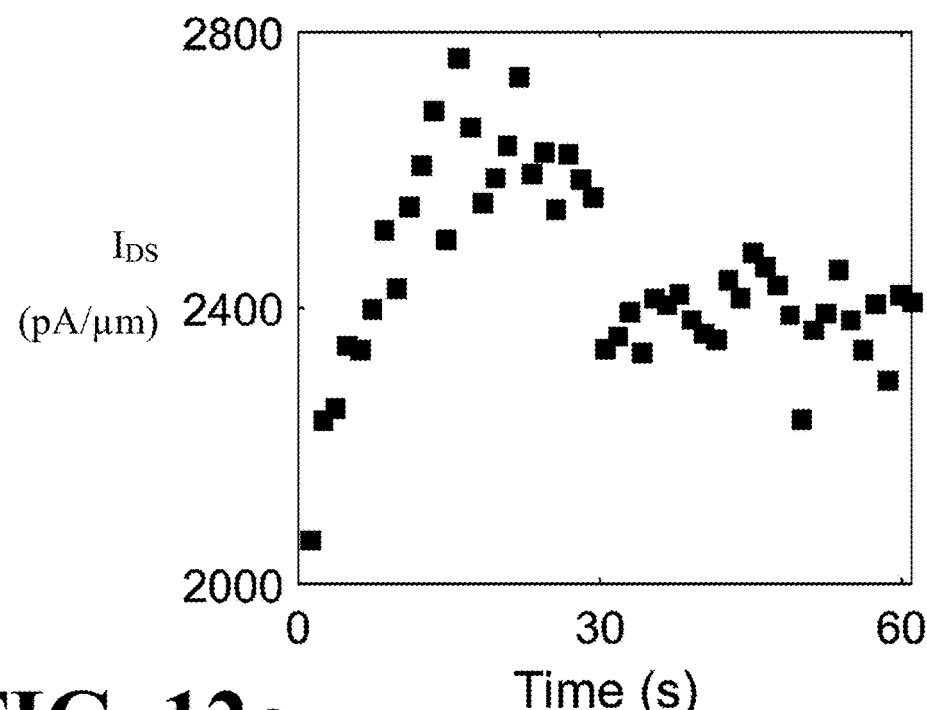
FIG. 12a is a graph illustrating a response to a receding object stimulated by decreasing the LED intensity from 5 V to 0 V.

FIG. 3g-j show the photocurrent response in the MoS$_2$ FET of the collision detector at different constant back-gate biasing for different LED ramp rates. As shown in these graphs, faster ramp rates evoke early rise in the photocurrent and vice versa. Higher magnitude of photocurrent for slower moving object is consistent with the fact that the source is active for longer period of time and hence the detector receives more incident photons. This demonstration confirmed to us that the monolayer MoS$_2$ photodetector of an embodiment of our collision detector can be capable of responding to looming stimuli and the response is excitatory in nature. We also found that the response characteristics to be markedly different for receding sources which can be a critical design feature for some embodiments of a collision detection system, which can be configured to facilitate collision avoidance. For example, as shown in FIG. 12a, the collision detector's response to a receding object was stimulated by decreasing the LED intensity from 5 V to 0 V.

Figure 4A:
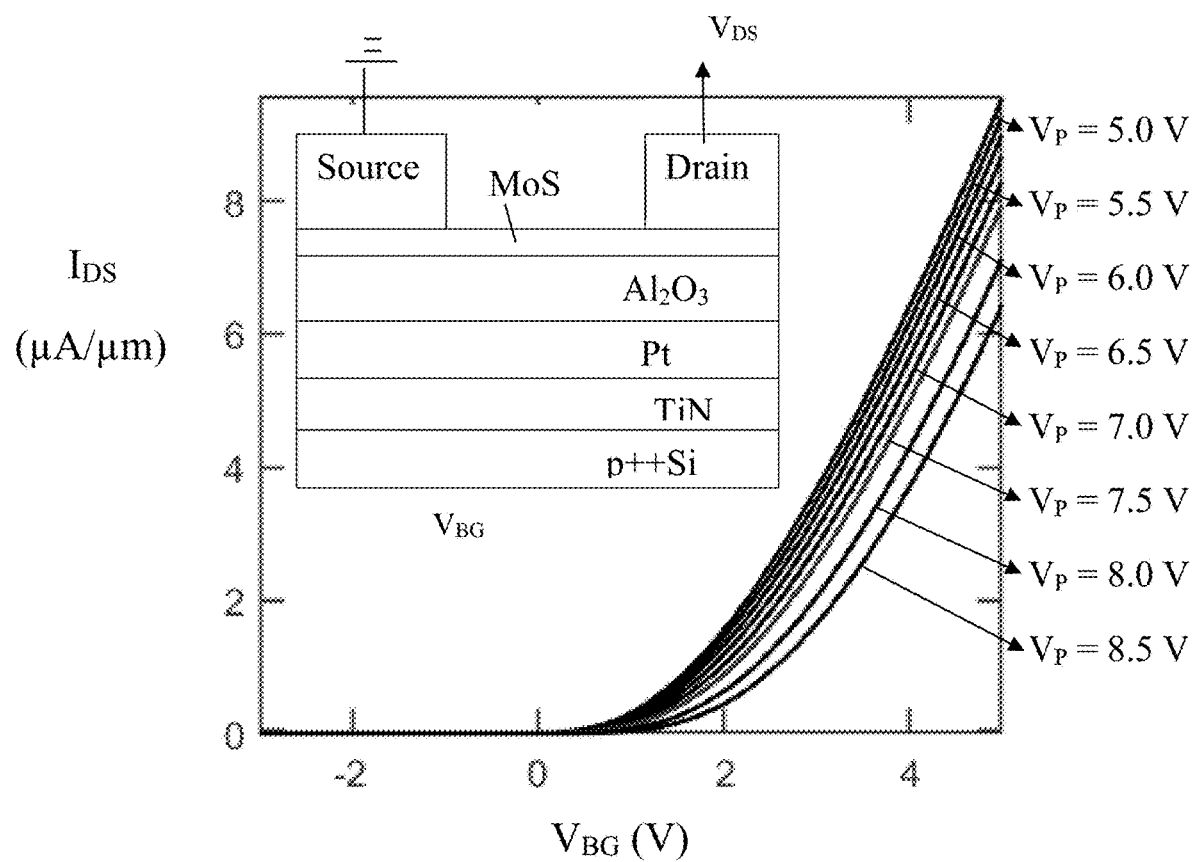
FIG. 4a is a graph illustrating transfer characteristics of the MoS$_2$ FET of the exemplary embodiment of the collision detector of FIG. 1f and FIG. 2b in a linear scale after the application of "Write" programming pulses of different amplitudes ($V_P$) to the back-gate electrode, each for a total duration of 10 s. The threshold voltage ($V_{TH}$) becomes more positive as the magnitude of $V_P$ is increased.
Figure 4B:
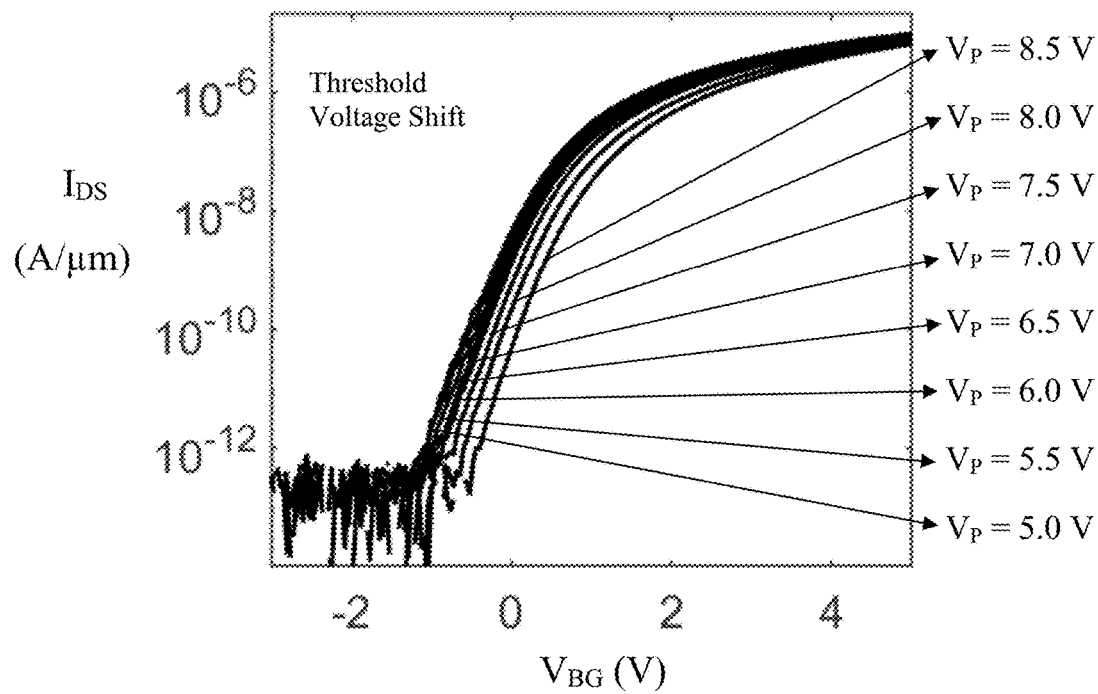
FIG. 4b is a graph illustrating transfer characteristics of the MoS$_2$ FET of the exemplary embodiment of the collision detector of FIG. 1f and FIG. 2b in a logarithmic scale after the application of "Write" programming pulses of different amplitudes ($V_P$) to the back-gate electrode, each for a total duration of 10 s. The threshold voltage ($V_{TH}$) becomes more positive as the magnitude of $V_P$ is increased.
Figure 4C:
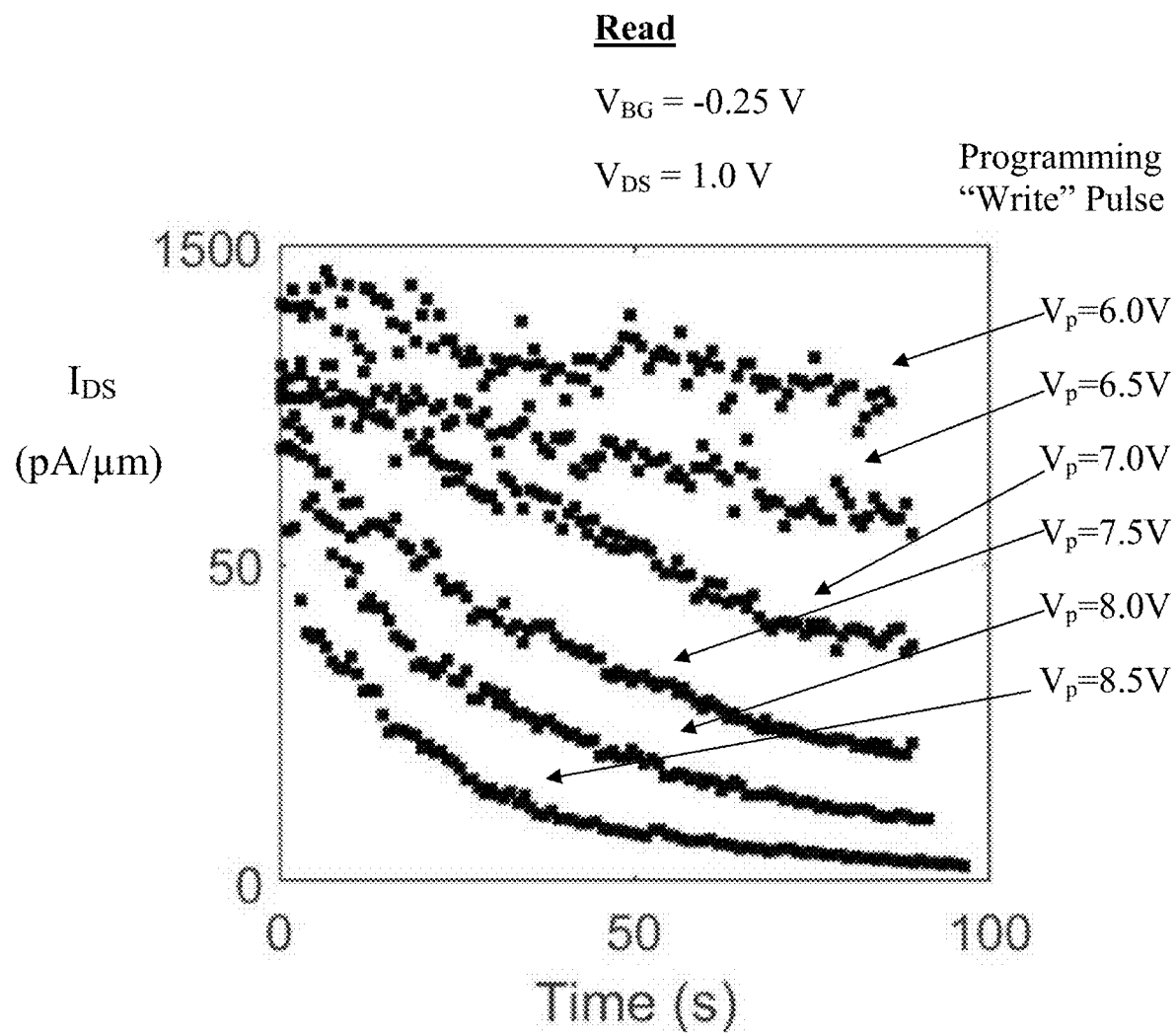
FIG. 4c is a graph illustrating the output current measured under a "Read" condition in response to Write" programming pulse trains of different amplitudes ($V_P$). Each programming pulse train consisted of individual pulses of constant amplitude ($V_P$) and constant width (100 ms), separated by constant "Read" window of 100 ms. During "Write" and "Read" operations, the source to drain voltage was set to $V_{DS}$=1 V. The $V_{BG}$ values chosen for "Read" operation for the results of FIG. 4 were −0.25 V.
Figure 4D:
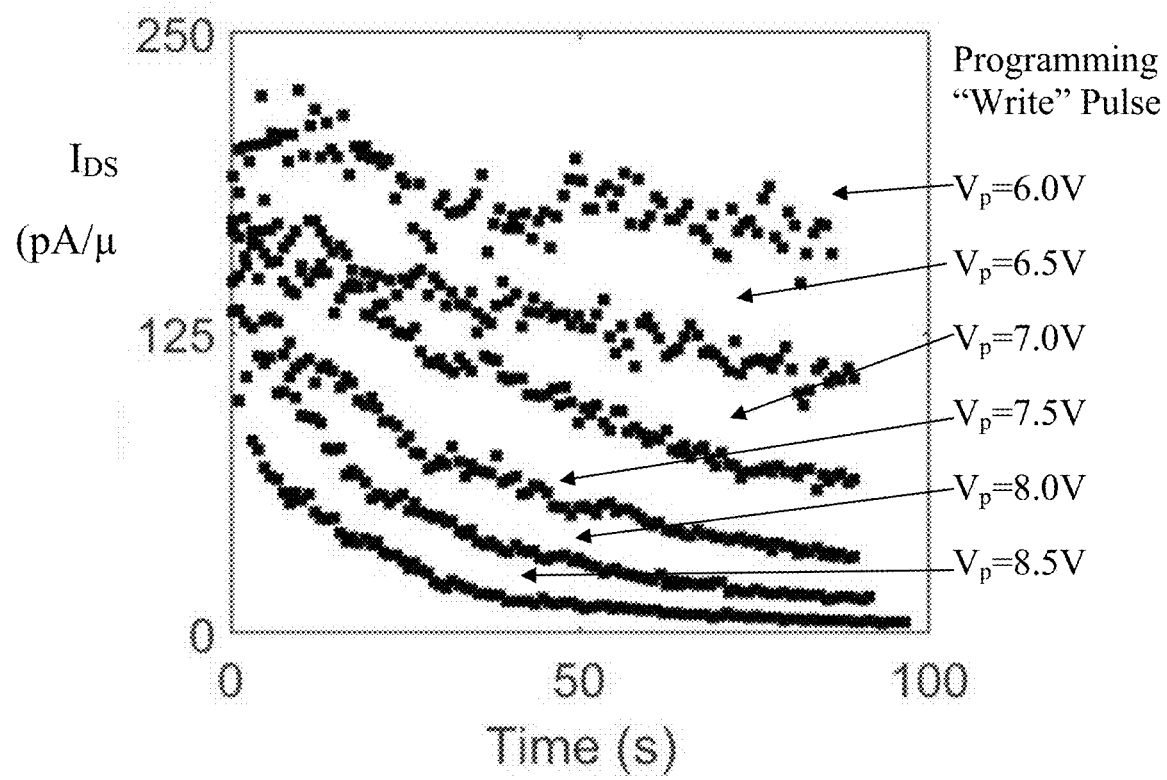
FIG. 4d is a graph illustrating results similar to FIG. 4c where the $V_{BG}$ values chosen for "Read" operation were −0.50 V.
Figure 4E:
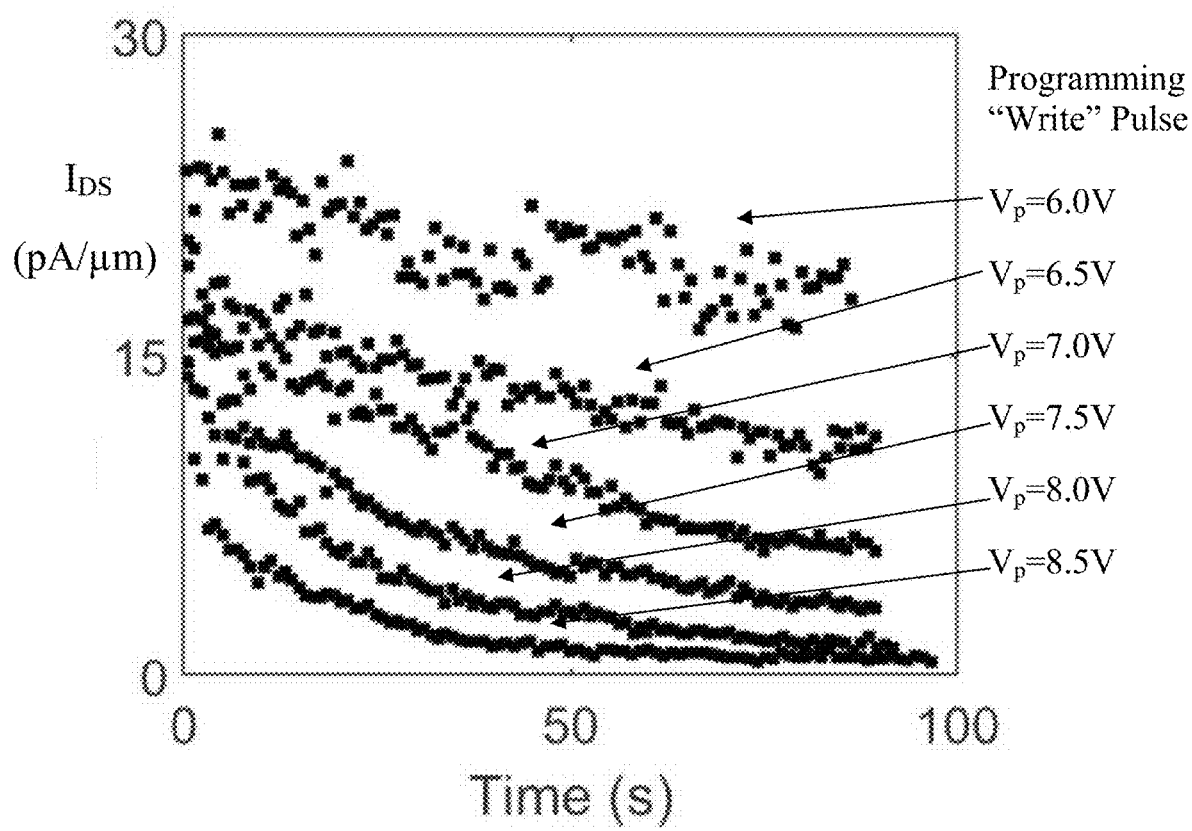
FIG. 4e is a graph illustrating results similar to FIG. 4c where the $V_{BG}$ values chosen for "Read" operation were −0.75 V.
Figure 4F:
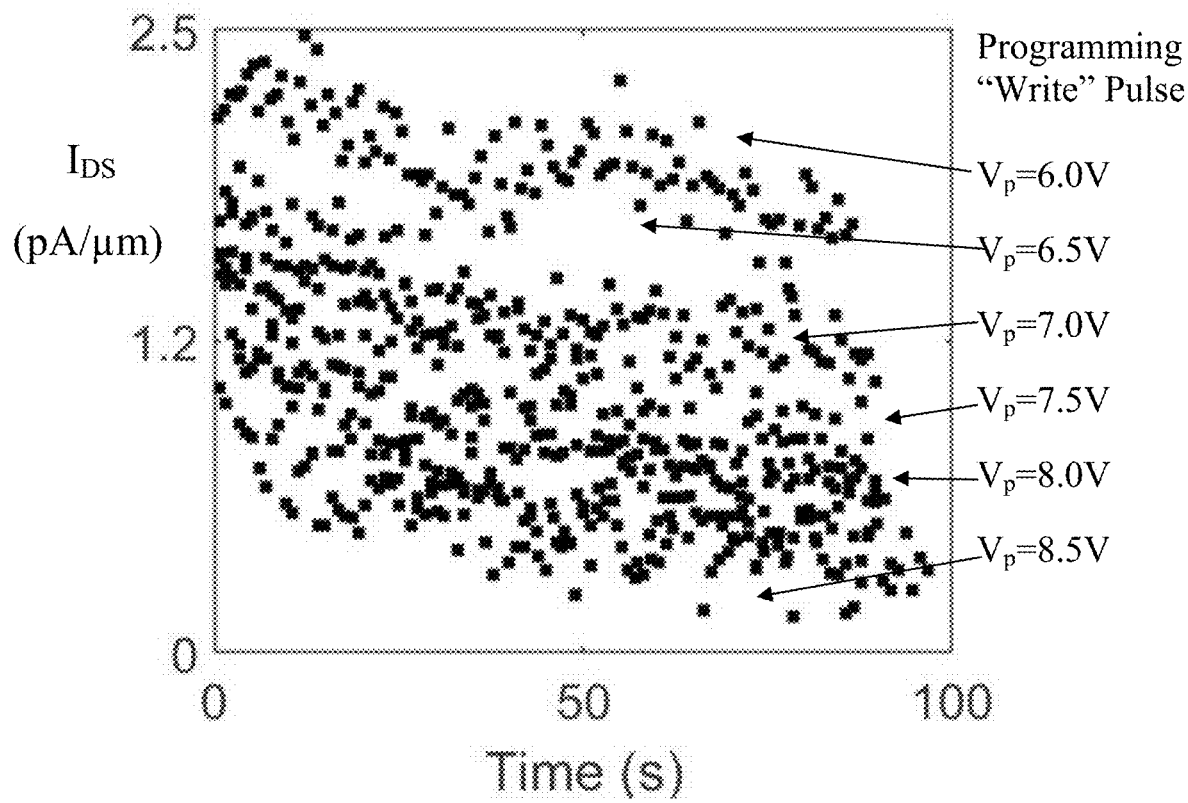
FIG. 4f is a graph illustrating results similar to FIG. 4c where the $V_{BG}$ values chosen for "Read" operation were −1 V.
Figure 13A:
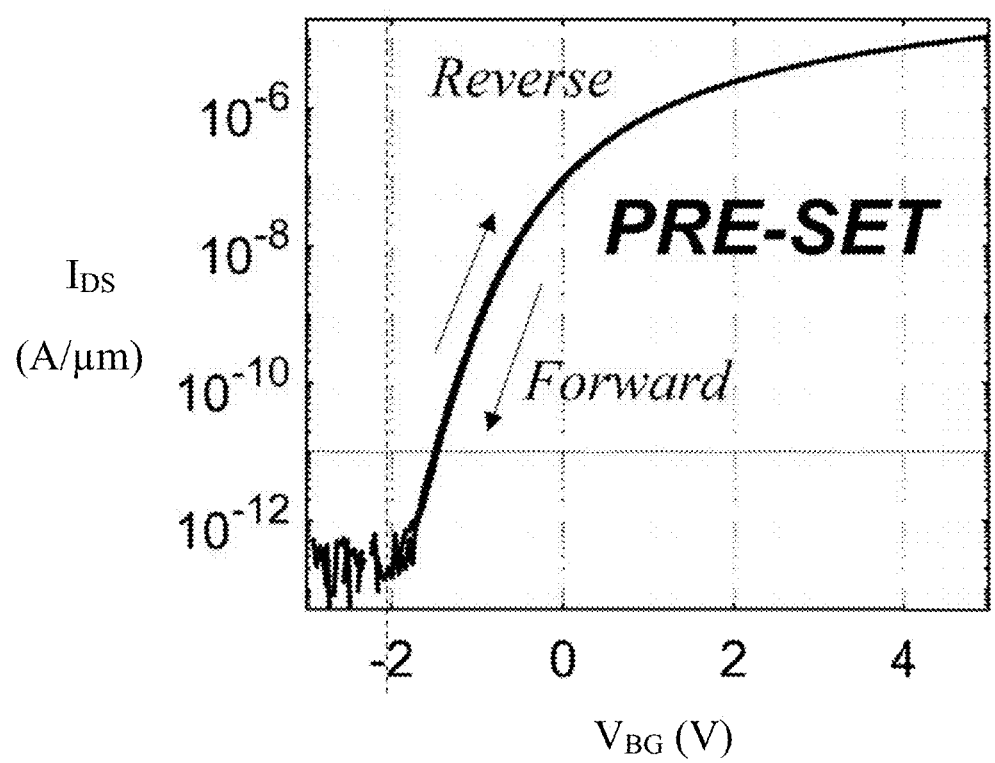
FIG. 13a is a graph illustrating transfer characteristics of monolayer $MoS_2$ FET of the embodiment of the collision detector measured at $V_{DS}$=1 V before programming (PRESET). The threshold voltage of the device was found to be at $V_{TH}$=1 V.
Figure 13B:
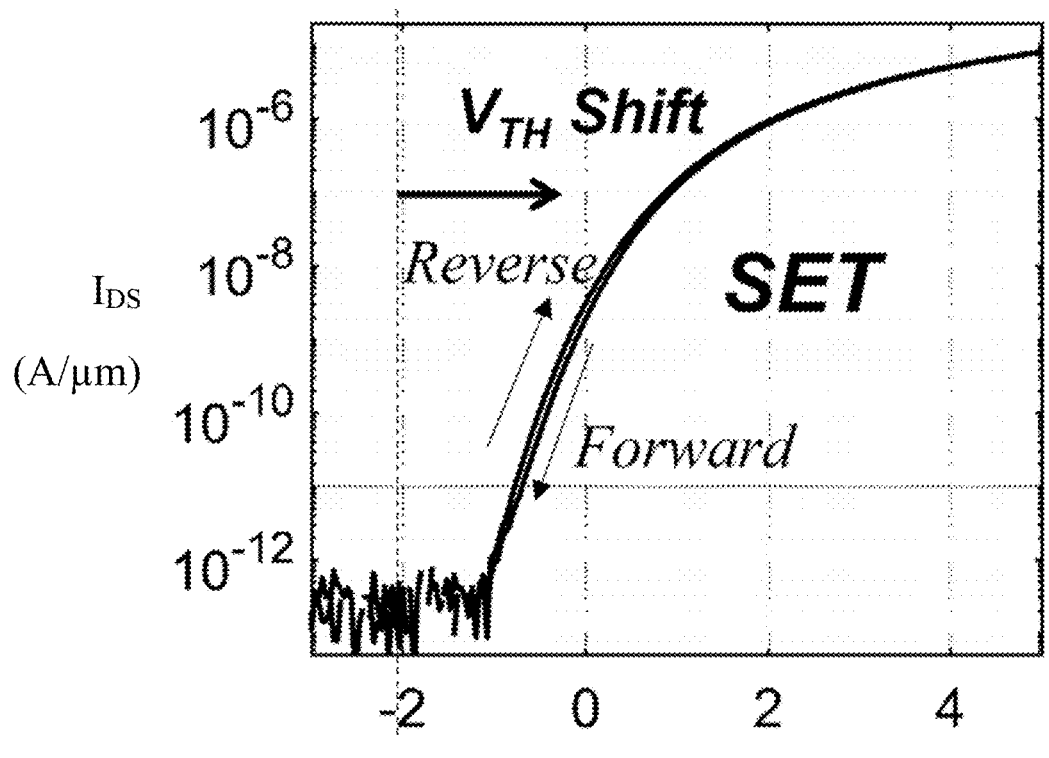
FIG. 13b is a graph illustrating that the embodiment of the collision detector is electrically programmed by applying a SET voltage $V_P$=7.5 V at the back gate for a duration of 75 s. Clearly, the threshold voltage shows a positive shift.
Figure 13C:
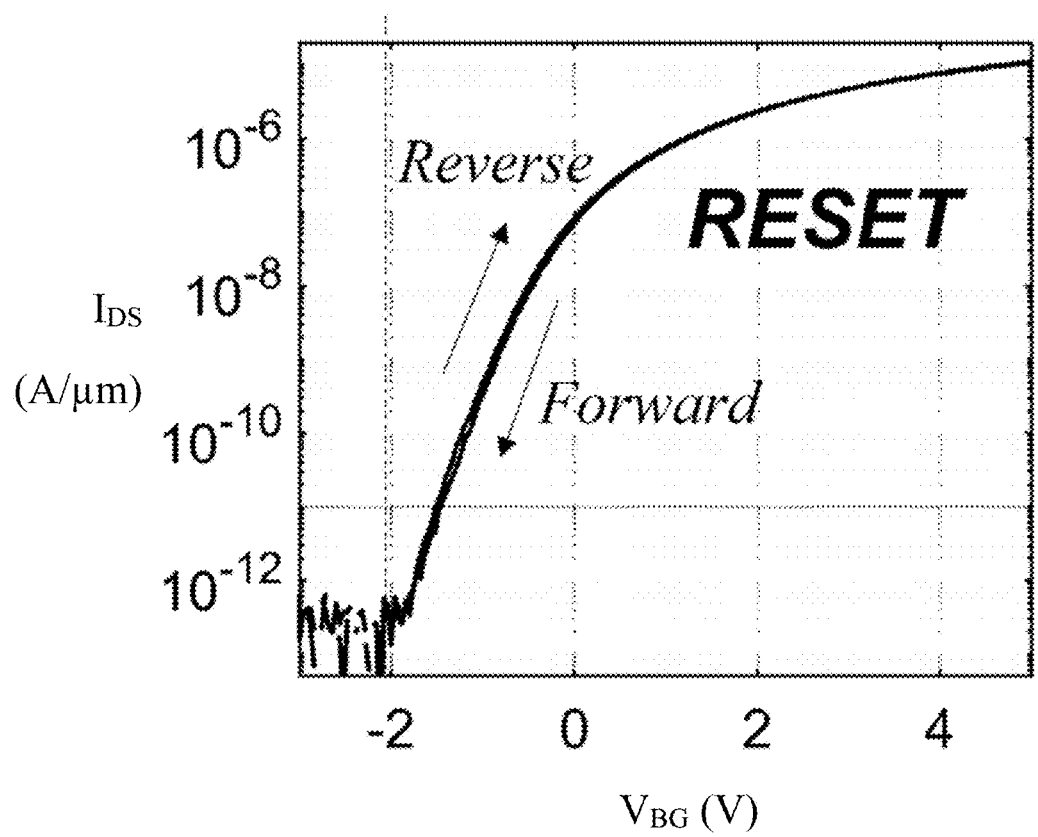
FIG. 13c is a graph illustrating that the embodiment of the collision detector can be restored back to its original state by applying a RESET voltage $V_P$=−8 V for a duration of 100 ms.

Dynamic Threshold Voltage Engineering in MoS$_2$ Floating Gate Configuration:

Embodiments of the MoS$_2$ photodetector of the collision detector can be capable of distinguishing an object approaching at different speeds, the response characteristics alone may be insufficient for invoking a timely warning for collision avoidance for some situations. An embodiment of the back-gate stack can be utilized to provide an escape response for the collision detector. FIG. 4a and FIG. 4b show the transfer characteristics in linear and logarithmic scale, respectively, for the monolayer MoS$_2$ FET for the exemplary embodiment of the collision detector of FIG. 1f and FIG. 2b after the application of "Write" programming pulses of different amplitudes ($V_P$) to the back-gate electrode, each for a total duration of 10 s. The threshold voltage ($V_{TH}$) becomes more positive as the magnitude of $V_P$ increases. In this way, the threshold voltage ($V_{TH}$) of the device can be set to the positive side using a large position SET voltage and can be restored to its initial state by applying a large RESET voltage, or "Erase" pulse to the control gate (CG) (see FIG. 13a-13c).

Figure 14A:
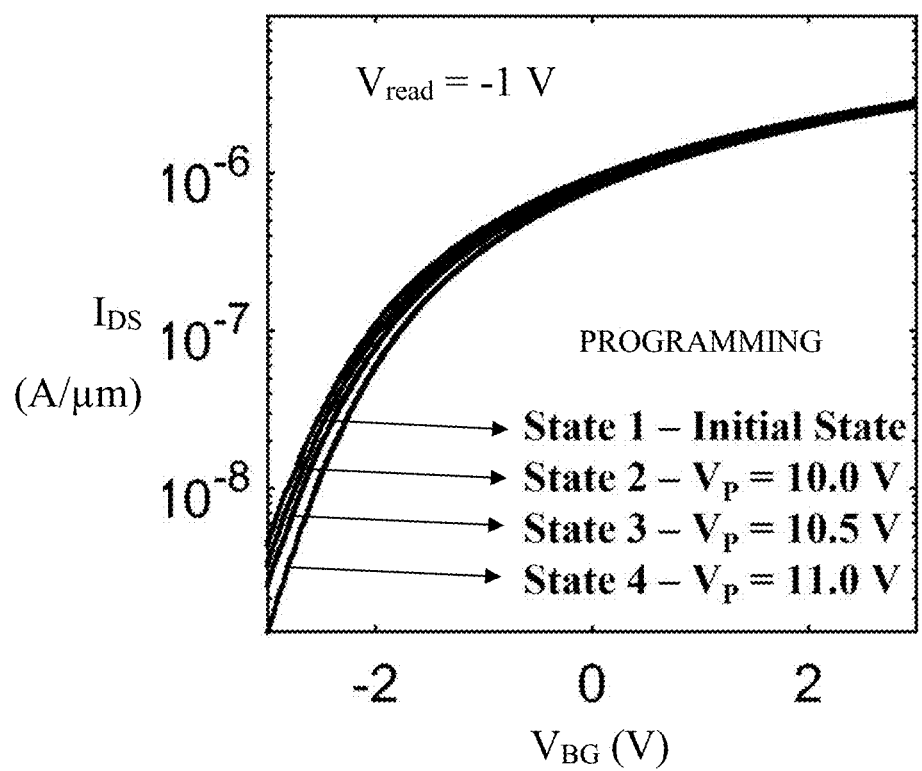
FIG. 14a is a graph illustrating programming of different analog memory states for the embodiment of the collision detector. The post-programing source to drain currents ($I_{DS}$) were measured for 500 s for each memory state demonstrating adequate charge retention by the floating gate stack.
Figure 14B:
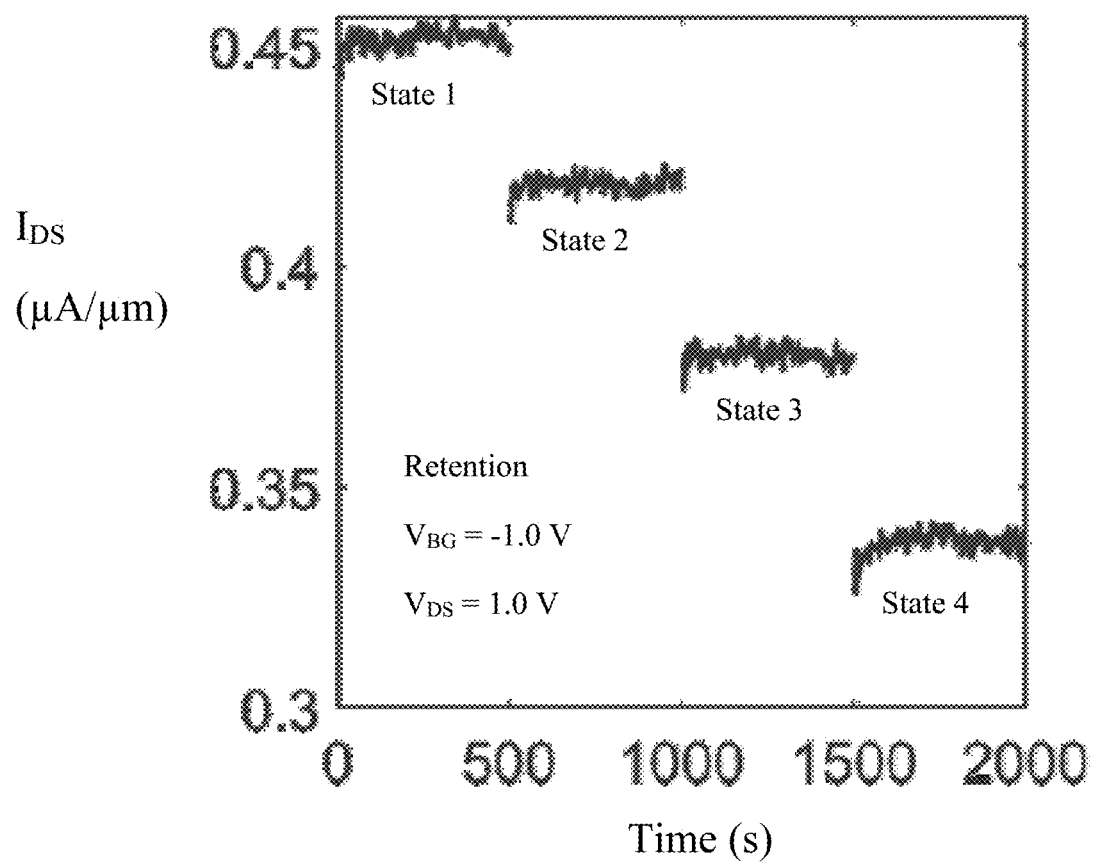
FIG. 14b is a graph illustrating the retention of different analog memory states for the embodiment of the collision detector. The post-programing source to drain currents ($I_{DS}$) were measured for 500 s for each memory state demonstrating adequate charge retention by the floating gate stack.

The memory retention for the different analog memory states was found to be at least 500 s for the memory architecture which is sufficient for collision avoidance by the device (see FIG. 14a-b, which illustrate a) programming and b) retention of different analog memory states for the collision detector. The post-programing source to drain currents ($I_{DS}$) were measured for 500 s for each memory state demonstrating adequate charge retention).

Figure 15A:
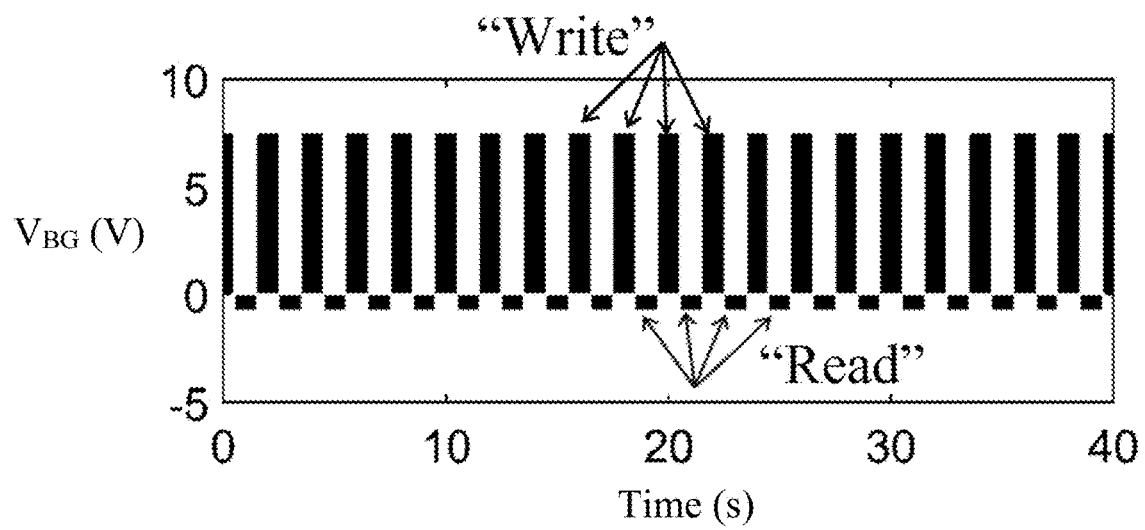
FIG. 15a is a graph illustrating "read" and "write" programming set-up of $V_{BG}$ for the embodiment of the collision detector to invoke an inhibitory response.
Figure 15B:
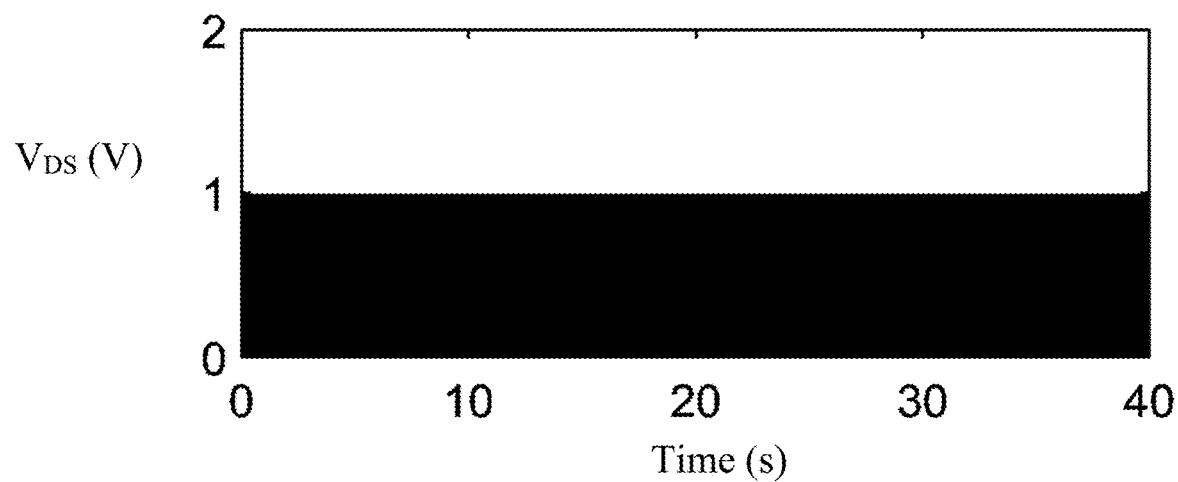
FIG. 15b is a graph illustrating "read" and "write" programming set-up of $V_{DS}$ for the embodiment of the collision detector to invoke an inhibitory response with $V_{DS}$ kept constant at 1V.

We were able to exploit this dynamic and non-volatile threshold voltage engineering capability to construct an inhibitive response in the MoS$_2$ photodetector of the embodiment of our collision detector in the absence of any optical stimuli. FIG. 4c-g shows the output current measured under different "Read" conditions in response to different "Write" programming pulse trains. Each programming pulse train consisted of several individual pulses of constant amplitude ($V_P$) and constant width (100 ms), separated by constant "Read" window of 100 ms. For "Read" operation the back-gate voltage ($V_{BG}$) was chosen to be −0.25 V, −0.50 V, −0.75 V and −1 V. The source to drain voltage was kept constant at $V_{DS}$=1 V for both "Write" and "Read" operations (see FIG. 15a-b for the Read-Write set-up). Irrespective of the "Read" condition, the current decreased monotonically over time. We believe this is due to the shift in the threshold voltage introduced by each individual pulse of the programming pulse trains. This demonstration confirmed to us that the back-gate programming pulses can be used to invoke inhibitory response in the MoS$_2$ FET of the embodiment of our collision detector shown in FIG. 1f and FIG. 2b.

Note that we have used back-gate voltages which correspond to the subthreshold regime of the MoS$_2$ FET of the exemplary embodiment of the collision detector since these conditions can offer enhanced photoexcitation as illustrated earlier. Furthermore, subthreshold operation can also help provide a low energy dissipation for a "Read" operation. The energy dissipation for a "Write" operation caused by each voltage pulse can be calculated using the formula: $E_P = WLC_{ox}V_P^2$ where, W and L are, respectively, the channel width (5 μm) and channel length (1 μm) of the MoS$_2$ FET and $C_{ox}$ ($2 \times 10^{-3}$ F/m$^2$) is the oxide capacitance. For $V_P$=7.5 V, the energy consumption is found to be ~500 femto Joules, which is miniscule compared to the energy consumption by the device for photodetection. This ultra-low-energy inhibitory response introduced by the programming stimulus can help facilitate successful collision avoidance by the MoS$_2$ based biomimetic collision detector.

An example of the integration of low energy inhibitory response to programming voltage pulse trains (as described above in FIG. 4a-f) with the excitatory response corresponding to the looming object (as described in FIG. 3a-j) is given below (FIG. 5a-f). As elucidated in the next section, this integration helps in realizing a low-power collision detector mimicking the LGMD escape response of detecting the inflection point of the output for collision avoidance. Since the energy consumption for excitatory response and inhibitory response is low, the total energy consumption of the collision detector is miniscule (FIG. 5f) which helps in realizing ultra-low power collision detectors which can be used for collision avoidance systems deployed in resource constrained environments like for space exploration robots or vehicles, flying machines including drones or other aircrafts, or any other kind of vehicle. For example (and as also discussed below), a computer device can be configured to monitor measured sensor data obtained from at least one collision detector to detect the inflection point and use that detection to trigger an avoidance action, such as changing the speed, direction of travel, or both speed and direction of travel to avoid a detected object.

Mimicking the LGMD Escape Response:

By combining the excitatory response (e.g. the increase in the device current to looming stimuli) and the inhibitory response (e.g. the decrease in the device current to programming pulse trains), we are able to mimic the escape response of LGMD neuron using the exemplary embodiment of our collision detector having an MoS$_2$ photodetector stacked on top of the memory unit.

FIGS. 5a-5d show the output current ($I_{DS}$) measured in the MoS$_2$ based collision detector under different "Read" conditions in response to different visual stimuli i.e. ramping rates in the presence of inhibitory "Write" pulse train of amplitude $V_P$=7.5 V and pulse width of 200 ms. The current response was found to be non-monotonic in all instances. This is believed to be due to early inhibition in the device current due to the "Write" programming pulses being compensated for later through increase in photocurrent due to the visual excitation. The inflection point or the time at which output current reaches the local minima is determined by the $V_{LED}$ ramping rates. This inflection point occurs before the $V_{LED}$ reaches its peak value and hence can be used as impending collision indicator similar to the LGMD-DCMD neuronal system. Independent of the object speed or the "Read" condition the device always detected the collision prior to impact.

Figure 5A:
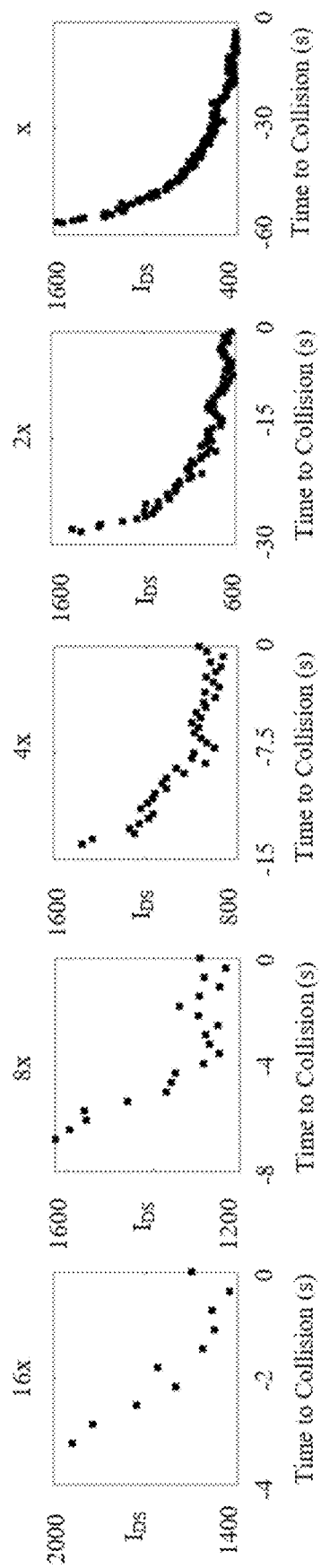
FIG. 5a is a series of graphs illustrating output current ($I_{DS}$) measured in the MoS$_2$ based collision detector under a "Read" condition of $V_{BG}$ of −0.25 V and a $V_{DS}$ of 1.0 V illustrating the response to different visual stimuli i.e. $V_{LED}$ ramping rates in the presence of inhibitory "Write" pulse train of amplitude $V_P$=7.5 V and pulse width of 200 ms. $I_{DS}$ is in the units of pA/$\mu$m.
Figure 5B:
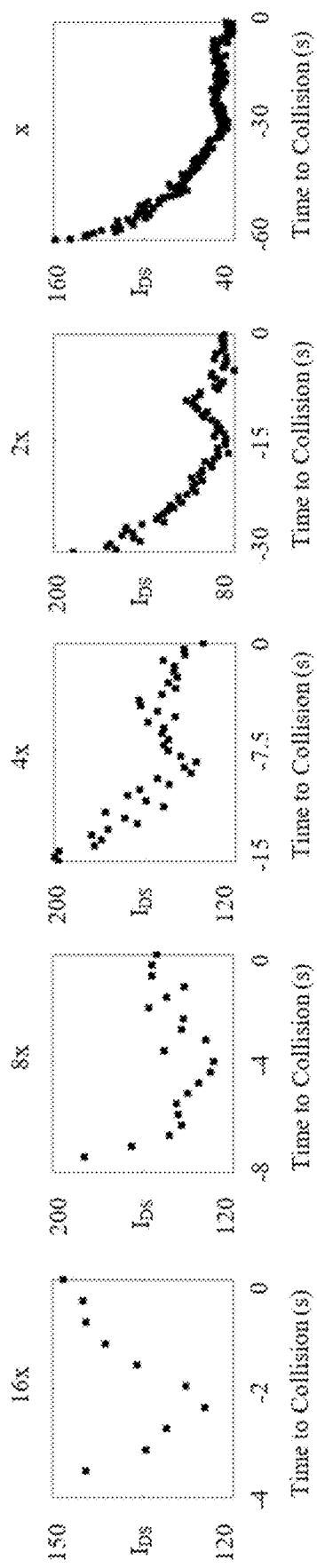
FIG. 5b is a series of graphs illustrating output current ($I_{DS}$) measured in the MoS$_2$ based collision detector under a "Read" condition of $V_{BG}$ of −0.50 V and a $V_{DS}$ of 1.0 V illustrating the response to different visual stimuli i.e. $V_{LED}$ ramping rates in the presence of inhibitory "Write" pulse train of amplitude $V_P$=7.5 V and pulse width of 200 ms. $I_{DS}$ is in the units of pA/$\mu$m.
Figure 5C:
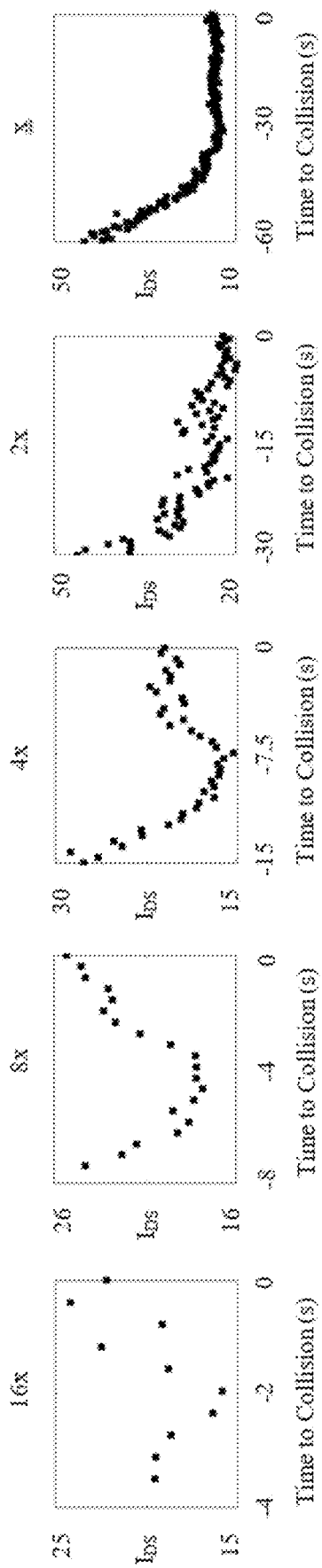
FIG. 5c is a series of graphs illustrating output current ($I_{DS}$) measured in the MoS$_2$ based collision detector under a "Read" condition of $V_{BG}$ of −0.75 V and a $V_{DS}$ of 1.0 V illustrating the response to different visual stimuli i.e. $V_{LED}$ ramping rates in the presence of inhibitory "Write" pulse train of amplitude $V_P$=7.5 V and pulse width of 200 ms. $I_{DS}$ is in the units of pA/$\mu$m.
Figure 5D:
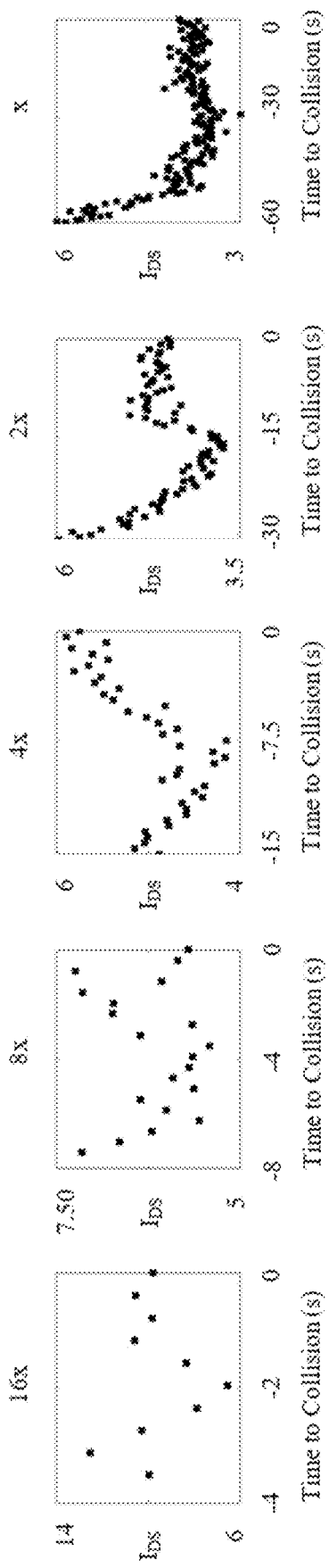
FIG. 5d is a series of graphs illustrating output current ($I_{DS}$) measured in the MoS$_2$ based collision detector under a "Read" condition of $V_{BG}$ of −1.0 V and a $V_{DS}$ of 1.0 V illustrating the response to different visual stimuli i.e. $V_{LED}$ ramping rates in the presence of inhibitory "Write" pulse train of amplitude $V_P$=7.5 V and pulse width of 200 ms. $I_{DS}$ is in the units of pA/μm.
Figure 5E:
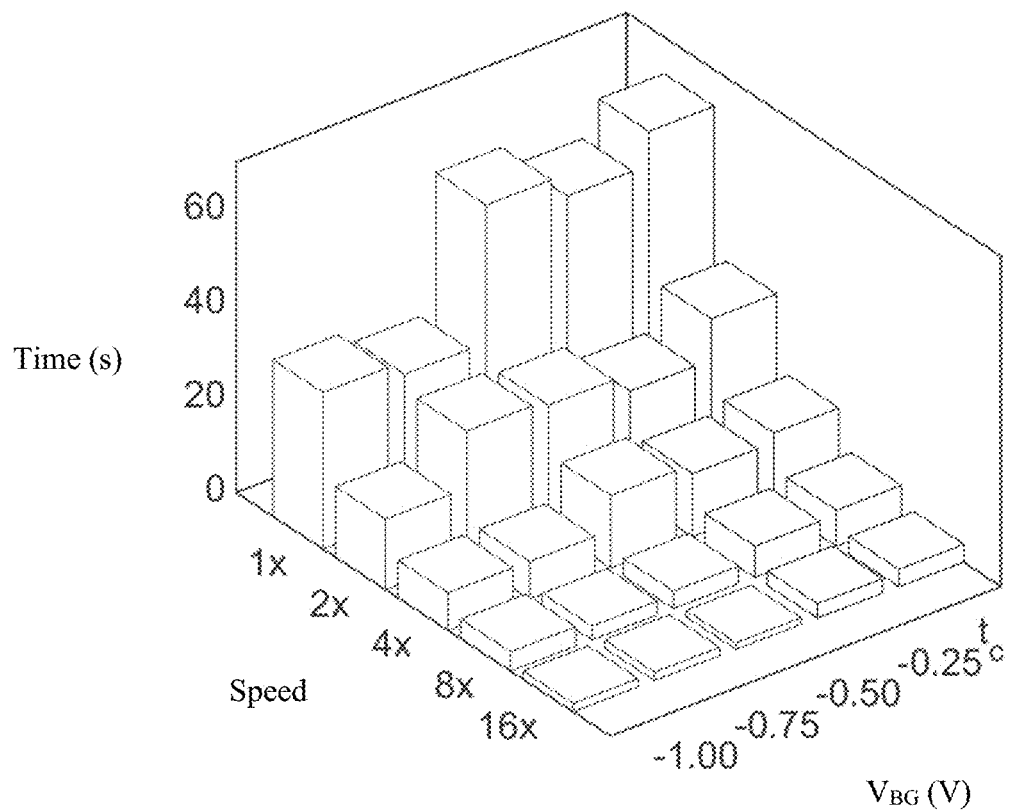

FIG. 5e shows the bar plot for time to collision detection ($\tau_D$) by the $MoS_2$ based biomimetic collision detector extracted using FIGS. 5a-5d. The darker labeled bars represent the time to collision ($\tau_C$) for different object speeds.

Figure 5F:
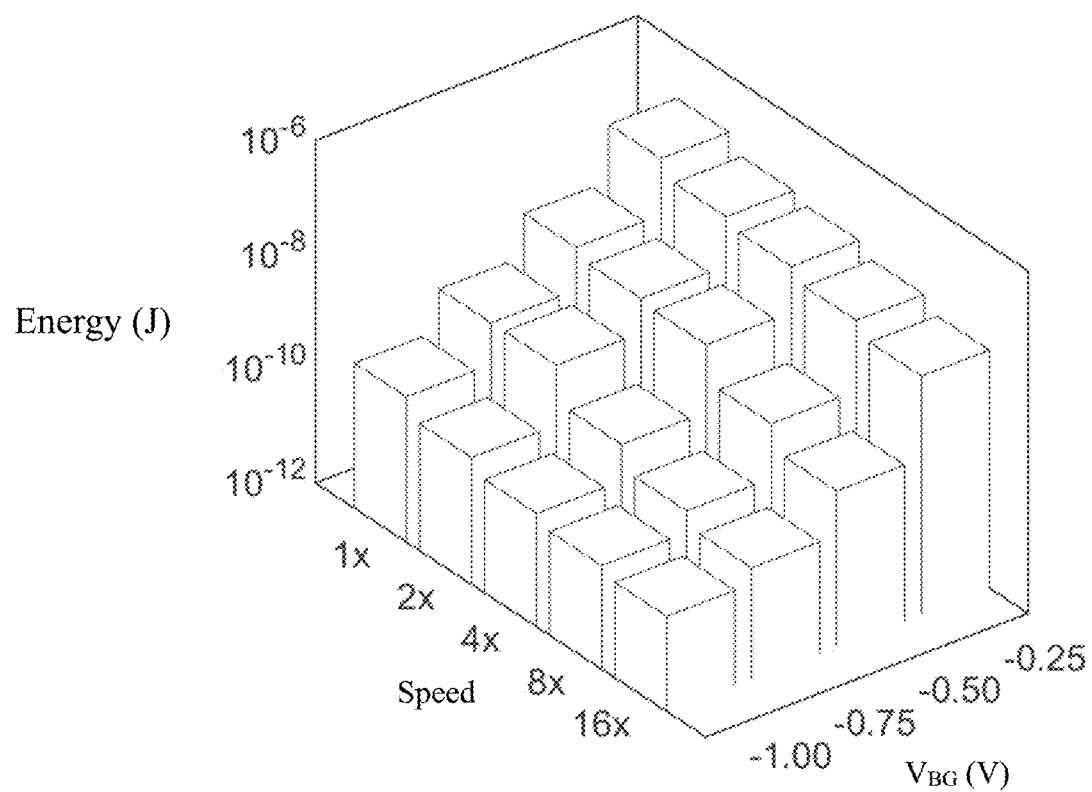
FIG. 5f is a bar plot for energy expenditure for collision avoidance by the exemplary embodiment of our $MoS_2$ based collision detector of FIG. 1f and FIG. 2b that was extracted using FIGS. 5a-5d.

We also computed the amount of energy consumed by the device for the collision detection. FIG. 5f shows that the results of this computation that was based on the measurements of FIGS. 5a-5d. The exemplary embodiment of the collision detector of FIG. 1f and FIG. 2b was found to consume a frugal amount of energy in the range of tens of picojoules (pJ) to nanoJoules (nJ), which highlights the benefits of the design of this embodiment. Furthermore, the active device area was only 5 μm×1 μm for this embodiment, which is ~1000× better than conventional analog VLSI implementations that we are aware of.

The non-monotonic firing rate (f) of the LGMD neuron (Eq. 1) in response to looming object on direct collision course is a result of a multiplicative operation performed on two features of the visual stimuli, i.e. angular velocity (θ') and angular size (θ) which are, respectively, conveyed through the excitatory and inhibitory dendritic pathways. However, the non-monotonic current in the $MoS_2$ based biomimetic collision detector is a result of additive operation performed on excitatory photoconductance ($G_{ph}$) in response to looming stimulus and inhibitory dark conductance ($G_{dark}$) due to programming stimulus (see Eq. 2 below).

$$I_{DS}(t)=V_{DS}[G_{ph}(t)\uparrow+G_{dark}(t)\downarrow]; G_{ph}(t)=F\{V_{LED}(t), V_{BG}\}; G_{dark}(t)=F\{V_P,t_P\} \quad (Eq. 2)$$

Unlike the LGMD, the collision detector may only need to use one feature of the visual stimuli e.g. the velocity of the approaching object for photoexcitation. The velocity can be captured through the $V_{LED}$ ramp rates. The inhibition in the collision detector can be intrinsically invoked through programming pulse train ($V_P,t_P$) applied to the back-gate. Finally, $V_{DS}$ is the supply voltage and is kept at 1 V for low power operation of the device.

Figure 16C:
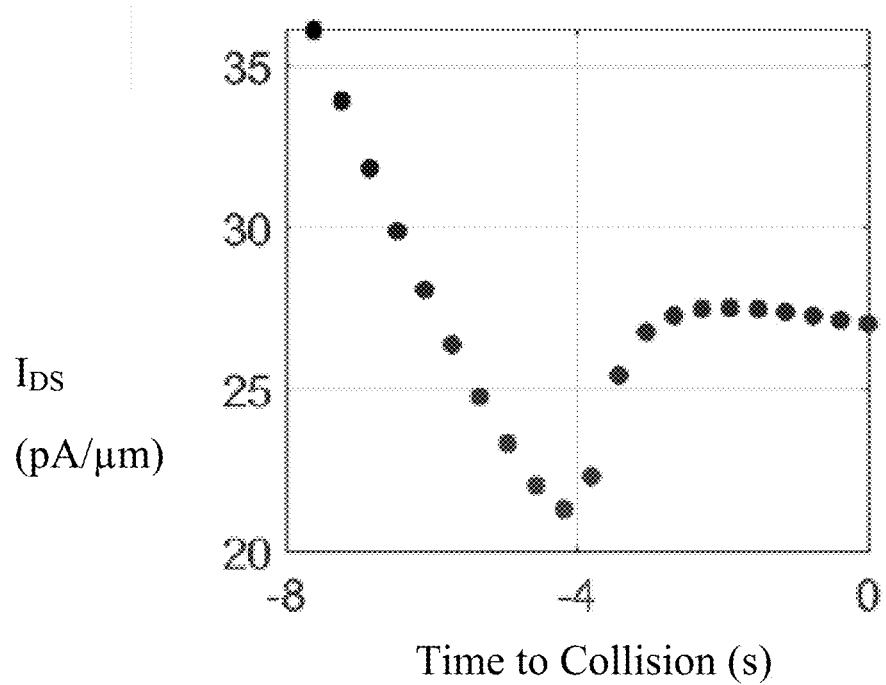
FIG. 16c is a graph illustrating a non-monotonic response in the source to drain current for all the individual collision detectors in the 2D array to a monotonic increase in the image intensity.

We also simulated the escape response of an embodiment of the collision detector configured as a multipixel collision detector. For example, we simulated the escape response of a 128×128 2D array of collision detectors. The looming stimuli is presented as a sequence of gray scale images with 128×128 pixels such that each pixel excites the corresponding collision detector. The pixel intensities range from black (0), when the object is far away from collision to white (255), at collision as shown in FIG. 16a. The intensities of pixels were mapped to the LED voltages ($V_{LED}$) with the highest pixel intensity representing $V_{LED}$=5 V. The speed of the approaching object is captured by the number of frames per second. FIG. 16b shows corresponding source to drain current maps of the 2D collision detector array (normalized to gray scale). FIG. 16c shows the non-monotonic current response from each pixel. The current map becomes the brightest before the looming stimulus reaches the peak intensity allowing collision avoidance. Since the monotonic increase in the image intensity invokes non-monotonic response in the source to drain current for all the individual collision detectors in the 2D array, the current maps and the pixel responses show non-monotonic trends as a function of time with the inflection points occurring before the impending collision. This is very similar to the trend observed from the response of a single collision detector device to an approaching object in direct collision course. Therefore, unlike other vision sensors, where the absence of non-monotonic response from the individual photodetectors necessitates the use of an array and associated peripheral circuitry to determine the optic flow, embodiments of our collision detector can avoid the use of such an array providing tremendous area and energy benefits.

However, there can also be other benefits of using an array of collision detectors. In our experimental demonstration, embodiments of our collision detector can identify an impending collision, but it may not be able to resolve the direction from which the object is approaching. This information can be needed for determining the escape response, e.g. the angle of escape flight for the locust. While a single device may not be able to resolve the directionality of the collision, a 2D array of the collision detectors can extract such information when used in conjunction with an optical lens.

Figure 17A:
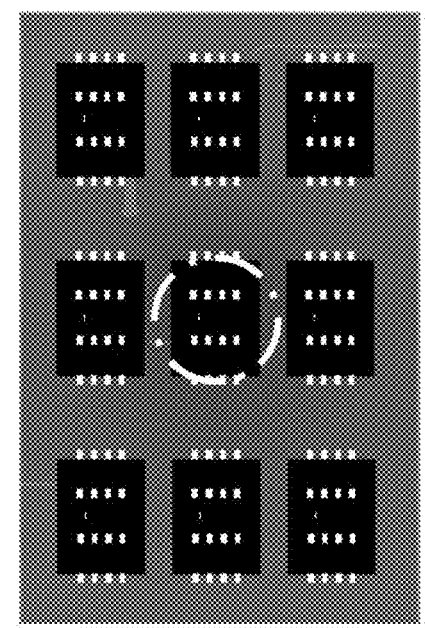
FIG. 17a is a schematic illustration of an exemplary embodiment of a multipixel 2D array of collision detectors that can be configured to resolve the directionality of the impending collision, a critical information necessary for determining the escape response, e.g. the angle of escape flight. The 2D array of collision detectors is placed at the focal plane of a lens. For the system of FIG. 17a, at perpendicular incidence, the collision detector at the focal point of the lens can be excited.
Figure 17A:
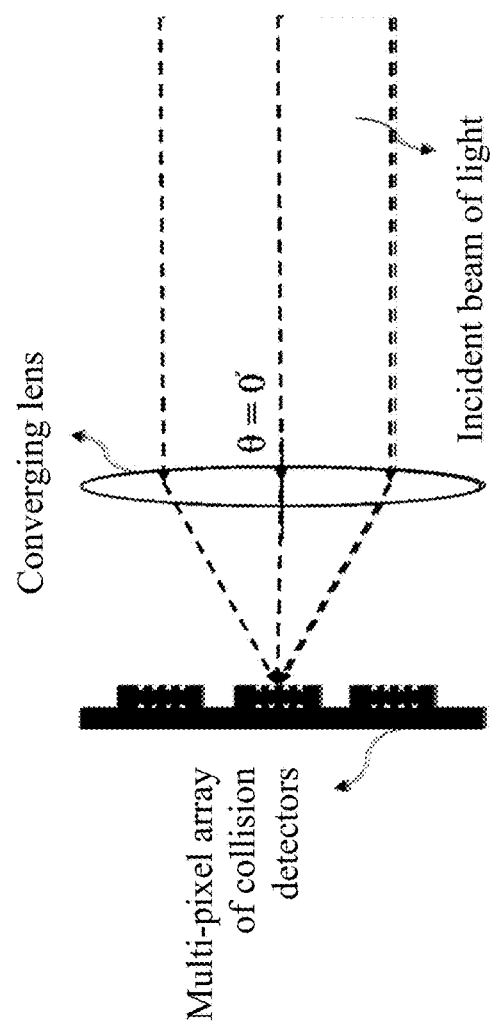
Figure 17B:
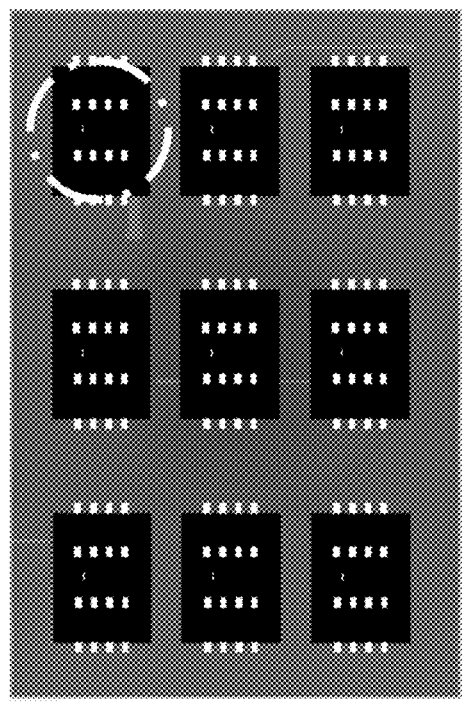
FIG. 17b is a schematic illustration of an exemplary embodiment of a multipixel 2D array of collision detectors that can be configured to resolve the directionality of the impending collision, a critical information necessary for determining the escape response, e.g. the angle of escape flight. The 2D array of collision detectors is placed at the focal plane of a lens. For the embodiment of FIG. 17b, an oblique incidence at an angle θ, specific detectors in the array can be excited, thereby creating a 2D map of the 3D space along the focal plane of the lens.
Figure 17B:
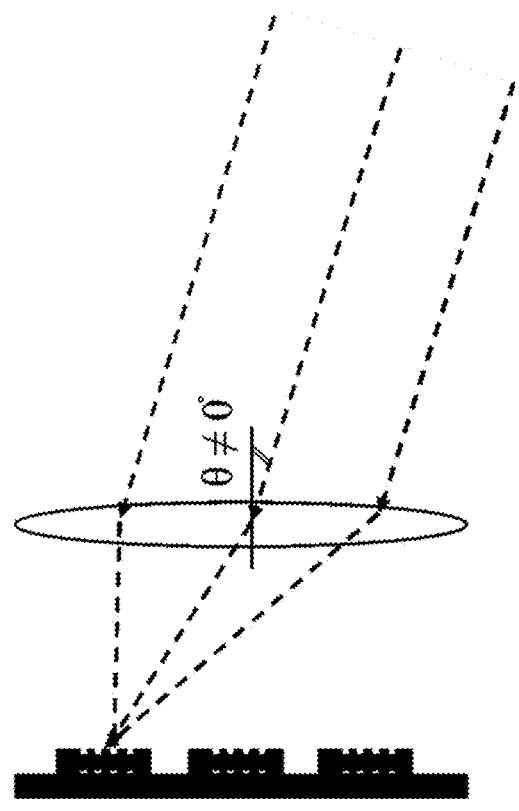

FIGS. 17a-b shows that by placing a 2D array of collision detectors at the focal plane of an optical lens it is possible to enable a 3D vision for collision avoidance. For perpendicular incidence, the collision detector at the focal point of the lens can be excited, whereas, for oblique incidence at an angle θ, specific detectors in the array can be excited, thereby creating a 2D map along the focal plane of the lens. This exemplary demonstration shows the mapping of 3D space onto the 2D array of collision detectors using an optical lens, can allow the array of collision detectors to be direction sensitive. The response map of collision detectors in the array can thus help in determining the velocity and direction of an approaching object for use in the detection of impending collisions.

Embodiments of our collision detector and system of collision detectors can be configured so that the non-monotonic time evolution in the source to drain current of the device in response to excitatory looming optical stimulus and inhibitory programming stimulus that are applied simultaneous to imitate the collision avoidance response. This can be utilized while the energy and area benefits of task specific and in-memory sensing and computing can also be obtained. It should also be pointed that the task-specific nature of the collision detector may limit its ability to respond to lateral movements of objects. However, this can be addressed using an array of the collision detectors (e.g. an array of the $MoS_2$ photodetectors with some peripheral circuits, like any other vision sensors).

However, it is contemplated that embodiments of such a device may not be able to distinguish a very slow-moving object with low light intensity if the photoexcitation is insufficient to overcome the programming inhibition. One way to improve detection can be to reduce inhibition by applying lower magnitude of "Write" programming pulse train.

Similarly, very fast-moving object with high light intensity may invoke overwhelming excitation. In such cases inhibition can be enhanced by applying higher magnitude of "Write" programming pulse train. The possibility of optimizing the device performance based on desired applications is one of the strengths of the design of the embodiments of our collision detector. For example, it is contemplated that a multipixel collision detector configuration can respond to objects approaching at different speeds with different light intensities from different angles simultaneously.

Figure 18A:
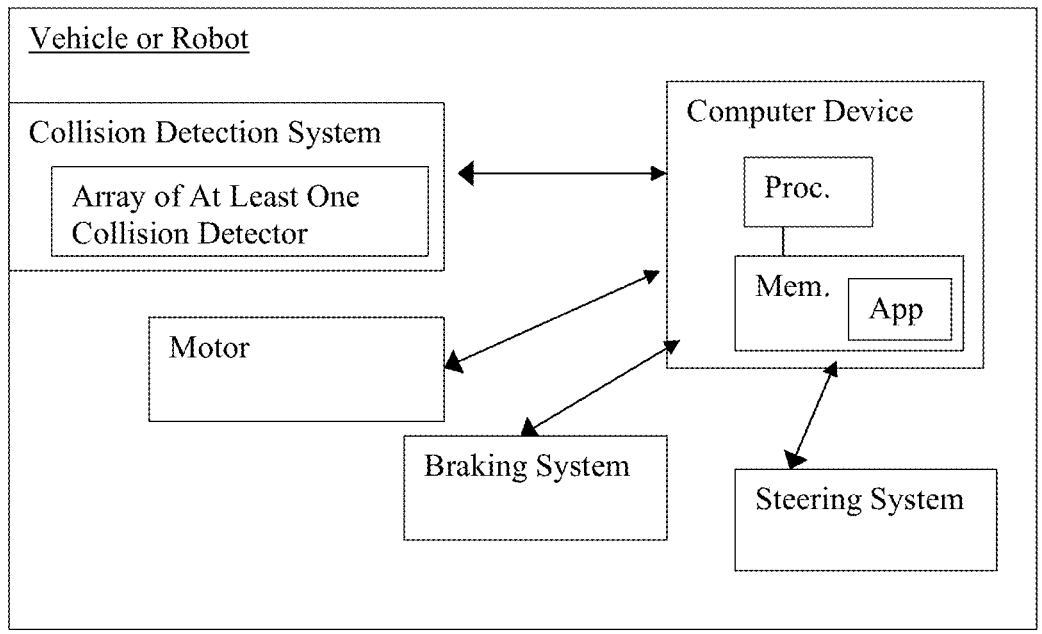
FIG. 18a is a block diagram of an exemplary collision detection system incorporated into a computer system used to control motion of a robot or vehicle.

Referring again to FIG. 18a, it should be appreciated that a computer device can be configured to utilize signals generated by the one or more collision detectors of a collision detection system included in a vehicle or robot to adjust a velocity and/or direction of travel of a vehicle or robot. For example, the computer device can be configured to receive signals from one or more collision detectors to detect an object that may be near a body of a moving object (e.g. robot, autonomous vehicle, drone, vehicle, car, plane, boat, etc.). The computer device can utilize this information to trigger a response so that the detected object is avoided (e.g. slowing of speed, change of direction, a combination of changes in speed and direction of motion, etc.) when running code of a collision avoidance application (App.) or other type of code stored on the non-transitory memory of the computer device to control motion of the robot or vehicle (e.g. flying via one or more rotors, motion over land via wheels, legs, or tracks, motion in water via one or more rudders and/or propulsion system such as a propeller or sail, etc.).

In some embodiments, the computer device can be configured so that the velocity of a detected object is detected based on a ramp rate of the photocurrent from the light associated with the object (e.g. reflected light reflected off an object or light emitted by the object). The computer device can be configured to detect the direction of inflection point, or rather the change in the sign of slope of the collision detector response, in which here, a change from positive slope to negative slope (FIG. 12a) as indicating an object and the vehicle or robot are being positioned farther away from each other (e.g. vehicle is moving further from a stationary wall or vehicle is moving farther away from another vehicle, etc.) and that a change from negative slope to positive slope in the collision detector response indicates the object and the vehicle are moving closer to each other (e.g. vehicle moving closer to a wall, vehicle moving closer to another moving vehicle or other object, etc.). Thus, an evasive action (stopping/braking and/or changing speed and/or direction, etc.) will be triggered (for e.g. by flying via one or more rotors, motion over land via wheels, legs, or tracks, motion in water via one or more rudders and/or propulsion system such as a propeller or sail, etc.) immediately after the computer device (e.g. processor (Proc.) of the computer device) detects the change in slope of the collision detector output.

When an array of multiple collision detectors are utilized (e.g. in conjunction with a lens as discussed above), the computer device can also be configured to detect a directional vector of the object based on the differences in the outputs provided by the different collision detectors of the array of detectors. The computer device can generate a current map based on the collision detectors' output. The computer device can be configured so that it responds to perpendicular incidence at which collision detectors at a focal point of the lens can be excited differently from other objects detected as a result of an oblique incidence at an angle θ that can be indicated by specific detectors in the array being excited that are not at the focal point of the lens. The computer device can be configured to generate a 2D map along that is representative of the focal plane of the lens for determining speed and direction of an object based on signals from the collision detectors of the array and use such data for invoking a collision avoidance response (e.g. change in velocity and/or direction of the robot or vehicle).

The computer device can be configured to provide at least one control signal to the motor of the vehicle or robot, a braking system of the vehicle or robot, and/or at least one control signal to a steering control of the vehicle or robot to cause the change in velocity and/or direction of motion of the robot or vehicle.

The collision detection system can also be configured to provide improved detectability at low power consumption. For example, the collision detection system can be configured to adjust an inhibitory response to account for the objects to be detected (e.g. very fast moving or very slow moving objects) to improve the sensitivity of the detection. For example, a suitable "write" programming pulse train of a lower magnitude can be applied to the collision detector(s) by a pulse train generator of the system in response to the light intensity that is detected being below a pre-selected slow moving threshold, which can also be considered a first light intensity threshold). Also, the collision detection system can be configured to account for very fast moving objects to improve the sensitivity of the detection by applying a suitable "write" programming pulse train of a higher magnitude to the collision detector(s) in response to the light intensity that is detected being above pre-selected fast moving threshold, which can also be considered a second light intensity threshold). A pulse train generator of the collision detection system can apply such pulse trains to the collision detectors.

Additionally, embodiments can utilize an array of multiple collision detectors with the collision detectors utilizing different inhibitory rates. The use of different inhibitory rates can allow some detectors to be more sensitive to slow moving objects while others can be more sensitive to fast moving objects. This can permit multiple detectors to be utilized to provide a greater degree of detectability to account for slow and fast moving objects of various speed ranges to improve the ability of the computer device communicatively connected to the collision detectors to detect an impending collision and trigger an evasive action in a vehicle or robot as discussed herein.

Embodiments of our collision detector, array of collision detectors, system for collision detection, and method of collision detection can provide for ultra-low-energy, task-specific and miniaturized collision detectors. As can be appreciated from the above, some embodiments can be based on monolayer $MoS_2$ photodetector with integrated non-volatile and reconfigurable memory component that mimics the escape response of LGMD neuron found in locust while other embodiments can utilize other configurations. In some embodiments, a single collision detector device capable of performing a complex and task specific computation i.e. invoking escape response to objects on direct collision course, which is identical to the final outcome of the LGMD neuron to looming stimuli, can be provided. In other embodiments, an array of such devices can be utilized. We believe that embodiments of our in-memory task specific computing and sensing approach can provide smart, low-cost, energy and area efficient collision detection systems that can be used in a number of applications (e.g. in robotics and autonomous vehicle design, self-driving cars, self-driving trucks, boats, self-driving boats, etc.) to provide a collision avoidance function.

Embodiments of our collision detector, array of collision detectors, system for collision detection, and method of collision detection can be adapted to meet a particular set of design criteria. For instance, the particular type of semiconductor or the particular arrangement of an inhibition layer can be adjusted to meet a particular set of design criteria. As another example, it is contemplated that a particular feature described, either individually or as part of an embodiment, can be combined with other individually described features, or parts of other embodiments. The elements and acts of the various embodiments described herein can therefore be combined to provide further embodiments. Thus, while certain present preferred embodiments of our collision detector, array of collision detectors, system for collision detection, and method of collision detection as well as embodiments of methods for making and using the same have been shown and described above, it is to be distinctly understood that the invention is not limited thereto but may be otherwise variously embodied and practiced within the scope of the following claims.

What is claimed is:

1. A collision detector comprising:
   a first layer that can be configured as an excitatory layer and a second layer configured as an inhibitory layer, wherein the inhibitory layer consists of a p++Si/TiN/Pt/Al$_2$O$_3$ non-volatile and programmable memory stack.

2. The collision detector of claim 1, wherein the first layer includes a photodetector that is based on a monolayer of MoS$_2$.

3. A collision detector comprising:
   a first layer that can be configured as an excitatory layer and a second layer configured as an inhibitory layer,
   the first layer includes a source connected to a MoS$_2$ layer and a drain connected to the MoS$_2$ layer; and
   the second layer includes an Al$_2$O$_3$ layer, a Pt layer between the Al$_2$O$_3$ layer and a TiN layer, the TiN layer being between the Pt and a p++Si layer; the p++Si layer being connected to a back gate and/or positioned as a back gate.

4. A collision detection system comprising a single collision detector of claim 3 as a standalone collision detector.

5. A collision detection system comprising an array of collision detectors, each of the collision detectors being configured as a collision detector of claim 3.

6. The collision detection system of claim 4, comprising a computer device communicatively connected to the single collision detector.

7. The collision detection system of claim 6, wherein the computer device has a processor connected to a non-transitory computer readable medium.

8. The collision detection system of claim 4, wherein the collision detection system is included in a robot, a drone, or a vehicle.

9. The collision detection system of claim 5, comprising a computer device communicatively connected to the array of collision detectors.

10. The collision detection system of claim 9, wherein the computer device has a processor connected to a non-transitory computer readable medium.

11. The collision detection system of claim 5, wherein the collision detection system is included in a robot, a drone, or a vehicle.

12. A method of forming a collision detector, the method comprising:
    forming a collision detector to have a first layer and a second layer, the first layer including a source and a drain connected to a MoS$_2$ layer; the second layer structured as a non-volatile and programmable stack including an Al$_2$O$_3$ layer, a Pt layer between the Al$_2$O$_3$ layer and a TiN layer, the TiN layer being between the Pt and a p++Si layer; the p++Si layer being connected to a back gate and/or positioned as a back gate.

13. The method of claim 12, wherein the MoS$_2$ layer is positioned on the Al$_2$O$_3$ layer.

14. A method for detecting an object to avoid a collision with the object, the method comprising:
    forming a collision detector to have a first layer and a second layer, the first layer including a source and a drain connected to a MoS$_2$ layer; the second layer structured as a non-volatile and programmable stack including an Al$_2$O$_3$ layer, a Pt layer between the Al$_2$O$_3$ layer and a TiN layer, the TiN layer being between the Pt and a p++Si layer; the p++Si layer being connected to a back gate and/or positioned as a back gate;
    receiving a visual stimulus from the object;
    applying voltage pulses to the non-volatile and programmable stack of the collision detector;
    supplying the voltage to a photodetector of the collision detector connected to the non-volatile and programmable stack.

15. The method of claim 14, also comprising at least one of:
    detecting a non-monotonic trend in output characteristics of the collision detector with time to the visual stimulus;
    identifying and/or determining an occurrence of an inflection point based on the detecting prior to collision with the object; and
    adjusting motion to avoid collision with the object based on the identifying and/or determining of the occurrence of the inflection point.

16. The method of claim 15, wherein the inflection point is a local minima or a local maxima.

* * * * *